United States Patent
Endo et al.

(10) Patent No.: US 6,172,576 B1
(45) Date of Patent: Jan. 9, 2001

(54) CAPACITOR ARRAY UNIT CONNECTED TO OSCILLATION CIRCUIT WITH A PIEZOELECTRIC REASONATOR, CAPACITOR ARRAY UNIT CONTROLLER OSCILLATION FREQUENCY ADJUSTING SYSTEM AND OSCILLATION FREQUENCY ADJUSTING METHOD

(75) Inventors: Takashi Endo; Manabu Oka, both of Minowa-machi (JP)

(73) Assignee: Seiko Epson Corporation, Tokyo (JP)

( * ) Notice: Under 35 U.S.C. 154(b), the term of this patent shall be extended for 0 days.

(21) Appl. No.: 09/285,047

(22) Filed: Apr. 2, 1999

(30) Foreign Application Priority Data

Apr. 2, 1998  (JP) ................................................. 10-090327
Mar. 24, 1999 (JP) ................................................. 11-080498

(51) Int. Cl.$^7$ ................................. H03B 5/06; H03B 5/36
(52) U.S. Cl. ..................................... 331/116 R; 331/36 C; 331/108 D; 331/116 FE; 331/158; 331/177 V; 331/179
(58) Field of Search ............................. 331/36 C, 108 D, 331/116 K, 116 FE, 158, 177 V, 179

(56) References Cited

U.S. PATENT DOCUMENTS

| | | | |
|---|---|---|---|
| 4,827,226 | * | 5/1989 | Connell ........................... 331/116 FE |
| 5,117,206 | * | 5/1992 | Imamura ............................... 331/158 |
| 5,511,126 | * | 4/1996 | Westwick ................................ 331/44 |
| 5,745,012 | * | 4/1998 | Oka et al. ............................... 331/68 |
| 5,952,890 | * | 9/1999 | Fallisgaard et al. .................... 331/18 |

FOREIGN PATENT DOCUMENTS

| | | |
|---|---|---|
| 61-56514 | 3/1986 | (JP) . |
| 7-7215 | 1/1995 | (JP) . |
| 9-181528 | 7/1997 | (JP) . |

* cited by examiner

Primary Examiner—David Mis
(74) Attorney, Agent, or Firm—Oliff & Berridge, PLC

(57) ABSTRACT

A voltage-controlled piezoelectric resonator may be implemented without requiring the use of a trimmer capacitor by virtue of the use of a capacitor array with or without an additional capacitor array, thus reducing the number of external parts. The capacitor array and the additional capacitor array can be packaged in an IC, thus enabling reduction in the size of the voltage-controlled piezoelectric resonator. The voltage-controlled piezoelectric resonator incorporating the capacitor array exhibits high stability both in terms of secular change and operation, which in turn ensures high stability of operation of a piezoelectric oscillation circuit incorporating this voltage-controlled piezoelectric resonator. An oscillation center frequency adjusting mechanism produces adjusting data, so that the adjustment of the oscillation center frequency can be effected purely electrically. Since mechanical adjusting operation that is essential in conventional arrangements is unnecessary, the time required for the adjustment of the oscillation center frequency is shortened to allow a reduction in the production cost of the voltage-controlled piezoelectric resonator.

21 Claims, 36 Drawing Sheets

30 AUTOMATIC ADJUSTING SYSTEM

CL : CIRCUIT LOAD CAPACITANCE
- R : NEGATIVE RESISTANCE

EQUIVALENT CIRCUIT AT OSCILLATION

EQUIVALENT CIRCUIT OF
PIEZOELECTRIC OSCILLATOR

CAPACITOR ARRAY UNIT CONNECTED TO OSCILLATION CIRCUIT WITH A PIEZOELECTRIC REASONATOR, CAPACITOR ARRAY UNIT CONTROLLER OSCILLATION FREQUENCY ADJUSTING SYSTEM AND OSCILLATION FREQUENCY ADJUSTING METHOD

BACKGROUND OF THE INVENTION

1. Field of Invention

The present invention relates to a capacitor array unit, a capacitor array unit controller, an oscillation circuit, a voltage-controlled oscillator, an oscillation frequency adjusting system, and an oscillation frequency adjusting method. In particular, the present invention pertains to a capacitor array unit, a capacitor array unit controller, an oscillation circuit, a voltage-controlled oscillator, an oscillation frequency adjusting system, and an oscillation frequency adjusting method that are used in and for a voltage-controlled piezoelectric oscillation circuit.

2. Description of Related Art

[1] First Conventional Configuration

FIG. 31 is a circuit diagram showing the configuration of a first type of conventional voltage-controlled piezoelectric oscillation circuit. The voltage-controlled piezoelectric oscillation circuit, generally denoted by 100, has the following parts or components: an output terminal OUT through which an oscillation signal SOSC of an oscillation frequency fOSC is output; a frequency-control terminal VC which receives a control voltage VC for varying the oscillation frequency fOSC; an input resistor Ri having one end connected to the frequency control terminal VC and intended to coarsely couple an oscillation frequency control circuit (not shown) that is connected by a user to the frequency control terminal VC while eliminating undesirable effect of the oscillation frequency control circuit on the oscillating stage; a piezoelectric resonator X connected to the other end of the input resistor Ri; a variable-capacitance diode (referred to as "varicap", hereinafter) Cv having a cathode connected to a node between the input resistor Ri and the piezoelectric resonator X; and a trimmer capacitor (referred to also as a "trimmer", hereinafter) CT having one end connected to the anode of the varicap Cv and the other end connected to a lower-potential power supply GND.

The voltage-controlled piezoelectric oscillation circuit 100 also has the following parts or components: a bias resistor RX having one end connected to a node between the varicap Cv and the trimmer CT and the other end connected to the lower-potential power supply GND; a first bias resistor R1 having one end connected to a higher-potential power supply VCC and the other end connected to the other end of the piezoelectric resonator X; a second bias resistor R2 having one end connected to a node between the piezoelectric resonator X and the first bias resistor R1 and the other end connected to the lower-potential power supply GND; an NPN transistor Q1 having a base connected to a node between the piezoelectric resonator X and the bias resistor R1; and a collector resistor Rc having one end connected to the higher-potential power supply VCC and the other end connected to the collector of the NPN transistor Q1.

The voltage-controlled piezoelectric oscillation circuit 100 further has the following parts or components: a DC cut-off capacitor CCO having one end connected to a node between the collector resistor Rc and the NPN transistor Q1 and the other end connected to the output terminal OUT, intended to remove DC component of the oscillation signal SOSC; an emitter resistor Re having one end connected to the emitter of the NPN transistor Q1 and the other end connected to the lower-potential power supply GND; a first oscillation capacitor CO1 having one end connected to a node between the base of the NPN transistor Q1 and the piezoelectric resonator X and the other end connected to a node between the emitter of the NPN transistor Q1 and the emitter resistor Re; and a second oscillation capacitor CO2 having one end connected to a node between the emitter of the NPN transistor Q1 and the emitter resistor Re and the other end connected to the lower-potential power supply GND.

[2] Second Conventional Configuration

FIG. 32 shows a second type of conventional voltage-controlled piezoelectric oscillation circuit. In this Figure, reference numerals that are the same as those appearing in FIG. 1 denote the same parts or components as those of the first type of known arrangement shown in FIG. 31.

The second type of conventional voltage-controlled piezoelectric oscillation circuit 200 differs from the voltage-controlled piezoelectric oscillation circuit 100 of the first type in that the bias resistor RX is omitted, that the anode of the varicap Cv is connected to the lower-potential power supply GND and that the trimmer CT is connected to the varicap Cv in parallel therewith.

[3] Role of the Trimmer CT in the First and Second Conventional Arrangements

Actual oscillation center frequency f0' that appears when a calibrated control voltage is supplied deviates from the target center frequency f0 due to, for example, variation in the characteristics of the components such as the piezoelectric resonator X and the varicap CV. The trimmer CT is intended to compensate for such a deviation, thereby controlling the actual frequency f0' in conformity with the target center frequency f0.

Thus, the actual frequency f0' is regulated to the target center frequency f0, provided that the capacitance value of the trimmer CT is adequately controlled.

In other words, the role of the trimmer CT is to correct deviation of the center frequency that appears due to variation of characteristics of components of the voltage-controlled piezoelectric oscillation circuit, such that the oscillation frequency coincides with the target oscillation frequency when a calibrated control voltage is applied to the oscillation circuit. In general, therefore, an adjustment of the trimmer CT is executed as the final step of the process for fabricating the voltage-controlled piezoelectric oscillation circuit, prior to the shipping of the same.

In an example, the capacitance value of the trimmer CT is adjusted such that a center frequency f0 of 13.0 (MHz) is obtained when a control voltage Vc of 2.5 (V) is applied.

The trimmer CT inherently is not intended to encourage the user to trim the oscillation frequency through adjustment thereof. However, when the voltage-controlled oscillation circuit is actually mounted on, for example, a printed circuit board, the oscillation center frequency f0' may deviate from the target center frequency f0 due to, for example, a thermal stress. In such a case, the trimmer (CT can effectively be used to permit adjustment for the purpose of eliminating the deviation of the actual oscillation frequency f0 from the target oscillation center frequency f0.

[4] Role of the Varicap Cv in the First and Second Conventional Arrangements

The oscillation frequency fOSC is controllable by varying the capacitance CCv of the varicap Cv. The capacitance CCv in turn is controlled by varying the level of the control voltage Vc supplied to the frequency control terminal VC. For instance, in the aforesaid example, the oscillation frequency fOSC is controlled in the range of:

fOSC=13.0 (MHz)±100 (ppm)

when the frequency control terminal VC is supplied with a control voltage Vc as follows.

Vc=2.5±2.0 (V)

[5] Principle of Operation of the Voltage-controlled Piezoelectric Oscillation Circuit A description will now be given of the principle of operation of the voltage-controlled piezoelectric oscillation circuit.

FIG. 33 shows an equivalent circuit which is equivalent to the voltage-controlled piezoelectric oscillation circuit during oscillation.

The voltage-controlled piezoelectric oscillation circuit is broadly divided into two portions: the piezoelectric resonator X and the remainder circuitry.

The piezoelectric resonator X can be expressed in terms of a series connection of an equivalent reactance L and an equivalent resistance R, while the remainder circuitry is expressed by a series connection of a load capacitance CL and a negative resistance −R.

FIG. 34 shows an equivalent circuit of the piezoelectric resonator.

The piezoelectric resonator X can be expressed in terms of a series connection which interconnects both terminals of the resonator X and which includes an equivalent resistance R1, an equivalent reactance L1 and an equivalent series capacitance CS, and an equivalent parallel capacitance CP which is in parallel with the above-mentioned series connection.

The following equation (1) expresses the relationship between the oscillation frequency fOSC and the load capacitance CL of the remainder circuitry in the voltage-controlled piezoelectric oscillation circuit implemented by using the piezoelectric resonator X.

$$dfr = \frac{fosc - f_r}{f_r} = \frac{1}{2r} \cdot \frac{1}{\left(1 + \frac{C_L}{C_P}\right)} \quad (1)$$

In this equation, the symbol γ represents the capacitance ratio which is given as follows:

γ=CP/CS where CP represents the equivalent parallel capacitance of the piezoelectric resonator X, while CS is the equivalent series capacitance of the same.

The symbol dfr is the frequency deviation, i.e., the deviation of the oscillation frequency fOSC from the series resonance frequency fr of the piezoelectric resonator X.

A description will now be given of the load capacitance CL.

FIG. 35 shows the connective relationship between the piezoelectric resonator X and various capacitances constituting the voltage-controlled piezoelectric oscillation circuit, as obtained when the varicap Cv and the trimmer CT are connected in series as in the first conventional arrangement.

Therefore, the load capacitance CL of the circuit in the first type of conventional arrangement is expressed by the following equation (2):

$$C_L = \frac{1}{\frac{1}{C_{01}} + \frac{1}{C_{02}} + \frac{1}{C_T} + \frac{1}{C_V}} \quad (2)$$

In contrast, when the varicap Cv and the trimmer CT are connected in parallel—as in the second conventional arrangement, a connective relationship as shown in FIG. 36 exists between the piezoelectric resonator X and the capacitances constituting the voltage-controlled piezoelectric oscillation circuit.

Therefore, the load capacitance CL of the circuit in the second type of conventional arrangement is expressed by the following equation (3).

$$C_L = \frac{1}{\frac{1}{C_{01}} + \frac{1}{C_{02}} + \frac{1}{(C_T + C_V)}} \quad (3)$$

[6] Comparison Between First and Second Conventional Arrangements

The first and second types of conventional arrangement will be compared with each other, on an assumption that the characteristics of the trimmer CT, varicap Cv, first oscillation capacitor CO1 and the second oscillation capacitor CO2 used in the first type of conventional arrangement are the same as those exhibited by corresponding components in the second type of conventional arrangement.

The first type of the of conventional arrangement shown in FIG. 31, in which the series connection of the varicap Cv and the trimmer CT is connected to one end of the piezoelectric resonator X, offers the following advantages over the second type of the conventional arrangement shown in FIG. 32, in which a parallel connection of the varicap Cv and the trimmer CT is connected to one end of the piezoelectric resonator X.

[6.1] Ease of Preservation of Adjustable Range of Oscillation Center Frequency f0 by the Trimmer The first type of the of conventional arrangement shown in FIG. 31, in which the series connection of the varicap Cv and the trimmer CT is connected to one end of the piezoelectric resonator X, permits the trimmer to adjust the center frequency f0 over a wider range.

This makes it easier to adjust the center frequency f0 of the voltage-controlled piezoelectric oscillation circuit despite any variation in the characteristics of the piezoelectric resonator X. Consequently, the specifications for the production of the piezoelectric resonator X becomes less severe, contributing to reduction in the cost of production of the same.

[6.2] Ease of Preservation of Range over which the Frequency is Varied (f-Vc characteristic) by the Varicap.

The first type of conventional arrangement, in which the series connection of the varicap Cv and the trimmer CT is connected to one end of the piezoelectric resistor X in series thereto, permits easy preservation of the range over which the frequency is variable (fOSC-Vc characteristic) by the effect of the varicap.

More specifically, as will be seen from FIG. 38 showing the frequency deviation vs. Vc characteristic of the oscillation frequency fOSC, the series connection of the varicap Vc and the trimmer CT to one end of the piezoelectric resonator X permits a large change of deviation of the oscillation frequency fOSC, even with a small change in the control voltage Vc.

A description will now be given of the problems encountered by the described conventional arrangements.

[7.1] Restriction of the Range Over which fOSC-Vc Characteristic is Variable, Caused by Variation in Trimmer Capacitance Application of the less severe specifications to the production of the piezoelectric resonators X require different trimmer capacitance values for different oscillation circuits, in order to adjust the oscillation center frequency in these circuits.

In the second type of conventional arrangement shown in FIG. 38 in which the parallel connection of the varicap Cv and the trimmer CT is connected to one end of the piezoelectric resonator X, a change in the control voltage Vc effected for the purpose of adjusting the oscillation center frequency f0 cannot cause a substantial change in the oscillation frequency fOSC, when the capacitance of the trimmer CT is set to 50 (pF) or 100 (pF). In such a case, it is not possible to obtain the desired fOSC-Vc characteristic.

In contrast, in the first type of conventional arrangement in which the varicap Cv and the trimmer CT are connected in series to one end of the piezoelectric resonator X, there is no risk of failure to obtain the desired fOSC-Vc characteristic, although the restriction in the range over which the oscillation frequency fOSC varies is inevitable.

It is thus possible to suppress the restriction or narrowing of the fOSC-Vc characteristic variable range caused by a variation in the trimmer capacitance, by adopting the first type of arrangement in which the series connection of the varicap Cv and the trimmer CT is connected to one end of the piezoelectric resonator X.

[7.2] Problems Attributable to Use of Trimmer

[7.2.1] First Problem

The number of parts or components to be incorporated in the piezoelectric oscillation circuit is preferably small, from the view point of production cost. If possible, all the parts and components are packaged on an IC chip so that both the assembly cost and parts cost are reduced.

Practically, however, it is difficult to integrate the piezoelectric resonator X, varicap Cv and the trimmer CI in a single IC chip, because of electrical characteristics and other requirements. Therefore, fabrication of a piezoelectric oscillation circuit essentially requires at least four discrete parts or components: namely, an IC incorporating the circuitry, the piezoelectric resonator X, the varicap Cv and the trimmer CT, despite the attempt to reduce the number of parts or components. This poses a practical limit in the reduction of the production cost.

[7.2.2] Second Problem

The trimmer CT is an electro-mechanical part having a mechanical rotary part for varying the capacitance. A practical limit therefore exists in the reduction of the size of the trimmer CT, from the view point of ease of manipulation.

Thus, the presence of the trimmer CT is one of the factors which cause impediment to miniaturization of piezoelectric oscillation circuit and saving of space.

[7.2.3] Third Problem

The trimmer CT, that has a mechanical rotary part for varying the capacitance, exhibits inferior stability for a long use, as compared with fixed-capacitance capacitors. In addition, the mechanical part tends to exhibit mechanical positional deviation when, for example, impacted by an external force, undesirably allowing deviation of the capacitance from the set value.

For these reasons, the use of a trimmer CT tends to impair the stability of the product piezoelectric oscillation circuit.

[7.3] Problem in Regard to Cost Incurred for Automatic Adjustment of Oscillation Center Frequency f0

FIG. 39 is a block diagram showing the configuration of an automatic adjusting system for adjusting oscillation center frequency f0 in the first type of conventional voltage-controlled piezoelectric oscillation circuit.

The automatic adjusting system 300 has an oscillation center frequency (f0) adjusting unit 301 which is connected to the output terminal OUT. The adjusting unit 301 is implemented by, for example, a personal computer that computes the amount of rotation of the rotary mechanism of the trimmer CT corresponding to the amount of capacitance adjustment performed by the trimmer CT and that outputs digital adjusting amount data based on the computed amount of rotation. The automatic adjusting system 300 also has a servo mechanism 302 that drives and rotate an adjusting screw serving as the rotary mechanism of the trimmer CT by an amount corresponding to the adjusting amount data.

The operation of the automatic adjusting system for adjusting the oscillation center frequency f0 is as follows.

The oscillation center frequency adjusting unit 301 of the automatic adjusting system 300 monitors the frequency of the oscillation signal SOSC which is output from the output terminal OUT, and supplies the servo mechanism 302 with adjusting amount data that corresponds to the amount of adjustment to be effected.

The servo mechanism 302 drives and rotates the adjusting screw of the trimmer CT to adjust the oscillation frequency to the desired target frequency.

It is not easy to accurately and quickly control the rotation amount of the, adjusting screw of the trimmer CT. Consequently, the yield or the number of product units of the voltage-controlled piezoelectric oscillation circuit is limited by the step of adjusting the oscillation center frequency f0. This undesirably leads to a rise in the cost of production of the voltage-controlled piezoelectric oscillation circuit.

SUMMARY OF THE INVENTION

A first aspect of the present invention is to reduce the number of parts or components used in the voltage-controlled piezoelectric oscillation circuit, while simplifying the assembly process, thereby reducing the production cost.

A second aspect of the present invention is to enable reduction in the size of voltage-controlled piezoelectric oscillation circuits.

A third aspect of the present invention is to improve stability and, hence, reliability of voltage-controlled piezoelectric oscillation circuits.

A fourth aspect of the present invention is to enable easy automatic adjustment of voltage-controlled piezoelectric oscillation circuit, thereby reducing the cost of adjustment, while reducing investment required for installation of the production facility.

To these ends, in accordance with the invention, there may be provided a capacitor array unit to be connected to an oscillation circuit having a piezoelectric resonator, and a variable-capacitance diode connected to the piezoelectric resonator in series thereto, the oscillation circuit outputting an oscillation signal of an oscillation frequency corresponding to a control voltage applied to a control voltage terminal thereof. The capacitor array unit may include a fixed-connection capacitor connected to the piezoelectric resonator or the variable-capacitance diode and having a predetermined electrostatic capacitance value; a plurality of selective-connection capacitors having predetermined electrostatic capacitance values; and a capacitor-connecting circuit for connecting desired one of the selective-connection capacitors to the fixed-connection capacitor in parallel therewith.

In accordance with the invention, there may be provided a capacitor array unit wherein the fixed-connection capacitor is connected to the piezoelectric resonator in series thereto.

In accordance with the invention, there may be provided a capacitor array unit wherein the fixed-connection capacitor is connected to the variable-capacitance diode in parallel therewith.

In accordance with the invention, there may be provided a capacitor array unit to be connected to an oscillation circuit having a piezoelectric resonator, and a fixed-connection capacitor connected to the piezoelectric resonator in series thereto and having a predetermined electrostatic capacitance value, the oscillation circuit outputting an oscillation signal of an oscillation frequency corresponding to a control voltage applied to a control voltage terminal thereof The capacitor array unit may include a plurality of selective-connection capacitors having predetermined electrostatic capacitance values; and a capacitor-connecting circuit for connecting a desired one of the selective-connection capacitors to the fixed-connection capacitor in parallel therewith.

In accordance with the invention, there may be provided a capacitor array unit to be connected to an oscillation circuit having a piezoelectric resonator, a variable-capacitance diode connected to the piezoelectric resonator on series thereto, and a fixed-connection capacitor having a predetermined electrostatic capacitance value and connected to the variable-capacitance diode in parallel therewith, the oscillation circuit outputting an oscillation signal of a predetermined oscillation frequency. The capacitor array unit may include a plurality of selective-connection capacitors having predetermined electrostatic capacitance values; and a capacitor-connecting circuit for connecting a desired one of the selective-connection capacitors to the fixed-connection capacitor in parallel therewith.

In accordance with the invention, there may be provided a capacitor array unit wherein at least one of the selective-connection capacitor may include a plurality of selective connection sub-capacitors connected in series or in parallel with one mother.

In accordance with the invention, there may be provided a capacitor array unit wherein the capacitor-connecting circuit may include a plurality of switches for connecting respective selective-connection capacitors to the fixed-connection capacitor.

In accordance with the invention, there may be provided a capacitor array unit controller for controlling a capacitor array unit that may include memory storing connection control data to be used in the control of selection between connection and non-connection of the selective-connection capacitors to the fixed-connection capacitor; and a connection control circuit for causing the memory to store the connection control data based on externally-given adjusting control data and for controlling the capacitor-connecting circuit in accordance with the adjusting control data or the connection control data.

In accordance with the invention, there may be provided a capacitor array unit controller wherein the connection control circuit may include a start-up control circuit which, when power supply is turned on, temporarily connects a preselected one of the selective-connection capacitors to the fixed-connection capacitor.

In accordance with the invention, there may be provided a capacitor array unit controller for controlling the capacitor array unit that may include memory storing connection control data to be used in the control of selection between connection and non-connection of the selective-connection capacitors to the fixed-connection capacitor; and a switch control circuit for causing the memory to store the connection control data based on externally-given adjusting control data and for effecting on-off control of the plurality of switches in accordance with the adjusting control data or the connection control data.

In accordance with the invention, there may be provided a capacitor array unit controller wherein the connection control circuit may include a start-up control circuit which, when power supply is turned on, temporarily turns on a preselected one of the switches.

In accordance with the invention, there may be provided an oscillation circuit for outputting an oscillation output of an oscillation frequency corresponding to a control voltage supplied to a control voltage terminal thereof. The oscillation circuit may include a piezoelectric resonator; a capacitor array unit; and a variable-capacitance diode connected to the piezoelectric resonator in series thereto.

In accordance with the invention, there may be provided an oscillation circuit for outputting an oscillation output of an oscillation frequency corresponding to a control voltage supplied to a control voltage terminal thereof. The oscillation circuit may include a piezoelectric resonator; a capacitor array unit; a capacitor array controller; and a variable-capacitance diode connected to the piezoelectric resonator in series thereto.

In accordance with the invention, there may be provided a capacitor array unit to be connected to an oscillation circuit having a piezoelectric resonator and a variable-capacitance diode connected to the piezoelectric resonator in series thereto, the oscillation circuit outputting an oscillation signal of a frequency corresponding to a control voltage supplied to a control voltage terminal thereof The capacitor array unit may include a center-frequency-adjusting capacitor array section connected to the piezoelectric resonator or the variable-capacitance diode, the capacitance of the center-frequency-adjusting capacitor array being variable to permit adjustment of the center frequency of the oscillation frequency; and a frequency-control-characteristic-adjusting capacitor array section including a plurality of control-characteristic-adjusting selective-connection capacitors having predetermined electrostatic capacitance values, and a control-characteristic-adjusting capacitor-connecting circuit for connecting desired one of the characteristic-control-adjusting selective-connection capacitors to the center frequency adjusting capacitor array section or to the variable-capacitance diode in parallel therewith.

In accordance with the invention, there may be provided a capacitor array unit to be connected to an oscillation circuit having a piezoelectric resonator, and a fixed-connection capacitor connected to the piezoelectric resonator in series thereto and having a predetermined electrostatic capacitance value. The capacitor array unit may include a plurality of center-frequency-adjusting selective-connection capacitor having predetermined electrostatic capacitance values; a center-frequency-adjusting capacitor connecting circuit for connecting desired one of the center-frequency-adjusting selective capacitors to the fixed-connection capacitor in parallel therewith; a plurality of control-characteristic-adjusting selective-connection capacitors having predetermined electrostatic capacitance values; and a frequency-control-characteristic-adjusting capacitor connecting circuit for connecting desired one of frequency-control-characteristic-adjusting selective-connection capacitors to the center-frequency-adjusting connecting capacitor.

In accordance with the invention, there may be provided a capacitor array unit to be connected to an oscillation circuit having a piezoelectric resonator, a variable-capacitance diode connected to the piezoelectric resonator in series thereto, and a fixed-connection capacitor connected to the variable-capacitance diode in parallel therewith. The capacitor array unit may include a plurality of center-frequency-adjusting selective-connection capacitors having predetermined electrostatic capacitance values; a center-frequency-adjusting-capacitor connecting circuit for connecting desired one of center-frequency-adjusting selective-connection capacitor to the fixed-connection capacitor in parallel therewith; a plurality of frequency-control-characteristic-adjusting selective-connection capacitors having predetermined electrostatic capacitance values; and a frequency-control-characteristic-adjusting capacitor connecting circuit for connecting desired one of the frequency-control-characteristic-adjusting selective-connection capacitors to the variable-capacitance diode or the center-frequency-adjusting connection capacitor in parallel therewith.

In accordance with the invention, there may be provided a capacitor array unit wherein at least one of the plurality of frequency-control-characteristic-adjusting selective-connection capacitors may include a plurality of frequency-control-characteristic-adjusting connection sub-capacitors connected in series or in parallel with one another.

In accordance with the invention, there may be provided a capacitor array unit wherein the control-characteristic-adjusting capacitor-connecting circuit may include a plurality of switches for connecting respective control-characteristic-adjusting, selective-connection capacitors to the center-frequency-adjusting capacitor array section or to the variable-capacitance diode in parallel therewith.

In accordance with the invention, there may be provided a capacitor array unit controller for controlling a capacitor array unit that may include memory storing connection control data to be used in the control of selection between connection and non-connection of the control-characteristic-adjusting selective-connection capacitor to the center-frequency-adjusting capacitor array or to the variable-capacitance diode; and a connection control circuit for causing the memory to store the connection data based on externally-given adjusting control data and for controlling the control-characteristic-adjusting capacitor connecting circuit in accordance with the adjusting control data or the connection control data.

In accordance with the invention, there may be provided a capacitor array unit controller wherein the connection control circuit may include a start-up control circuit which, when power supply is turned on, temporarily connects a preselected one of the frequency-control-characteristic-adjusting selective-connection capacitors to the variable-capacitance diode or to the center-frequency-adjusting capacitor array.

In accordance with the invention, there may be provided a capacitor array unit controller for controlling the capacitor array unit that may include memory storing connection control data to be used in the control of selection between connection and non-connection of the control characteristic adjusting selective-connection capacitor to the center-frequency-adjusting capacitor array section or to the variable-capacitance diode; and a switch control circuit for causing the memory to store the connection control data based on externally-given adjusting control data and for effecting on-off control of the plurality of switches in accordance with the adjusting control data. or the connection control data.

In accordance with the invention, there may be provided a capacitor array unit controller wherein the switch control circuit may include a start-up control circuit which, when power supply is turned on, temporarily turns on a preselected one of the switches.

In accordance with the invention, there may be provided an oscillation frequency adjusting system for effecting an adjustment on an oscillation circuit, so as to enable the oscillation circuit to output an oscillation signal of a predetermined reference oscillation frequency corresponding to a predetermined reference control voltage applied to the control voltage terminal. The oscillation frequency adjusting system may include an oscillation frequency detecting unit for detecting the frequency of the oscillation signal while the predetermined reference control voltage is applied to the control voltage terminal; and an adjusting data output unit for comparing the detected frequency of the oscillation signal with the reference oscillation frequency and for outputting, based on the result of the comparison, the adjusting control data for use in the control of selection between connection and non-connection of the selective-connection capacitor to the fixed-connection capacitor.

In accordance with the invention, there may be provided an oscillation frequency adjusting method for effecting an adjustment on an oscillation circuit, so as to enable the oscillation circuit to output an oscillation signal of a predetermined reference oscillation frequency corresponding to a predetermined reference control voltage applied to the control voltage terminal. The oscillation frequency adjusting method may include the steps of: a reference control voltage applying step for applying the predetermined reference voltage to the control voltage terminal; an oscillation frequency detecting step for detecting the frequency of the oscillation signal while the predetermined reference control voltage is applied to the control voltage terminal; and an adjusting data outputting step for comparing the detected frequency of the oscillation signal with the reference oscillation frequency and for outputting the adjusting, based on the result of the comparison, control data for use in the control of selection between connection and non-connection of the selective-connection capacitor to the fixed-connection capacitor.

In accordance with the invention, there may be provided an oscillation frequency adjusting system for effecting an adjustment on an oscillation circuit, so as to enable the oscillation circuit to output an oscillation signal of a predetermined frequency control characteristic corresponding to a predetermined reference control voltage applied to the control voltage terminal. The oscillation frequency adjusting system may include a frequency control characteristic detecting unit for detecting the frequency control characteristic of the oscillation signal while the predetermined reference control voltage is applied to the control voltage terminal; and an adjusting data output unit for comparing the detected frequency control characteristic of the oscillation signal with the reference frequency control characteristic and for outputting, based on the result of the comparison, the adjusting control data for use in the control of selection between connection and non-connection of the control characteristic selective-connection capacitor to the variable-capacitance diode or to the center-frequency-adjusting capacitor array section.

In accordance with the invention, there may be provided an oscillation frequency adjusting method for effecting an adjustment on an oscillation circuit, so as to enable the oscillation circuit to output an oscillation signal of a predetermined frequency control characteristic corresponding to a predetermined reference control voltage applied to the control voltage terminal. The oscillation frequency adjusting method may include a reference voltage applying step for applying the reference voltage to the control voltage terminal; a frequency control characteristic detecting step for detecting the frequency control characteristic of the oscillation signal while the predetermined reference control voltage is applied to the control voltage terminal; and an adjusting data output step for comparing the detected frequency control. characteristic of the oscillation signal with the reference frequency control characteristic and for outputting, based on the result of the comparison, the adjusting control data for use in the control of selection between connection and non-connection of the control characteristic selective-connection capacitor to the variable-capacitance diode or to the center-frequency-adjusting capacitor array section.

DETAILED DESCRIPTION OF PREFERRED EMBODIMENTS

[1] First Embodiment

[1.1] Configuration of Voltage-controlled Piezoelectric Oscillation Circuit in Accordance with First Embodiment

Figure 1:
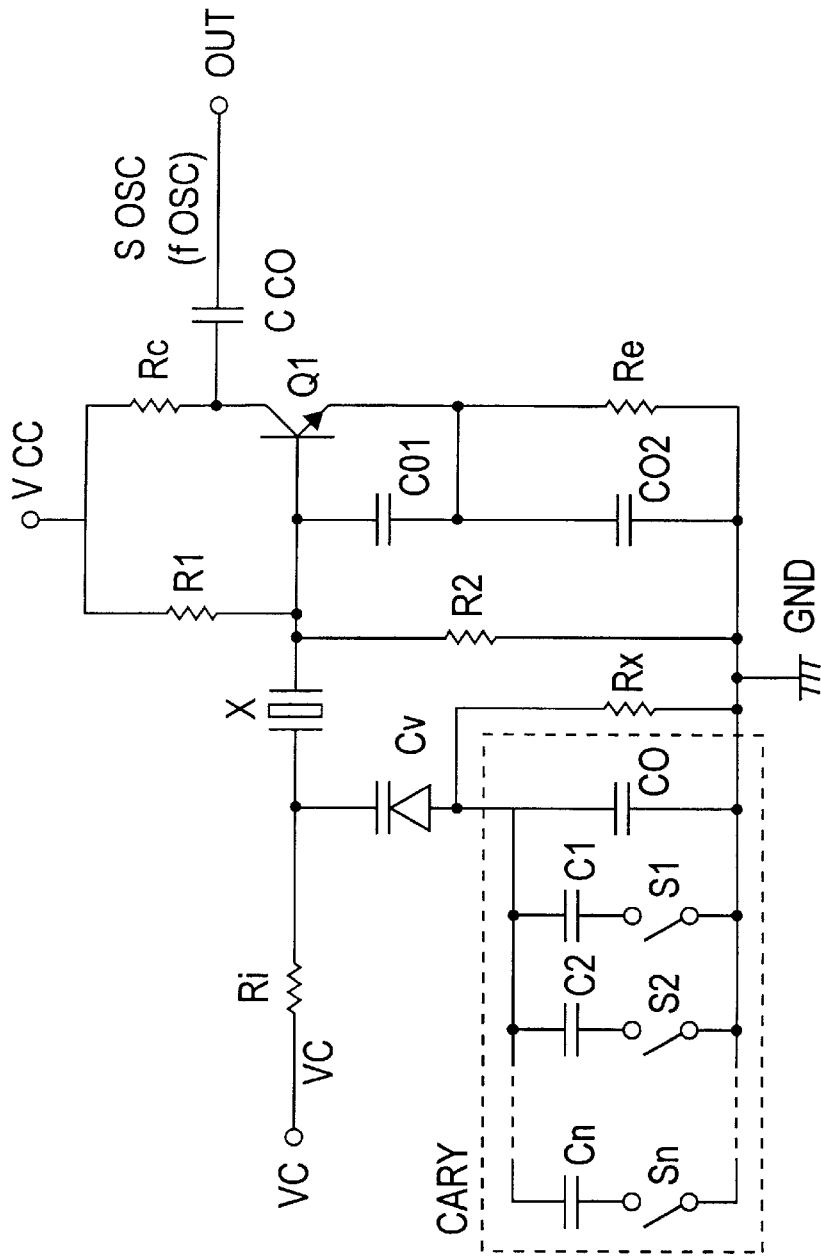
FIG. 1 is an illustration of the principle and basic construction of a voltage-controlled piezoelectric oscillation circuit in accordance with the first embodiment of the present invention.

[1.1.1] Principle and Basic Construction of Voltage-controlled Piezoelectric Oscillation Circuit FIG. 1 shows the principle and basic construction of a voltage-controlled piezoelectric oscillation circuit in accordance with the first embodiment.

The voltage-controlled piezoelectric oscillation circuit, generally denoted by 10, has the following parts or components: an output terminal OUT from which an oscillation signal SOSC is output; a frequency control terminal VC which receives a control voltage VC for varying the frequency fOSC of the oscillation signal SOSC; an input resistor Ri having one end connected to the frequency control terminal VC, the input resistor Ri providing a coarse coupling between the oscillation stage and an oscillation frequency control circuit (not shown) that is connected by a user to the frequency control terminal VC, while suppressing undesirable effects of the oscillation frequency control circuit on the oscillation stage; a piezoelectric resonator X having one end connected to the other end of the input resistor Ri; a variable-capacitance diode (referred to as a "varicap", hereinafter) Cv having a cathode connected to a node between the input resistor Ri and the piezoelectric resonator X; and a capacitor array CARY having one end connected to the anode of the varicap Cv and the other end connected to a lower-potential power supply GND, the capacitor array CARY being equivalent to a single capacitor having a desired capacitance value. The capacitor array CARY functions as a capacitor array unit, the detailed construction of which will be described later.

The voltage-controlled piezoelectric oscillation circuit also has the following parts or components: a bias resistor RX having one end connected to a node between the varicap Cv and the capacitor array CARY and the other end connected to the lower-potential power supply GND; a first bias resistor R1 having one end connected to a higher-potential power supply VCC and the other end connected to the other end of the piezoelectric resonator X; a second bias resistor R2 having one end connected to a node between the piezoelectric resonator X and the first bias resistor R1 and the other end connected to the lower-potential power supply GND; an NPN transistor Q1 having a base connected to a node between the piezoelectric resonator X and the first bias resistor R1; and a collector resistor Rc having one end connected to the higher-potential power supply VCC and the other end connected to the collector of the NPN transistor Q1.

The voltage-controlled piezoelectric oscillation circuit further has the following parts or components: a DC cut-off capacitor CCO having one end connected to a node between the collector resistor RC and the NPN transistor Q1 and the other end connected to the output terminal OUT, for removing DC component of the oscillation signal SOSC; an emitter resistor Re having one end connected to the emitter of the NPN transistor Q1 and the other end connected to the lower-potential power supply GND; a first oscillation capacitor CO1 having one end connected to a node between the base of the NPN transistor Q1 and the piezoelectric resonator X and the other end connected to a node between the emitter of the NPN transistor Q1 and the emitter resistor Re; and a second oscillation capacitor CO2 having one end connected to a node between the emitter of the NPN transistor Q1 and the emitter resistor Re and the other end connected to the lower-potential power supply GND.

[1.1.2] Configuration of Capacitor Array CARY

The capacitor array CARY includes the following parts or components: a base capacitor C0 which serves as a fixed-connection capacitor that provides the minimum required capacitance for the capacitor array CARY, and which has one end connected to the anode of the varicap Cv and the other end connected to the lower-potential power supply GND; n pieces of capacitors CX (X=1 to n) functioning as selective-connection capacitors for varying the capacitance of the capacitor array CARY; and switches SX (X=1 to n) corresponding to the selective-connection capacitors CX1 for connecting the associated selective-connection capacitors CX to the base capacitor C0 in parallel therewith.

The selective-connection capacitors C1 to Cn may have an equal capacitance value or may have different capacitance values. In the latter case, it is preferred that each selective-connection capacitor has a capacitance value which is $2^X$ times as large as a predetermined base capacitance, in order to obtain a wide range over which the capacitance of the capacitor array is variable.

Therefore, when a selected switch or switches, e.g., switches S1 to S3, are turned on, corresponding capacitors C1 to C3 are connected to the base capacitor C0, so that the capacitance CL expressed by the following equation (4) is formed as the circuit capacitance.

$$C_L = \frac{1}{\frac{1}{C_{01}} + \frac{1}{C_{02}} + \frac{1}{(C_1 + C_2 + C_3 + C_0)} + \frac{1}{C_V}} \quad (4)$$

[1.1.3] Practical Arrangement of Voltage-controlled Piezoelectric Oscillation Circuit.

Figure 2:
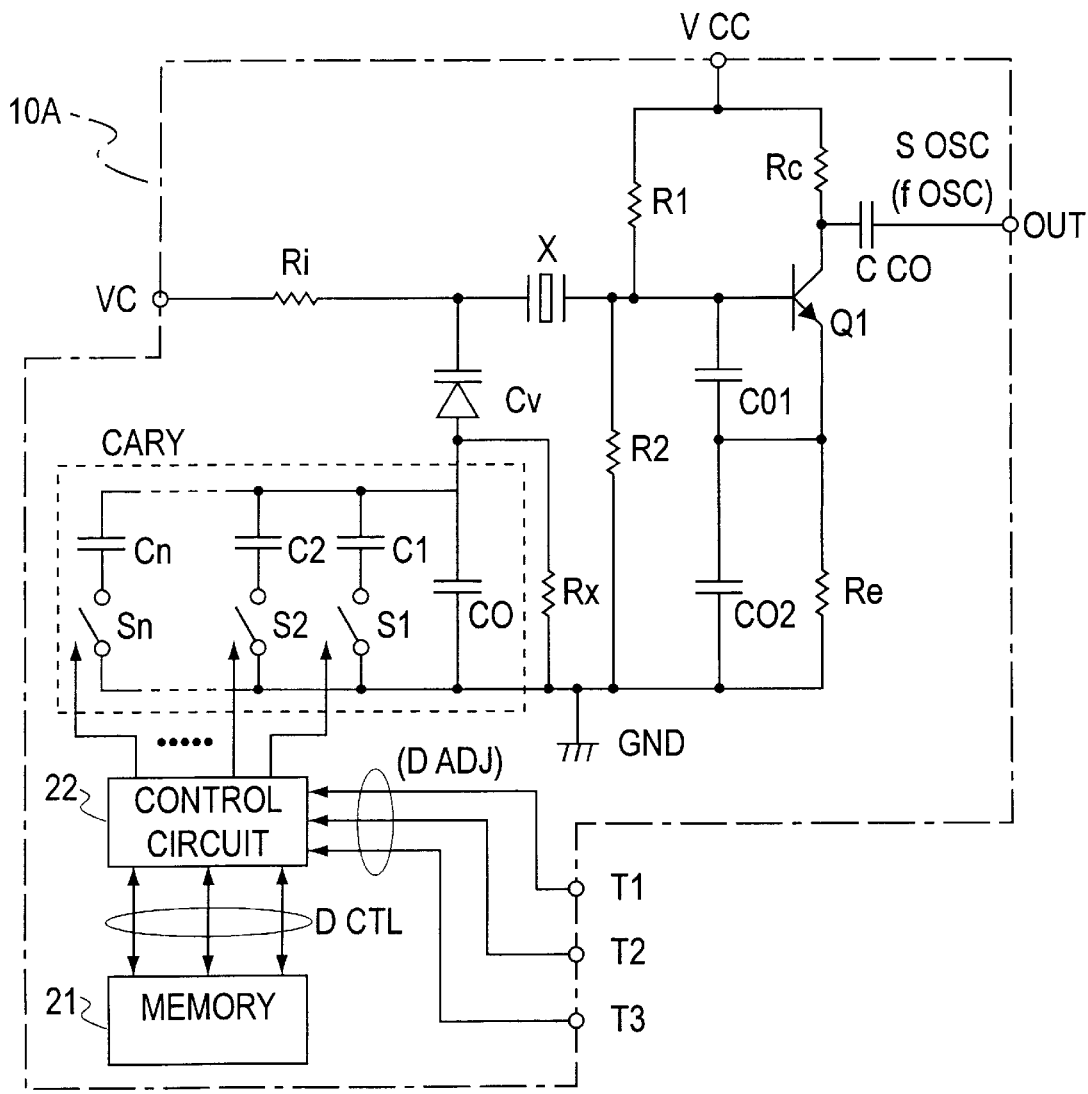
FIG. 2 is a block diagram of a voltage-controlled piezoelectric oscillation circuit of the first embodiment.

FIG. 2 shows a practical example of the arrangement of the voltage-controlled piezoelectric oscillation circuit. In this Figure, reference numerals which are the same as those appearing in FIG. 1 denote the same parts or components of the basic construction shown in FIG. 1, and detailed description of such parts or components is omitted.

The practical arrangement shown in FIG. 2 differs from the basic construction shown in FIG. 1 in that it includes a memory 21 and a control circuit 22. The memory 21 stores connection control data DCTL used for on-off control of the switches S1 to Sn of the capacitor array CARY in ordinary operation. The control circuit 22 has adjusting data input terminals T1 to T3 that receive adjusting digital data DADJ. During adjustment of the oscillation frequency, the control circuit 22 performs. the on-off control of the switches S1 to Sn in accordance with the adjusting digital data DADJ and, after the completion of the adjustment, causes the memory 21 to store the connection control data DCTL. During ordinary operation of the capacitor array, the control circuit 22 performs the on-off control of the switches S1 to Sn, based on the connection control data DCTL. The memory 21 and the control circuit 22 in combination provide a capacitor array unit control circuit.

When the voltage-controlled piezoelectric oscillation circuit is implemented as an IC, the switches S1 to Sn may have a variety of forms as listed below, according to the semiconductor process to be used for fabrication.

Figure 3:
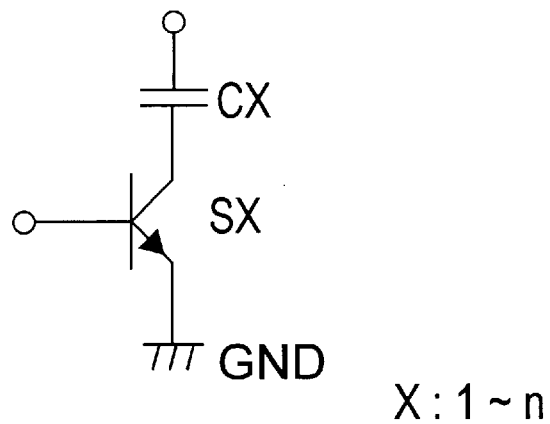
FIG. 3 is an illustration of a capacitor array incorporated in the first embodiment and having switches constituted by bipolar transistors.

(1) When a bipolar process is used as the semiconductor process, the, switches S1 to Sn are constructed as bipolar transistors, as shown in FIG. 3.

Figure 4:
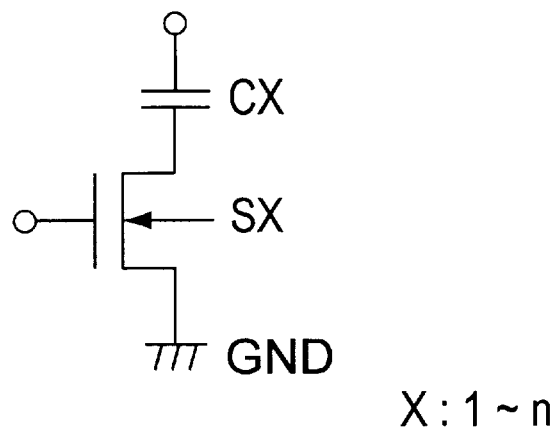
FIG. 4 is an illustration of a capacitor array incorporated in the first embodiment and having switches constituted by MOS transistors.

(2) When a CMOS process is used as the semiconductor process, the switches S1 to Sn are formed as MOS transistors, as shown in FIG. 4.

(3) A Bi-CMOS process is a combination of a bipolar process and a CMOS process and is now widely used as semiconductor process for producing ICs suitable for use in RF range. When the Bi-CMOS process is employed, the switches S1 to Sn can be implemented either as bipolar transistors shown in FIG. 3 or as MOS transistors shown in FIG. 4.

When reduction in the power consumption is particularly important, it is preferred that the switches S1 to Sn are implemented by MOS transistors that can be turned on without requiring continuous supply of currents. More specifically, a MOS transistor, which is a voltage-controlled element, is turned on when its gate receives a voltage of a level high enough to turn this transistor, without requiring constant electric current flowing from the gate to a lower-potential power supply GND. In contrast, a bipolar transistor requires that an ample current flows between the base and the lower-potential power supply GND, in order that the transistor exhibits small resistance when selected and turned on.

Preferably, the piezoelectric resonator X is implemented by a quartz oscillator which is stable both physically and chemically and which advantageously exhibits small sensitivity to temperature variation.

In this case, the memory 21 may be constituted by a non-volatile semiconductor memory such as an EEPROM, EPROM, fuse-type ROM or the like.

[1.2] Automatic Adjusting System for Adjusting Oscillation Center Frequency f0

[1.2.1] Configuration of the Automatic Adjusting System for Adjusting the Oscillation Center Frequency f0

Figure 5:
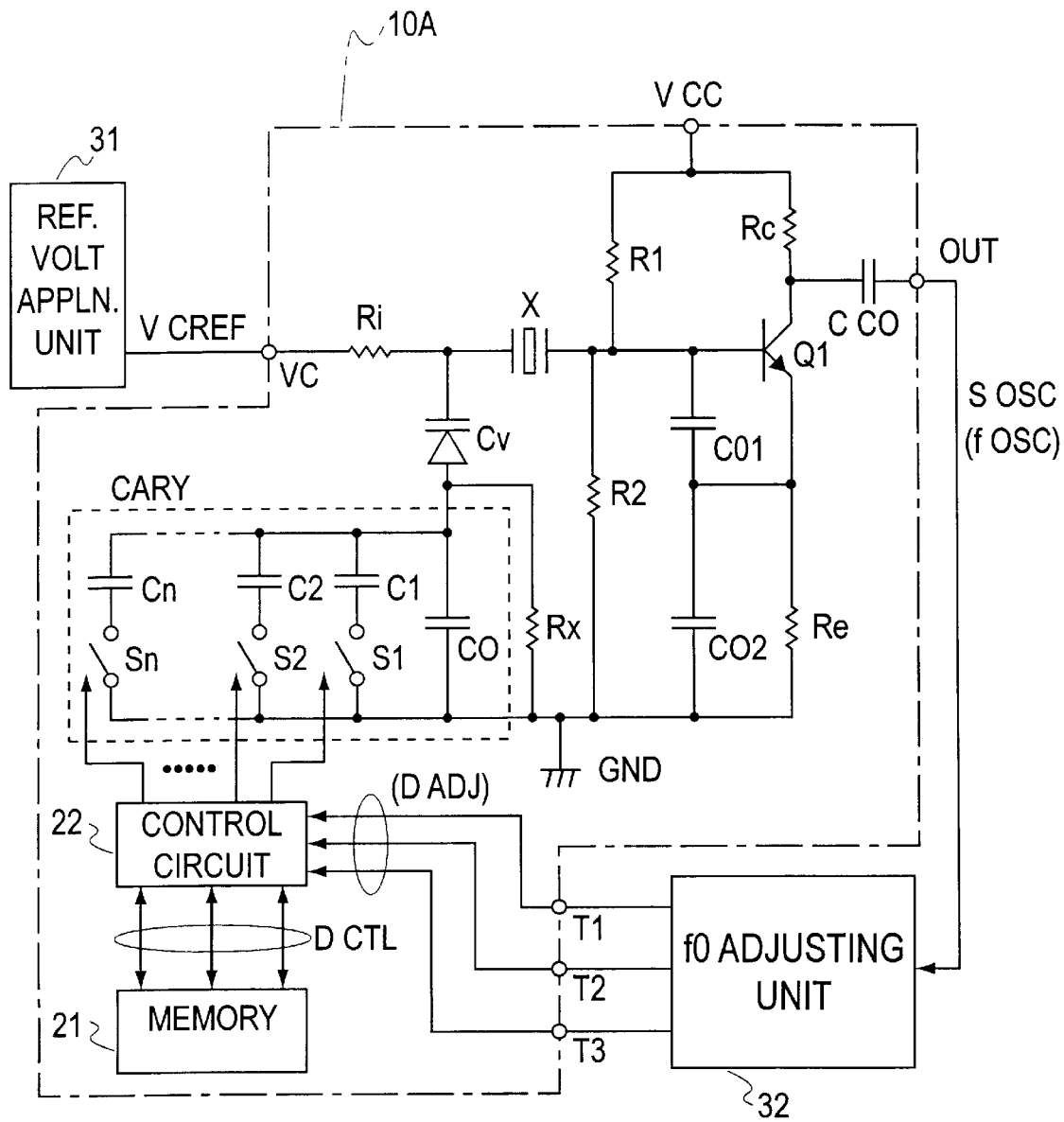
FIG. 5 is a block diagram of an oscillation center frequency adjusting system.

FIG. 5 is a block diagram showing the configuration of an automatic adjusting system for adjusting the oscillation center frequency f0 of the voltage-controlled piezoelectric oscillation circuit.

The automatic adjusting system 30 has a reference voltage application unit 31 and an oscillation center frequency (f0) adjusting unit 32. The reference voltage application unit 31 applies to the frequency control terminal VC a calibrated reference control voltage VCREF corresponding to a predetermined reference oscillation center frequency f0REF. The oscillation center frequency (f0) adjusting unit 32 is connected to the output terminal OUT of the voltage-controlled piezoelectric oscillation circuit 10A and detects the oscillation frequency fOSC, which also is referred to as an "oscillation center frequency f0'", of the oscillation signal SOSC that is output from the output terminal OUT when the calibrated reference control voltage VCREF is applied to the frequency control terminal VC. The oscillation center frequency (f0) adjusting unit 32 compares the detected oscillation frequency fOSC with the predetermined reference oscillation frequency f0REF and generates, based on the result of the comparison, the adjusting digital data DADJ to be used in the on-off control of the switches in the capacitor array CARY. The oscillation center frequency (f0) adjusting unit 32 delivers the adjusting digital data DADJ to the voltage-controlled piezoelectric oscillation circuit 10A through the adjusting control data input terminals T1 to T3. The oscillation enter frequency (f0) adjusting unit 32 may be implemented by, for example, a personal computer.

[1.2.2] Operation in Adjusting Mode

A description will now be given of the operation performed by the automatic adjusting system 30 for adjusting the oscillation frequency fOSC of the oscillation signal SOSC output through the output terminal OUT.

The reference voltage application unit 31 applies to the frequency control terminal VC the calibrated reference control voltage VCREF corresponding to the predetermined reference oscillation center frequency f0REF.

Simultaneously with the application of the reference control voltage VCREF, the oscillation center frequency (f0) adjusting unit 32 detects the oscillation frequency fOSC, corresponding to the oscillation center frequency f0', of the oscillation signal SOSC output from the output terminal OUT.

The oscillation center frequency (f0) adjusting unit 32 then compares the, detected oscillation frequency fOSC with the predetermined reference oscillation center frequency f0REF corresponding to the reference control voltage VCREF.

Then, a computation is performed in accordance with the equation (4) so as to determine the load capacitance CL of the oscillation circuit, such that the difference between the reference oscillation frequency f0REF and the oscillation frequency fOSC is substantially nullified, whereby the adjusting digital data DADJ to be used in the on-off control of the switches in the capacitor array CARY is obtained. The adjusting digital data DADJ is supplied to the voltage-controlled piezoelectric oscillation circuit 10A through the adjusting control data input terminals T1 to T3.

The control circuit 22 of the voltage-controlled piezoelectric oscillation circuit 10A performs the on-off control of the switches S1 to Sn of the capacitor array CARY, based on the adjusting digital data DADJ received through the adjusting control data T1 to T3.

The oscillation center frequency adjusting unit 32 again detects the oscillation frequency fOSC, i.e., the oscillation center frequency f0, of the oscillation signal SOSC output from the output terminal OUT. The oscillation center frequency adjusting unit 32 then compares the detected oscillation frequency fOSC with the predetermined reference oscillation center frequency f0REF corresponding to the reference control voltage VCREF, and repeats the described steps until the difference between the oscillation frequency fOSC and the reference oscillation center frequency f0REF is substantially nullified.

The adjusting digital data DADJ is maintained without change for a time not shorter than a predetermined period, when the oscillation frequency fOSC has been substantially equal to the predetermined reference oscillation center frequency f0REF.

Holding of the adjusting digital data DADJ is recognized by the control circuit 22 as being a sign indicating that the automatic adjustment of the oscillation center frequency f0 is finished. The control circuit 22 then causes the memory 21 to store the connection control data DCTL corresponding to the adjusting digital data DADJ obtained when the adjustment is finished.

The memory 21 holds the connection control data DCTL until the data is updated by the control circuit 22.

In the described operation, the control circuit 22 itself detects the completion of the automatic adjustment and causes the memory 21 to store the connection control data DCTL that corresponds to the adjusting digital data DADJ obtained when the adjustment is finished. This, however, is only illustrative and the arrangement may be such that information indicating the completion of the adjustment is included in the adjusting data DADJ and such adjusting data DADJ is delivered from the oscillation frequency adjusting unit 32 to the control circuit 22, so that the control circuit 22, upon receipt of the data, operates to cause the memory 21 to store the connection control data DCTL corresponding to the adjusting digital data DADJ.

[1.3] Operation of the Voltage-controlled Piezoelectric Oscillation Circuit in Normal Oscillation Mode A description will be given of the normal oscillating operation of the voltage-controlled piezoelectric oscillation circuit 10A, with specific reference to FIG. 2.

When the power supply is turned on, the control circuit 22 of the voltage-controlled piezoelectric oscillation circuit 10A operates so as to temporarily turn on (close) all the switches S1 to Sn of the capacitor array CARY.

This operation is intended to allow electrical current to rush from the high-potential power supply VCC to the low-potential power supply GND so as to quickly supply vibration energy to the piezoelectric resonator, thereby quickly settling the oscillation frequency fOSC of the oscillation signal SOSC which is output from the output terminal OUT of the voltage-controlled piezoelectric oscillation circuit 10A. Therefore, the temporal closing of all the switches S1 to Sn of the capacitor array CARY in response to turning on of the power supply is not needed when such a quick settling of the oscillation frequency fOSC is not required.

After elapse of a predetermined time, the control circuit 22 reads control data DCTL from the memory 21 and turns on only the switch SX corresponding to the connection control data DCTL, while keeping other switches off (open).

Consequently, an oscillation signal SOSC is derived from the output terminal OUT, having the oscillation frequency fOSC corresponding to the control voltage Vc and centered at the oscillation center frequency f0.

[1.4] Advantages of the First Embodiment (1) An ample range over which the oscillation center frequency f0 is adjustable is ensured, so that the adjustment of the oscillation frequency to the aimed oscillation center frequency f0 after the assembly of the voltage-controlled piezoelectric resonator can be achieved more easily than in the case of the aforesaid second conventional arrangement, despite any variation in the characteristic of the piezoelectric resonator. This allows application of less severe specifications for the production of the piezoelectric resonators, contributing to reduction in the cost of the piezoelectric resonator and, hence, cost of production of the whole unit of the voltage-controlled piezoelectric resonator. In addition, it is easy to preserve the required range of frequency variation effected by the varicap, which also serves to facilitate the adjustment of the oscillation frequency. Further, the fOSC-Vc characteristic does not significantly change according to the set values of capacitance of the capacitor array CARY. For these reasons, a voltage-controlled piezoelectric resonator of desired characteristic can easily be obtained.

(2) The use of the capacitor array CARY enables the voltage-controlled piezoelectric resonator to be implemented without requiring any trimmer capacitor. Consequently, the number of the externally-connected part is reduced by one, whereby the assembly cost is reduced.

(3) The cost of the voltage-controlled piezoelectric resonator can be reduced by virtue of the use of inexpensive capacitor array in place of a trimmer capacitor which is costly.

(4) There is a practical limit in the reduction of the size of conventional voltage-controlled piezoelectric resonators incorporating trimmer capacitors, because the trimmer has a mechanical part. In contrast, the capacitor array CARY can be packaged in an IC. This advantageously enables a reduction in the size of the voltage-controlled piezoelectric resonator.

(5) The voltage-controlled piezoelectric resonator of this embodiment, employing the capacitor array CARY, is stable in terms of secular change and operation, as compared with voltage-controlled piezoelectric resonator employing trimmer capacitors. It is therefore possible to achieve a higher degree of operation stability of the piezoelectric oscillation circuit.

(6) The adjustment of the oscillation center frequency can be achieved purely electrically, based on the adjusting data DADJ which is digital data, thus eliminating necessity of mechanical adjustment that is required in the conventional arrangements. This reduces the time required for the adjustment of the oscillation center frequency, leading to a reduction in the cost of production of the voltage-controlled piezoelectric resonator.

Further, the investment for installation of the production equipment can be reduced, because of elimination of the servo mechanism which is required in the conventional arrangement for the purpose of adjusting the trimmer capacitor and which is complicated and expensive.

[1.5] Modifications of the First Embodiment

In the first embodiment as described, the piezoelectric resonator X and the varicap Cv are constructed as discrete parts. This, however, is not exclusive and the arrangement may be such that the piezoelectric resonator X and the varicap Cv are connected in series and resin-sealed or packaged in a single package, so that the assembly process for assembling the voltage-controlled oscillator can be simplified.

While in the described first embodiment the base capacitor C0 is incorporated as a part of the capacitor array CARY, the base capacitor C0 may be excluded from the capacitor array CARY: namely, a capacitor array CARY' may be formed of the capacitors C1 to Cn and the switches S1 to Sn, without including the base capacitor. Such a capacitor array CARY' may be integrated with the memory 21 and the control circuit 22 so as to form an IC which is attached to the oscillation circuit as an external part.

The arrangement also may be such that the capacitor array CARY or CARY' alone is constructed as an IC which forms an external part to be connected to the oscillation circuit. Such an arrangement makes it possible to design and obtain voltage-controlled piezoelectric resonators of a wide variety of fOSC-Vc characteristics, simply by preparing a new capacitor array CARY'.

In the first embodiment as described, the switches S1 to Sn of the capacitor array CARY are implemented by transistors. However, these switches may be formed of fuse switches, if the requirement for the precision of oscillation frequency is not so strict. In such a case, the switches are permanently opened upon completion of the adjustment.

[2] Second Embodiment

Figure 6:
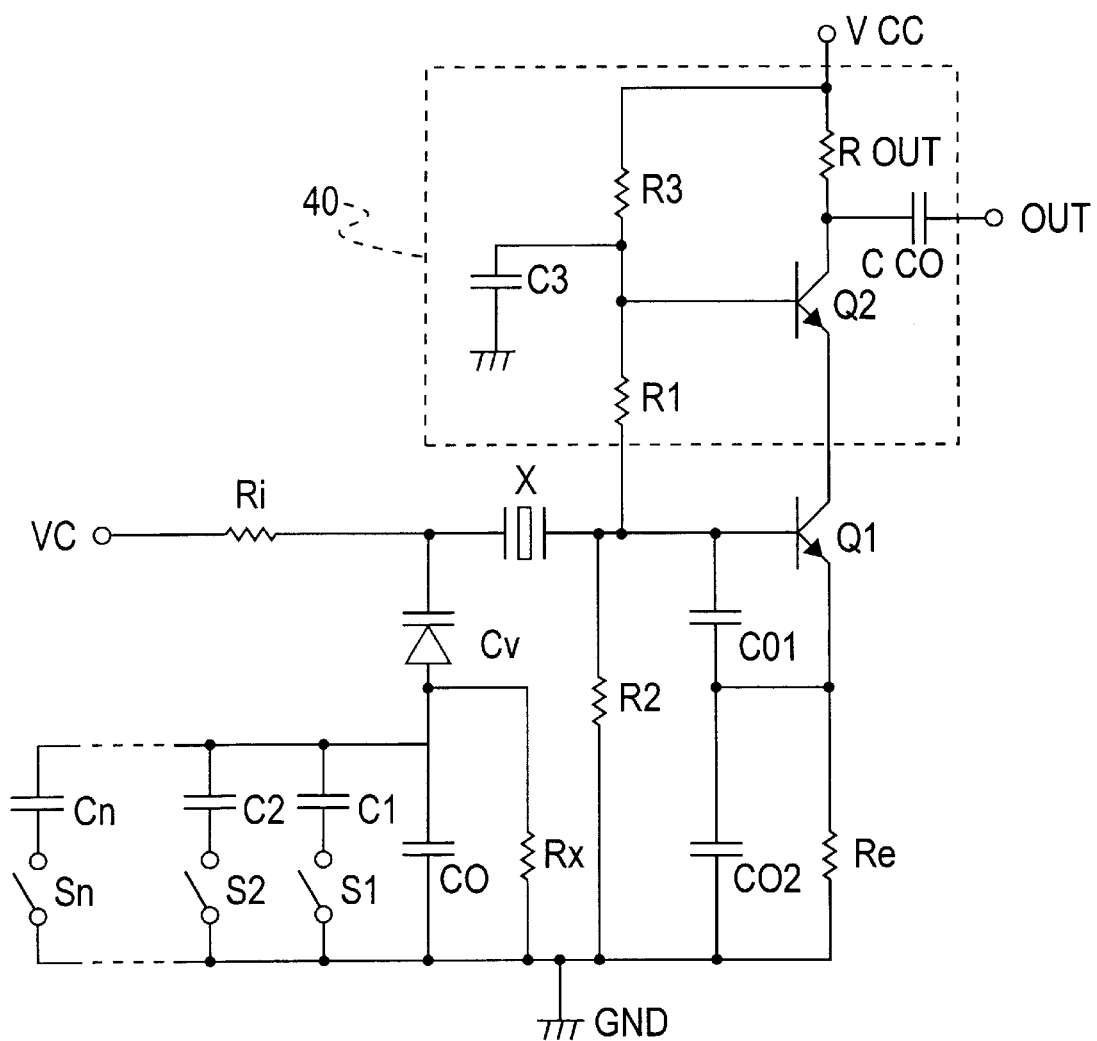
FIG. 6 is a block diagram of a voltage-controlled piezoelectric oscillation circuit in accordance with a second embodiment.

FIG. 6 shows the principle and basic construction of a voltage-controlled piezoelectric oscillation circuit in accordance with the second embodiment of the present invention.

The voltage-controlled piezoelectric oscillation circuit, denoted by 10B, differs from the voltage-controlled piezoelectric oscillation circuit 10 of the first embodiment in that a buffer circuit 40 is provided in the output stage of the oscillation circuit so as to form a cascade oscillation circuit that is less liable to be affected by the load on a circuit connected to the output terminal OUT of the oscillation circuit. A capacitor array CARY which may be the same as that used in the first embodiment is connected to this cascade oscillation circuit.

This embodiment offers the same advantages as those brought about by the first embodiment. In addition, RF frequency characteristic of the oscillation circuit can be improved over the first embodiment.

[3] Third Embodiment

Figure 7:
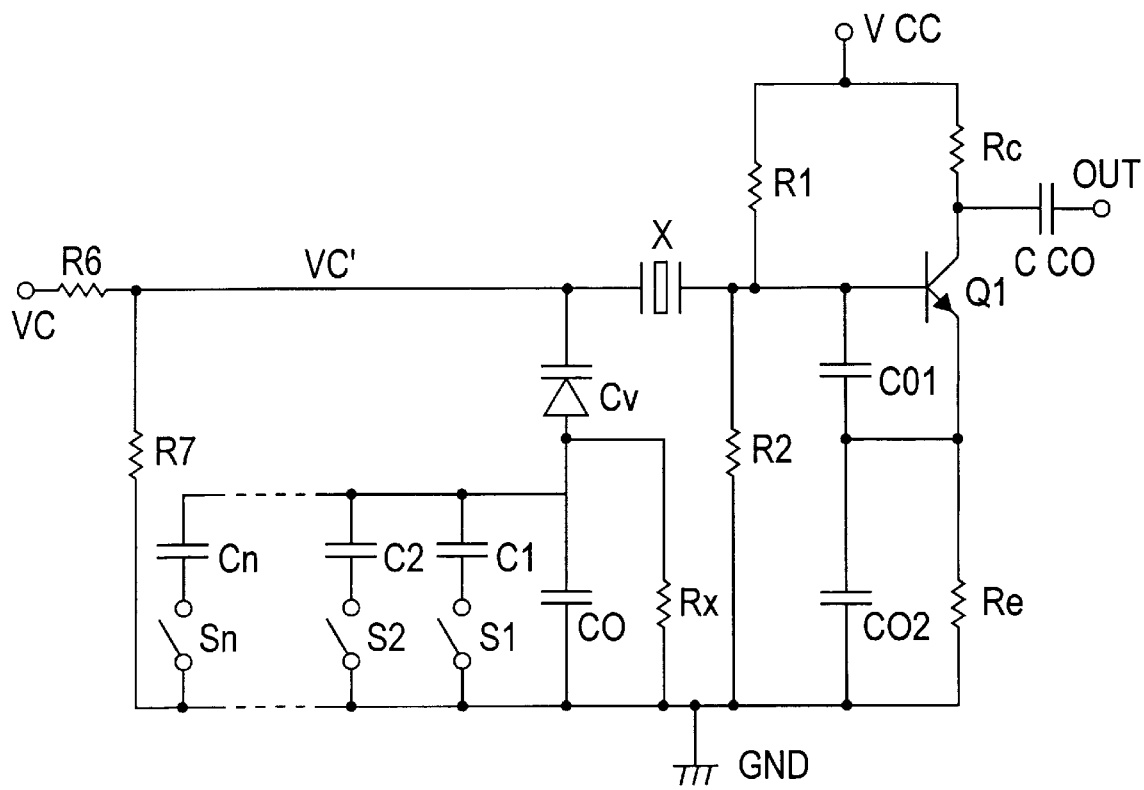
FIG. 7 is a block diagram of a voltage-controlled piezoelectric oscillation circuit in accordance with a third embodiment.

FIG. 7 shows the principle and basic construction of a voltage-controlled piezoelectric oscillation circuit in accordance with the third embodiment of the present invention.

The voltage-controlled piezoelectric oscillation circuit, denoted by 10C, differs from the voltage-controlled piezoelectric oscillation circuit 10 of the first embodiment in that a first voltage dividing resistor R6 is connected between the control voltage input terminal VC and the piezoelectric resonator X and in that a second voltage dividing resistor R7 is employed with its one end connected to a node between the first voltage dividing resistor R6 and the piezoelectric resonator X and the other end connected to the lower-potential power supply. The resistance values of the first and second voltage dividing resistors R6 and R7 are suitably selected so as to enable control of the actual control voltage VC' which is the actual value of the control voltage VC applied to the control voltage terminal VC, thus enabling a change of the range over which the oscillation frequency is adjustable.

For instance, it is assumed here that the resistance value of the second voltage dividing resistor R7 is infinitive (8), i.e., the second voltage dividing resistor R7 is disconnected. In such a case, the actually applied control voltage VC' equals to VC: namely, the following condition is established:

$$VC'=VC$$

It is also assumed that the frequency is variable over the range of ±200 [ppm] in this state.

If the resistance value of the second potential dividing resistor R7 is set to be the same as that of the first voltage dividing resistor R6, i.e., when the condition expressed by $$R7=R6$$

exists, the actually applied control voltage VC' can be expressed as follows with respect to the control voltage VC:

$$VC'=\frac{1}{2}VC$$

Consequently, the range over which the frequency is variable is determined to be ±100 [ppm].

Thus, the third embodiment offers an advantage to enable variation of the range of the fOSC-VC characteristic, in addition to the advantage brought about by the first embodiment.

[4] Fourth Embodiment

Figure 8:
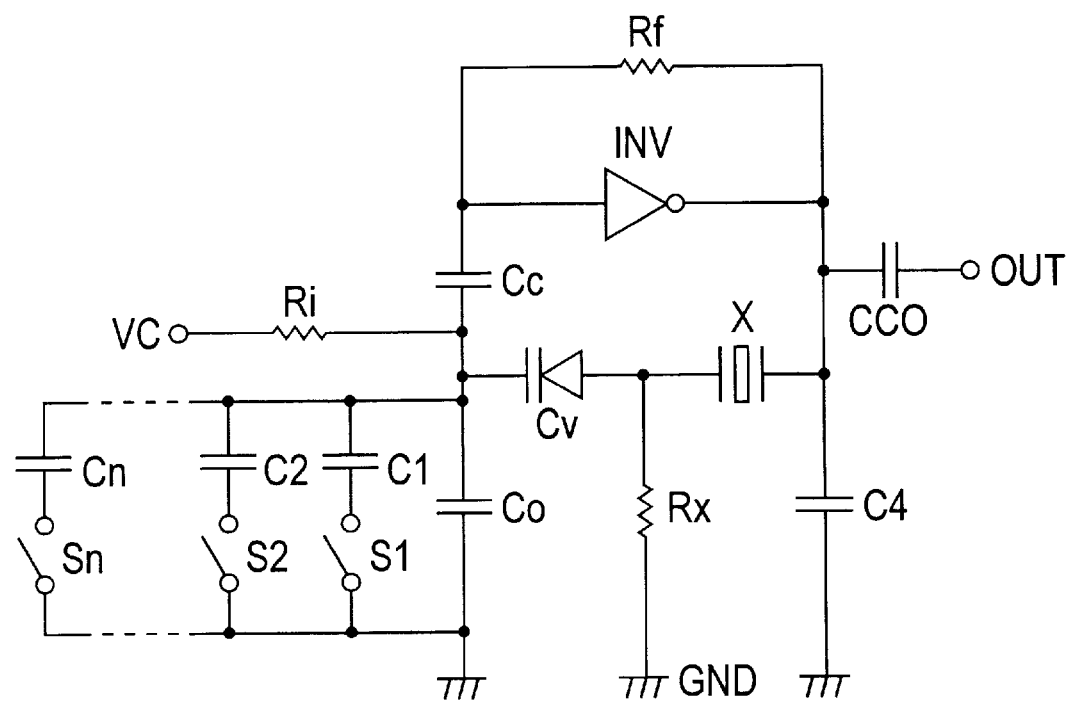
FIG. 8 is a block diagram of a voltage-controlled piezoelectric oscillation circuit in accordance with a fourth embodiment.

FIG. 8 shows the principle and basic construction of a voltage-controlled piezoelectric oscillation circuit in accordance with the fourth embodiment of the present invention.

The voltage-controlled piezoelectric oscillation circuit, denoted by 10D, differs from the voltage-controlled piezoelectric oscillation circuit 10 of the first embodiment in that the oscillation circuit is implemented as a CMOS oscillation circuit having an oscillation stage constituted by a CMOS inverter INV. A capacitor array CARY which may be the same as that of the first embodiment is connected to this CMOS oscillation circuit.

Thus, advantages equivalent to those of the first embodiment are obtainable, also with the use of the CMOS oscillation circuit. In addition, a further reduction in the power consumption can be achieved since the switches S1 to Sn also are constituted by CMOSs.

[5] Fifth Embodiment

In each of the embodiments described heretofore, the capacitor array CARY is constituted by n pieces of capacitors CX (X=1 to n) that serve as selective-connection capacitors for varying the capacitance of the Capacitor array CARY. In contrast, in the fifth embodiment shown in FIG. 9, each capacitor CX of the array CARY is constituted by a plurality of sub-capacitors including a base sub-capacitor CX0. Thus, each capacitor CX has sub-capacitors CX0 and CX1 to CXm (m being a natural number). The sub-capacitors CX1 to CXm are adapted to be connected to and disconnected from the circuit by way of associated sub-switches SX1 to SXm, whereby the sub-capacitors CX1 to CXm are selectively coupled, thereby permitting adjustment of the capacitance of the capacitor array CARY. It is therefore possible to realize a more fine adjustment of the capacitance.

[6] Sixth Embodiment

In each of the foregoing embodiments, the varicap Cv and the capacitor array CARY are connected in series to each other. The invention, however, does not exclude such an arrangement in which the capacitor array CARY is connected to the varicap Cv in parallel therewith, as in the second type of known arrangement described before.

Such an arrangement provides items (2) to (6) of the advantages of the first embodiment described before.

[7] Seventh Embodiment

Figure 10:
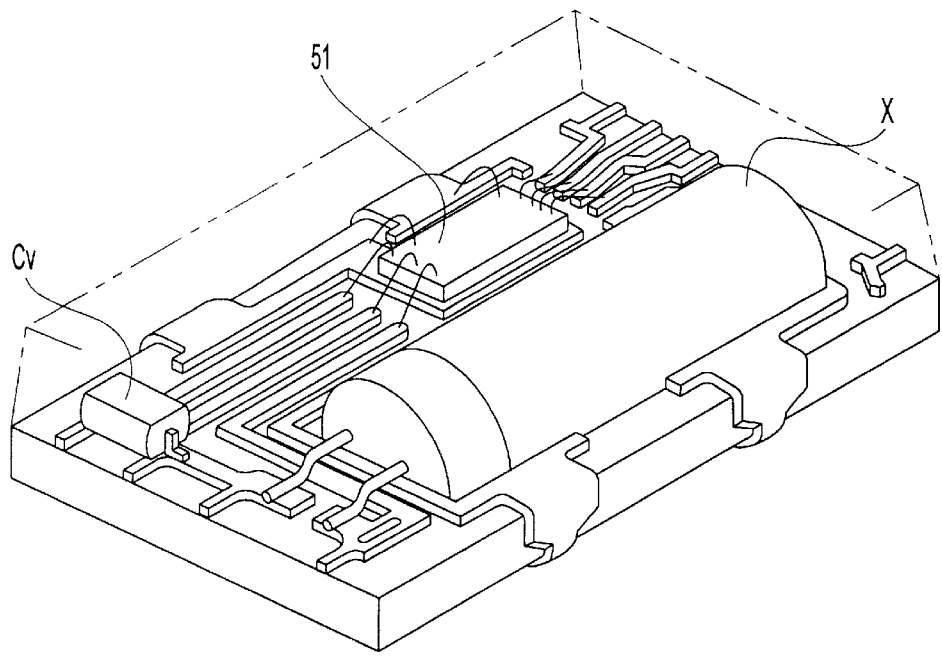
FIG. 10 is a perspective view of a voltage-controlled piezoelectric oscillation circuit in accordance with a seventh embodiment.
Figure 11:
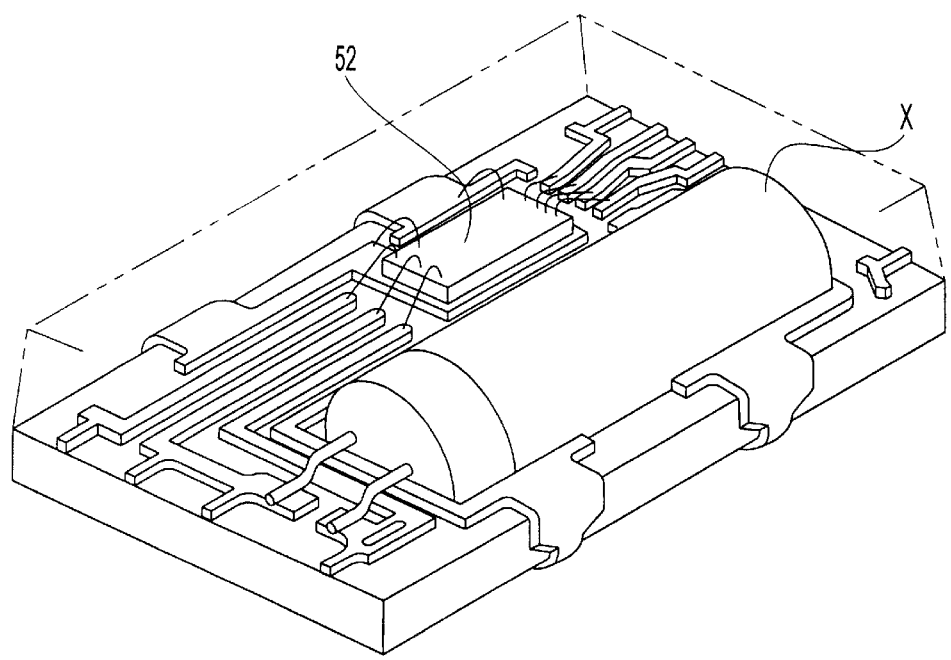
FIG. 11 is a perspective view of a voltage-controlled piezoelectric oscillation circuit in accordance with an eighth embodiment.

FIG. 10 is a perspective view of an example of a voltage-controlled piezoelectric oscillation circuit constructed in accordance with a seventh embodiment of the present invention.

No specific restriction is posed in the foregoing embodiments in regard to the state of packaging of the elements constituting the voltage-controlled piezoelectric oscillation circuit. In the seventh embodiment, components other than the piezoelectric resonator X and the varicap Cv are formed as a one-chip IC 51 which is resin-sealed together with the piezoelectric resonator X and the varicap Cv.

This structure is afforded by virtue of the facts that the adjustment of the capacitor array CARY can be performed electrically and that a wide range is preserved for adjustment of the oscillation center frequency f0 effected by the capacitor array CARY. Namely, variation or fluctuation of the characteristics of the piezoelectric resonator and the varicap Cv can easily be accommodated as a result of the adjustment, so that the desired oscillation center frequency f0 can be attained without difficulty, despite the resin-molding of the one-chip IC together with the piezoelectric resonator X and the varicap Cv.

It is thus possible to reduce the number of steps of the assembly process, as well as the production cost, through the reduction in the number of discrete parts.

FIG. 8 is a perspective view of an example of the voltage-controlled piezoelectric oscillation circuit configured in accordance with an eighth embodiment of the present invention.

While in the seventh embodiment the one-chip IC 51 is constituted by the components except for the piezoelectric resonator X and the varicap Cv and resin-molded together with the piezoelectric resonator X and the varicap Cv, the eighth embodiment employs a one-chip IC 52 in which are packaged the components other than the piezoelectric resonator X. Thus, the one-chip IC 52 of the eighth embodiment incorporates the varicap Cv, and is resin-molded together with the piezoelectric resonator X.

The eighth embodiment thus contributes to reduction in the number of discrete parts, leading to reduction in the number of steps of production process and, hence, to the reduction in the production cost.

Figure 12:
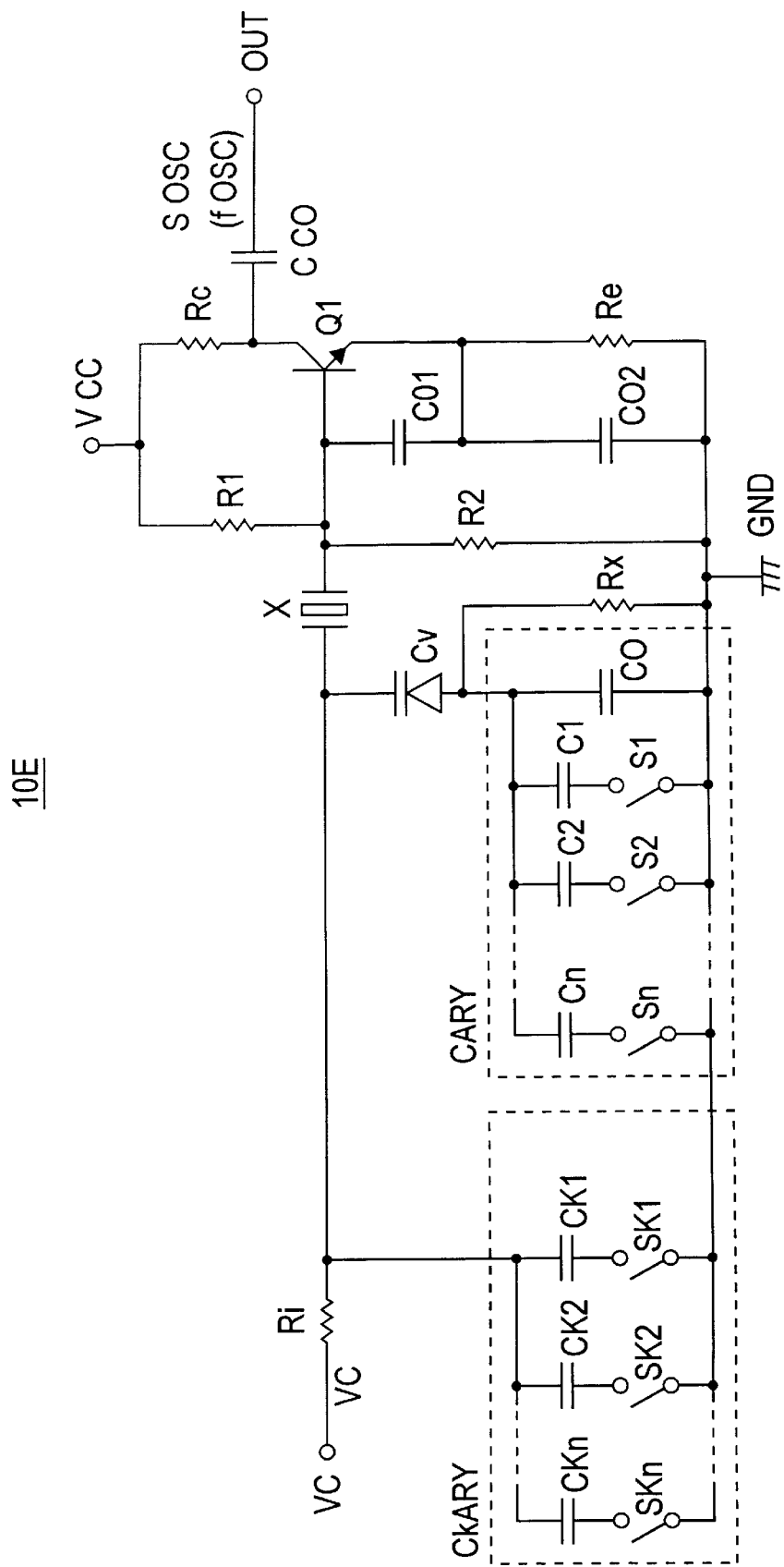
FIG. 12 is an illustration of the principle and construction of a voltage-controlled piezoelectric oscillation circuit in accordance with a ninth embodiment.

[9] Ninth Embodiment
[9.1] Configuration of Voltage-controlled Piezoelectric Oscillation Circuit in Accordance with Ninth Embodiment
[9.1.1] Principle and Construction of Voltage-controlled Piezoelectric Oscillation Circuit FIG. 12 shows the principle and basic construction of a voltage-controlled piezoelectric oscillation circuit in accordance with the ninth embodiment of the present invention.

In FIG. 12, reference numerals which are the same as those appearing in FIG. 1 denote the same parts or components as those incorporated in the first embodiment shown in FIG. 1, and detailed description is omitted with respect to such parts or components.

The voltage-controlled piezoelectric oscillation circuit, denoted by 10E, differs from the voltage-controlled piezoelectric oscillation circuit 10 of the first embodiment in that it employs an additional capacitor array CKARY for adjusting frequency characteristic. The additional capacitor array CKARY is connected in parallel with the varicap Cv and the capacitor array CARY, and performs a fiction equivalent to that of a single capacitor having a desired capacitance value, so as to enable adjustment of the frequency control characteristic (fOSC-VC characteristic), i.e., the gradient of a curve showing the oscillation frequency deviation with respect to the control voltage.

The additional capacitor array CKARY for adjustment of the frequency control characteristic is employed for the following reason.

In each of the first to eighth embodiments described hereinbefore, the voltage-controlled piezoelectric oscillation circuit employs the capacitor array CARY for enabling adjustment of the oscillation center frequency. Such voltage-controlled piezoelectric oscillation circuit may be implemented in the form of an IC, incorporating a commercially available varicap Cv. In some cases, it is not easy to obtain desired frequency control characteristic with such voltage-controlled piezoelectric oscillation circuit.

Figure 24:
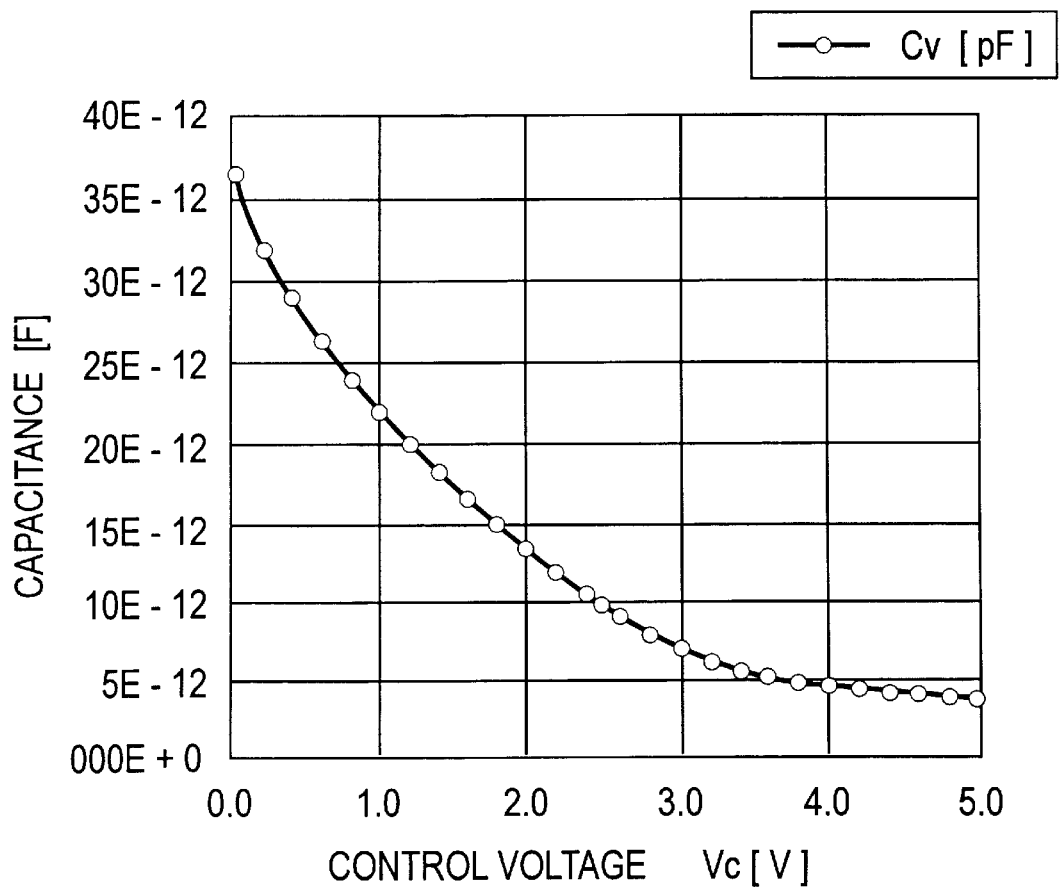
FIG. 24 is an illustration of a varicap.

FIG. 24 shows the change in the capacitance of a commercially-available varicap in relation to the control voltage Vc.

Figure 25:
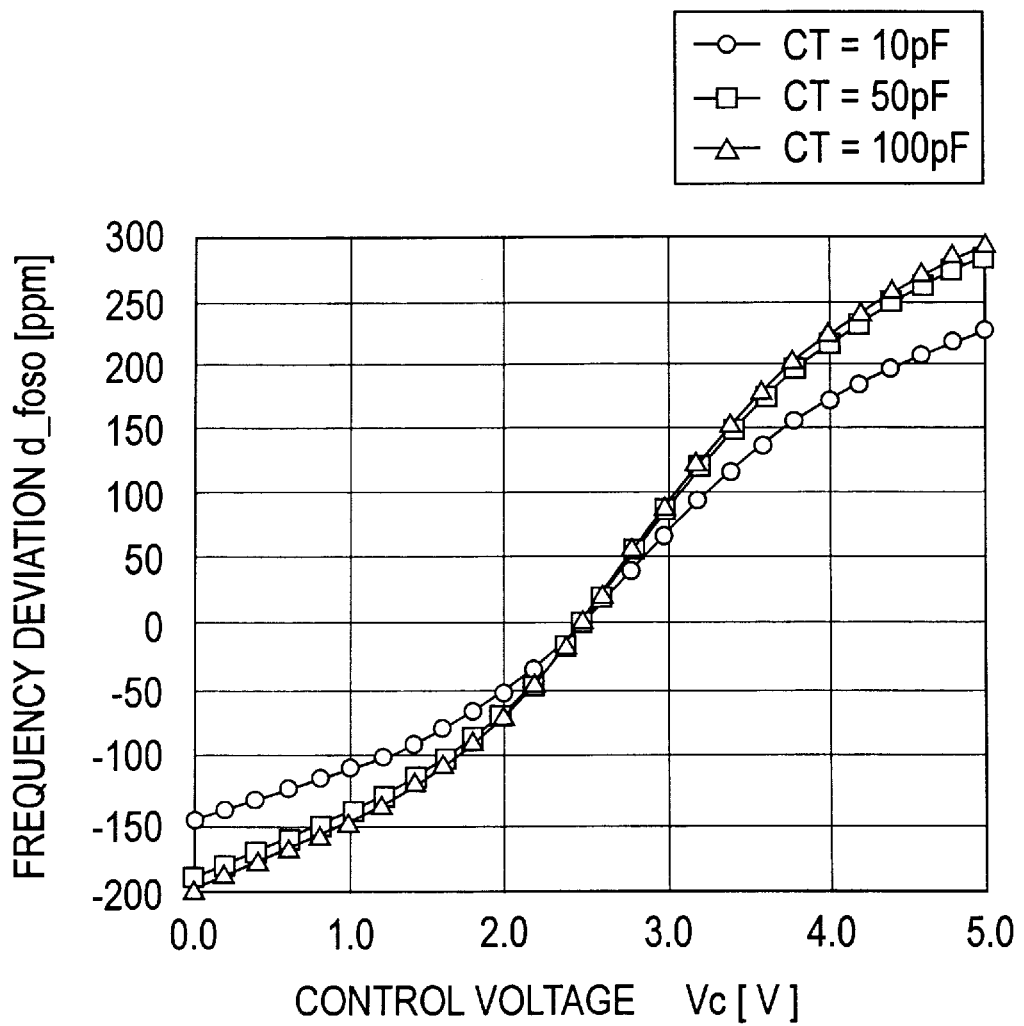
FIG. 25 is an illustration of insufficiency of frequency control characteristic adjustment encountered when the adjustment relies solely upon an oscillation center frequency adjusting capacitor array.

FIG. 25 shows the relationship between the control voltage Vc and the frequency deviation d_fosc as observed when the capacitance of the capacitor array CARY is varied with the use of the above-described commercially-available varicap.

As will be seen from FIG. 25, when the range over which the capacitance CT of the capacitor array CARY is variable is set to be from 10 to 100 [pF], the frequency control characteristic varies by a value which is on the order of 50 [ppm] in response to a change of the capacitance value CT from 10 [pF] to 100 [pF].

Thus, the difference between the frequency control characteristic obtained when the capacitance CT is set to 50 [pF] and that obtained when the capacitance CT is set to 100 [pF] is not so remarkable. It is therefore not reasonable that the responsibility for the adjustment of the frequency control characteristic is borne solely by the capacitor array CARY. From this point of view, the ninth embodiment employs the capacitance array CKARY for adjusting the frequency control characteristic, in addition to the capacitor array CARY that is intended for the adjustment of the oscillation center frequency.

[9.1.2] Configuration of Capacitor Array CKARY

The frequency-control-characteristic adjusting capacitor array CKARY has n pieces of capacitors CKX (X being from 1 to n) and associated switches SKX (X being from 1 to n). Each of the capacitors CKX has one end connectable to the cathode of the varicap Cv and the other end connected to the lower-potential power supply GND, and functions as a selective-connection capacitor that serves to vary the capacitance of the capacitor array CKARY. The switches SKX selectively connect the associated capacitors CKX to the varicap Cv and the base capacitor C0 of the capacitor array CARY.

The capacitors CK1 to CKn may have an equal capacitance value or may have different capacitance values. In the latter case, it is preferred that the capacitance value of each capacitor CKX is set to be $2_X$ times as large as a predetermined base capacitance, in order that the capacitance of the capacitor array CKARY be adjusted over a wide range.

As a consequence, when for example the switches SK1 to SK3 are turned on, the capacitors CK1 to CK3 are connected to the varicap Cv and the base capacitor C0 in parallel therewith, whereby the circuit load capacitance CL is expressed by the following equation (5) in which CT indicates the capacitance of the capacitor array CARY, while Ck indicates the capacitance of the additional capacitor array CKARY.

$$C_L = \cfrac{1}{\cfrac{1}{C_{01}} + \cfrac{1}{C_{02}} + \cfrac{1}{\cfrac{1}{C_V} + \cfrac{1}{C_T}} + C_k} \quad (5)$$

The capacitance Ck is expressed by:

Ck=CK1+CK2+CK3

Therefore, the circuit load capacitance CL is expressed by the following equation (6).

$$C_L = \cfrac{1}{\cfrac{1}{C_{01}} + \cfrac{1}{C_{02}} + \cfrac{1}{\cfrac{1}{\cfrac{1}{C_V} + \cfrac{1}{C_T}} + (C_{k1} + C_{k2} + C_{k3})}} \quad (6)$$

Figure 26:
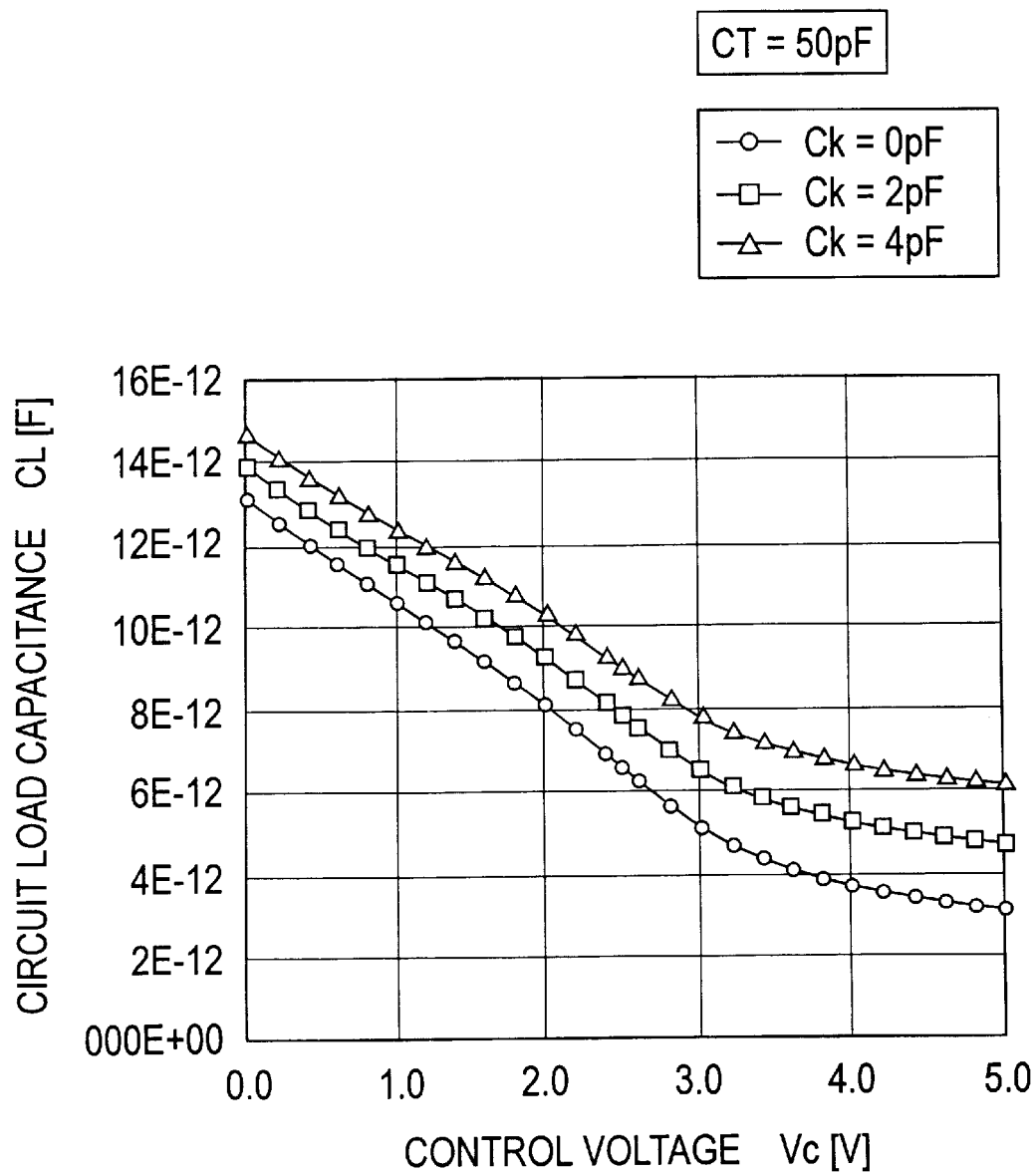
FIG. 26 is an illustration of the principle of operation of the capacitor allay for adjusting the frequency control characteristic.

Thus, as shown in FIG. 26 which shows the values of the circuit load capacitance CL in relation to the control voltage VC, the curve showing the circuit load capacitance can be moved translationally by varying the capacitance Ck of the capacitor array CKARY, thereby making it possible to obtain the desired value of the circuit load capacitance CL.

Figure 13:
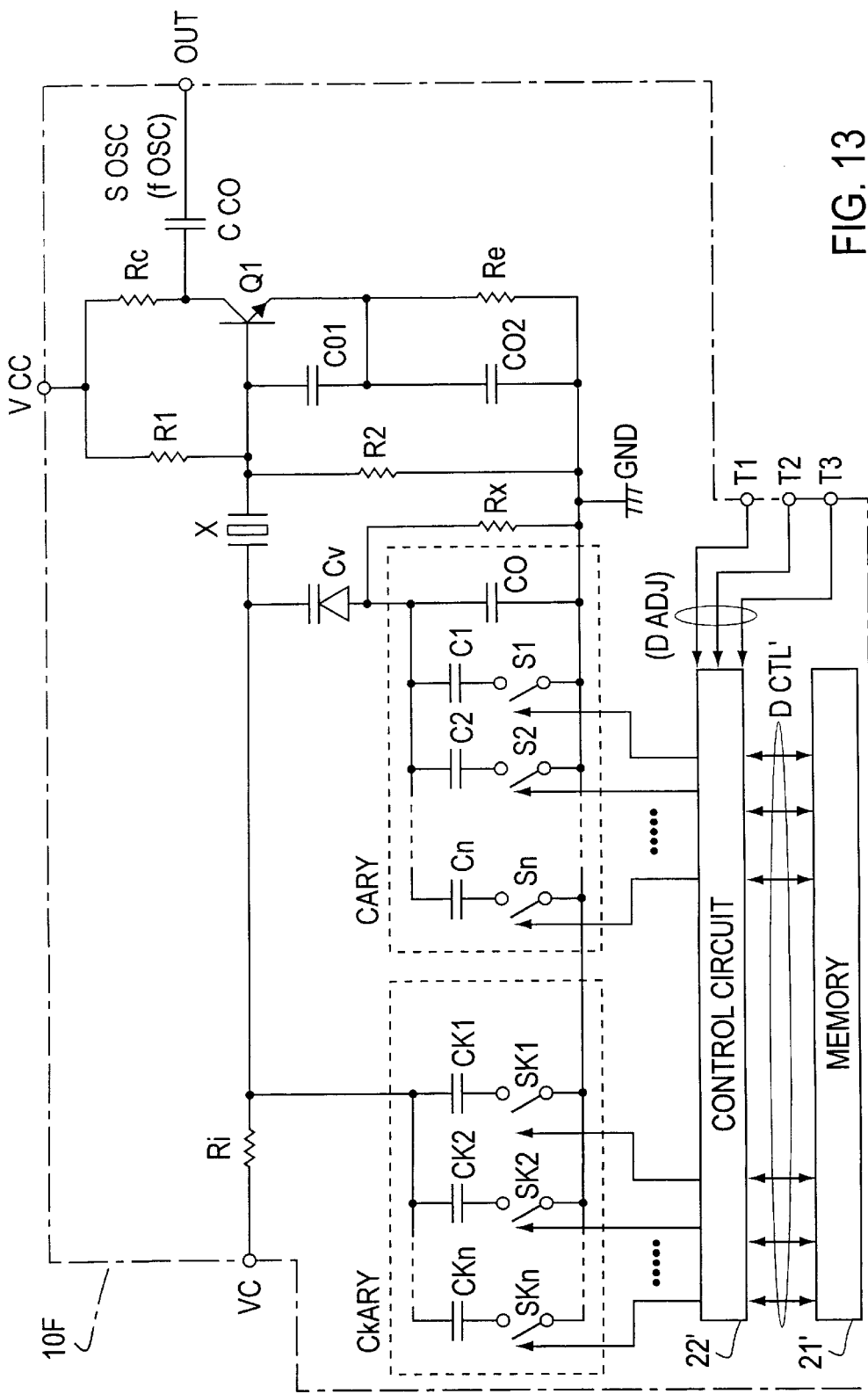
FIG. 13 is a block diagram of a voltage-controlled piezoelectric oscillation circuit in accordance with the ninth embodiment.

[9.1.3] Practical Arrangement of Voltage-controlled Piezoelectric Oscillation Circuit FIG. 13 shows a practical arrangement of the voltage-controlled piezoelectric oscillation circuit, by way of example. In this Figure, reference numerals that are the same as those appearing in FIG. 12 denote the same parts or components as those used in the arrangement shown in FIG. 12, and detailed description is omitted with regard to such parts or components. The practical arrangement of FIG. 13 differs from the basic arrangement shown in FIG. 12 in that it employs a memory 21' and a control circuit 22'. The memory 21 stores connection control data DCTL to be used in the on-off control of the switches S1 to Sn in the capacitor array CARY and the switches SK1 to SKn of the capacitor array CKARY during normal operation of the oscillation circuit. The control circuit 22' has adjusting control data input terminals T1 to T3 which during the adjusting operation receives adjusting digital data DADJ. The control circuit 22' performs the on-off control on the switches S1 to Sn of the capacitor array CARY and the switches SK1 to SKn of the capacitor array CHARY, in accordance with the adjusting digital data DADJ received through the adjusting control data input terminals T1 to T3. When the adjusting operation is completed, the control circuit 22' causes the memory 21' to store the connection control data DCTL. During the normal operation of the voltage-controlled piezoelectric oscillation circuit, the control circuit 22' serves to perform on-off control on the switches S1 to Sn of the capacitor array CARY and the switches SK1 to SKn of the capacitor array CHARY, in accordance with the connection control data DCTL stored in the memory 21'.

The memory 21' and the control circuit 22' in combination constitutes a capacitance array unit control circuit.

When the voltage-controlled piezoelectric oscillation circuit is implemented as an IC, the switches SK1 to SKn may have a variety of forms as listed below, according to the semiconductor process to be used for fabrication.

Figure 14:
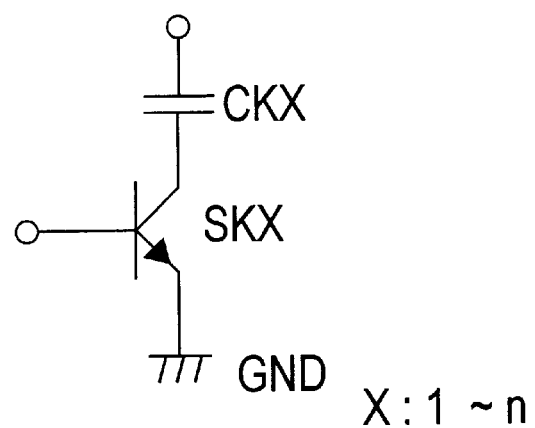
FIG. 14 is an illustration of a capacitor array incorporated in the ninth embodiment and having switches constituted by bipolar transistors.

(1) When a bipolar process is used as the semiconductor process, the switches SK1 to SKn are constructed as bipolar transistors, as shown in FIG. 14.

Figure 15:
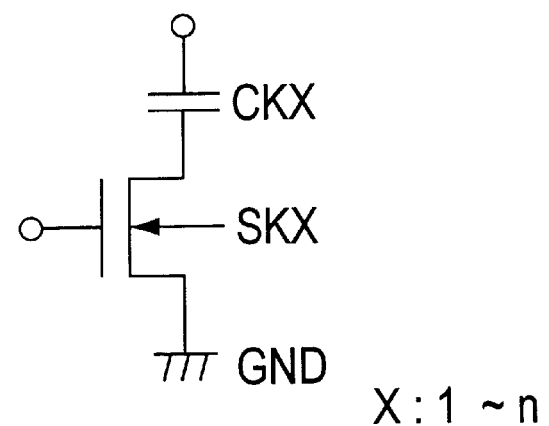
FIG. 15 is an illustration of the capacitor array incorporated in the ninth embodiment and having switches constituted by MOS transistors.

(2) When a CMOS process is used as the semiconductor process, the switches SK1 to SKn are formed as MOS transistors, as shown in FIG. 15.

(3) A Bi-CMOS process is a combination of a bipolar process and a CMOS process and is now widely used as semiconductor process for producing ICs suitable for use in RF range. When the Bi-CMOS process is employed, the switches SK1 to SKn can be implemented either as bipolar transistors shown in FIG. 14 or as MOS transistors shown in FIG. 15.

When reduction in the power consumption is particularly important, it is preferred that the switches SK1 to SKn are implemented by MOS transistors that can be turned on without requiring continuous supply of currents, as discussed before in connection with the first embodiment.

[9.2] Automatic Adjusting System for Adjusting Oscillation Center Frequency f0

[9.2.1] Configuration of the Automatic Adjusting System for Adjusting the Oscillation Center Frequency f0

Figure 16:
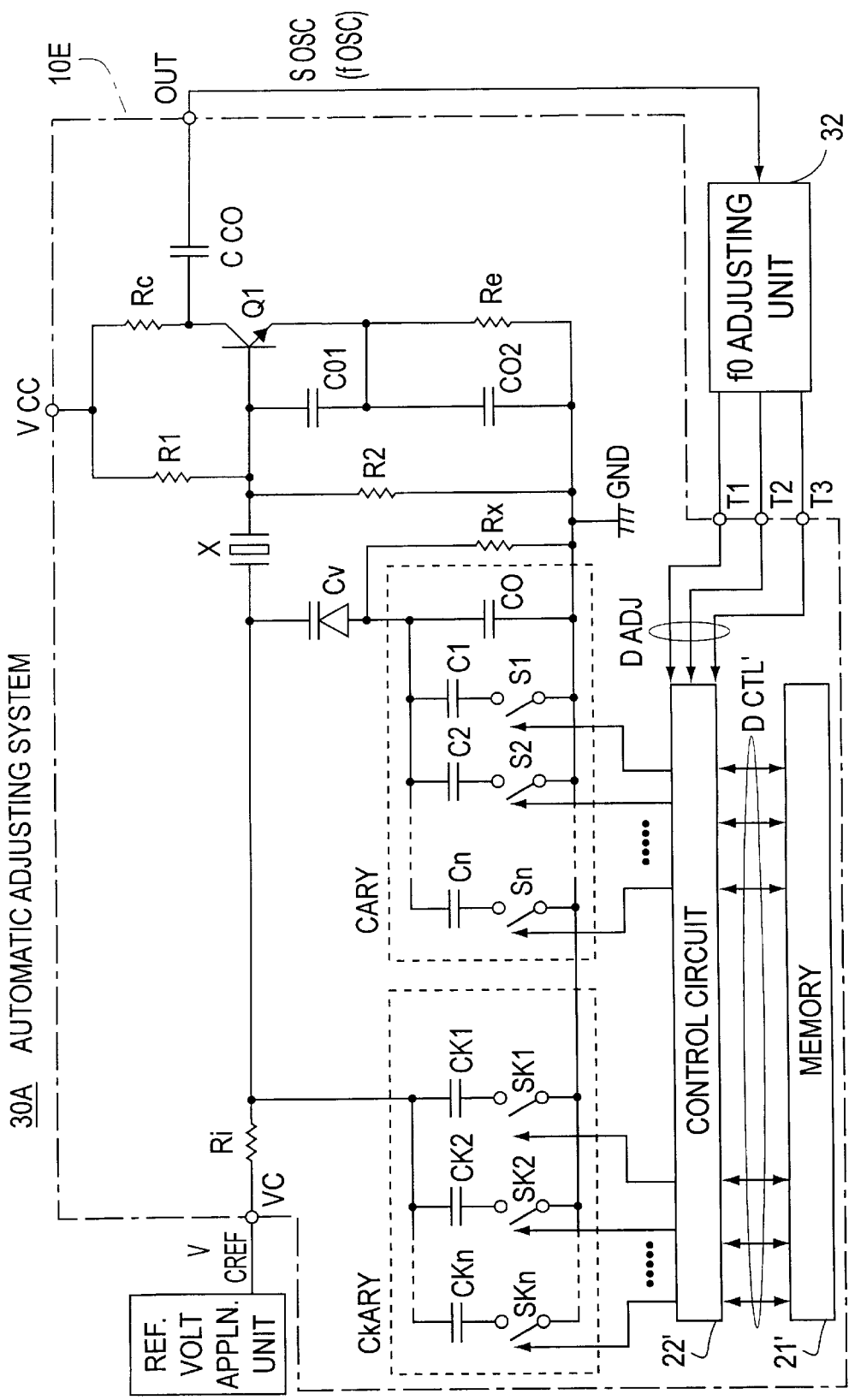
FIG. 16 is a block diagram of an oscillation center frequency adjusting system for use in the ninth embodiment.

FIG. 16 is a block diagram showing the configuration of an automatic adjusting system for adjusting the oscillation center frequency f0 of the voltage-controlled piezoelectric oscillation circuit.

The automatic adjusting system 30A has a reference voltage application unit 31 and an oscillation center frequency (f0) adjusting unit 32. The reference voltage application unit 31 applies to the frequency control terminal VC a calibrated reference control voltage VCREF corresponding to a predetermined reference oscillation center frequency f0REF. The oscillation center frequency (f0) adjusting unit 32 is connected to the output terminal OUT of the voltage-controlled piezoelectric oscillation circuit 10E and detects the oscillation frequency fOSC, which also is referred to as an "oscillation center frequency f0'", of the oscillation signal SOSC that is output from the output terminal OUT when the calibrated reference control voltage VCREF is applied to the frequency control terminal VC. The oscillation center frequency (f0) adjusting unit 32 compares the detected oscillation frequency fOSC with the predetermined reference oscillation frequency f0REF and generates, based on the result of the comparison, the adjusting digital data DADJ to be used in the on-off control of the switches in the capacitor array CARY. The oscillation center frequency (f0) adjusting unit 32 delivers the adjusting digital data DADJ to the voltage-controlled piezoelectric oscillation circuit 10E through the adjusting control data input terminals T1 to T3. The oscillation center frequency (f0) adjusting unit 32 may be implemented by, for example, a personal computer.

[9.2.2] Operation in Adjusting Mode

A description will now be given of the operation performed by the automatic adjusting system 30 for adjusting the oscillation frequency fOSC of the oscillation signal SOSC output through the output terminal OUT.

The reference voltage application unit 31 applies to the frequency control terminal VC the calibrated reference control voltage VCREF corresponding to the predetermined reference oscillation center frequency f0REF.

Simultaneously with the application of the reference control voltage VCREF, the oscillation center frequency (f0) adjusting unit 32 detects the oscillation frequency fOSC, corresponding to the oscillation center frequency f0', of the oscillation signal SOSC output from the output terminal OUT.

The oscillation center frequency (f0) adjusting unit 32 then compares the detected oscillation frequency fOSC with a predetermined reference oscillation center frequency f0REF corresponding to the reference control voltage VCREF.

Then, a computation is performed in accordance with the equation (6) so as to determine the load capacitance CL of the oscillation circuit, such that the difference between the reference oscillation frequency f0REF and the oscillation frequency fOSC is substantially nullified, whereby the adjusting digital data DADJ' to be used in the on-off control of the switches SK1 to SKn in the capacitor array CKARY is obtained. The adjusting digital data DADJ' is supplied to the voltage-controlled piezoelectric oscillation circuit 10E through the adjusting control data input terminals T1 to T3.

The control circuit 22' of the voltage-controlled piezoelectric oscillation circuit 10E performs the on-off control of the switches SK1 to SKn of the capacitor array CKARY, based on the adjusting digital data DADJ' received through the adjusting control data T1 to T3.

The oscillation center frequency adjusting unit 32 again detects the oscillation frequency fOSC of the oscillation signal SOSC output from the output terminal OUT. The oscillation center frequency adjusting unit 32 then compares the detected oscillation frequency fOSC with the predetermined reference oscillation center frequency f0REF corresponding to the reference control voltage VCREF, and repeats the described steps until the difference between the oscillation frequency fOSC and the reference oscillation center frequency f0REF is substantially nullified.

Figure 27:
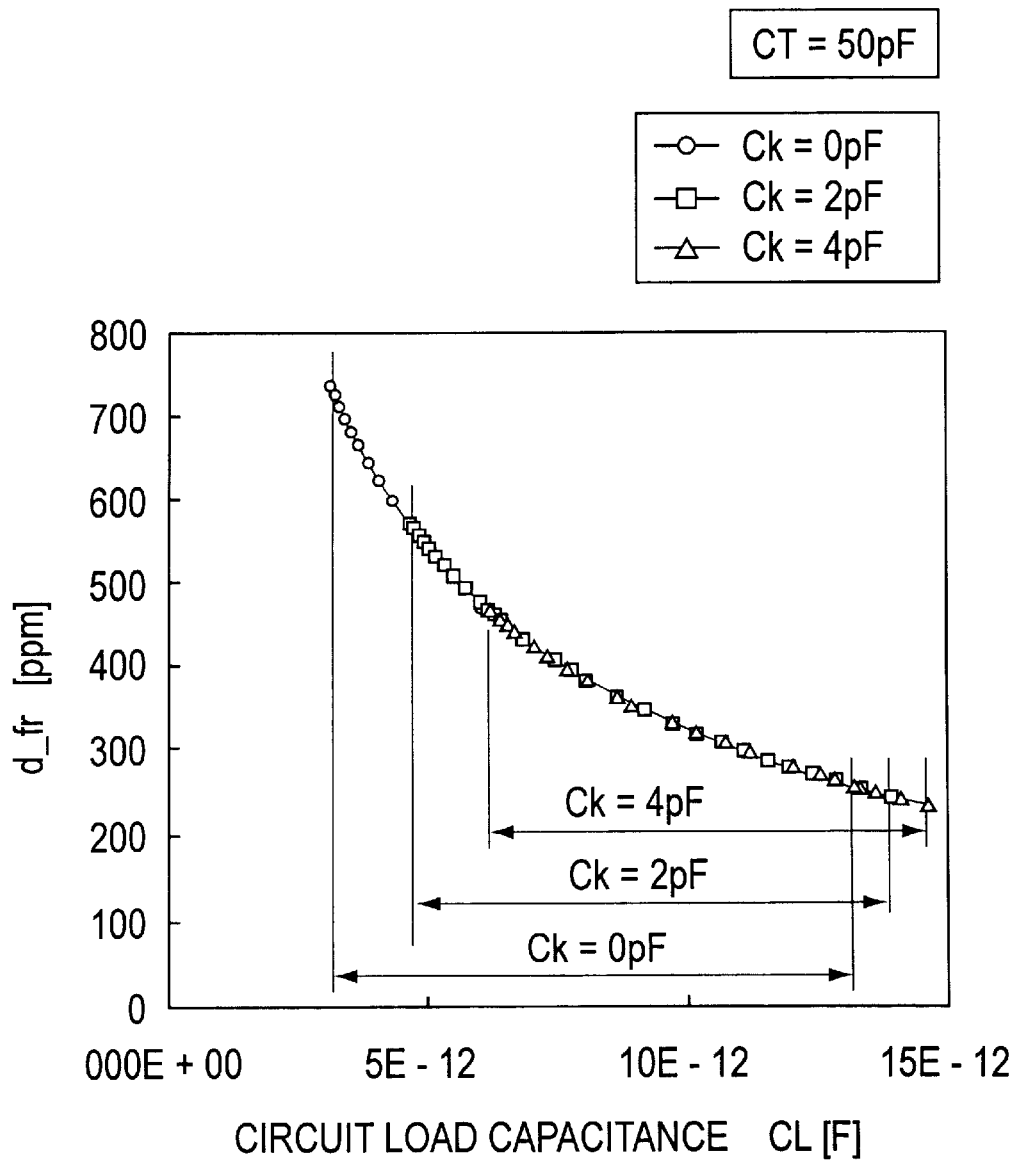
FIG. 27 is an illustration of the relationship between the range over which frequency deviation is variable and the circuit load capacitance CL, as observed when the capacitance CK of the capacitor array CKARY is varied.

FIG. 27 shows the relationship between the circuit load capacitance CL and the range of variation of the frequency deviation as observed when the capacitance Ck of the capacitor array CKARY is changed.

As will be seen from FIG. 27, an increase of the capacitance Ck of the capacitor array CKARY causes a reduction in the range over which the frequency deviation d_fr varies.

Thus, the gradient of the frequency control characteristic (fOSC-VC characteristic) decreases in response to increase in the capacitance Ck of the capacitor array CKRAY.

When the frequency deviation d_fr has become substantially equal to the reference frequency deviation d_frREF, the oscillation center frequency adjusting unit 32 holds the current states of the switches SK1 to SKn of the capacitor array CKARY, and detects the oscillation frequency fOSC (this corresponds to the oscillation center frequency f0') of the oscillation signal SOSC output from the output terminal OUT.

The oscillation center frequency (f0) adjusting unit 32 then compares the detected oscillation frequency fOSC with the predetermined reference oscillation center frequency f0REF corresponding to the reference control voltage VCREF.

Then, a computation is performed in accordance with the equation (4) so as to determine the load capacitance CL of the oscillation circuit, such that the difference between the reference oscillation frequency f0REF and the oscillation frequency fOSC is substantially nullified, whereby the adjusting digital data DADJ to be used in the on-off control of the switches in the capacitor array CARY is obtained. The adjusting digital data DADJ is supplied to the voltage-controlled piezoelectric oscillation circuit 10A through the adjusting control data input terminals T1 to T3.

The control circuit 22 of the voltage-controlled piezoelectric oscillation. circuit 10A performs the on-off control of the switches S1 to Sn of the capacitor array CARY, based on the adjusting digital data DADJ received through the adjusting control data T1 to T3.

The oscillation center frequency adjusting unit 32 again detects the oscillation frequency fOSC, i.e., the oscillation center frequency f0, of the oscillation signal SOSC output from the output terminal OUT. The oscillation center frequency adjusting unit 32 then compares the detected oscillation frequency fOSC with the predetermined reference oscillation center frequency f0REF corresponding to The reference control voltage VCREF, and repeats the described steps until the difference between the oscillation frequency fOSC and the reference oscillation center frequency f0REF is substantially nullified.

The adjusting digital data DADJ is maintained without change for a time not shorter than a predetermined period, when the difference between the oscillation frequency fOSC and the reference center frequency f0REF has been reduced to substantially zero.

Holding of the adjusting digital data DADJ is recognized by the control circuit 22' as being a sign indicating that the automatic adjustment of the adjustment of the oscillation center frequency f0 are finished. The control circuit 22' then causes the memory 21' to store the connection control data DCTL' corresponding to the adjusting digital data DADJ obtained when the adjustment is finished.

The memory 21' holds the connection control data DCTL' until the data is updated by the control circuit 22'.

Figure 28:
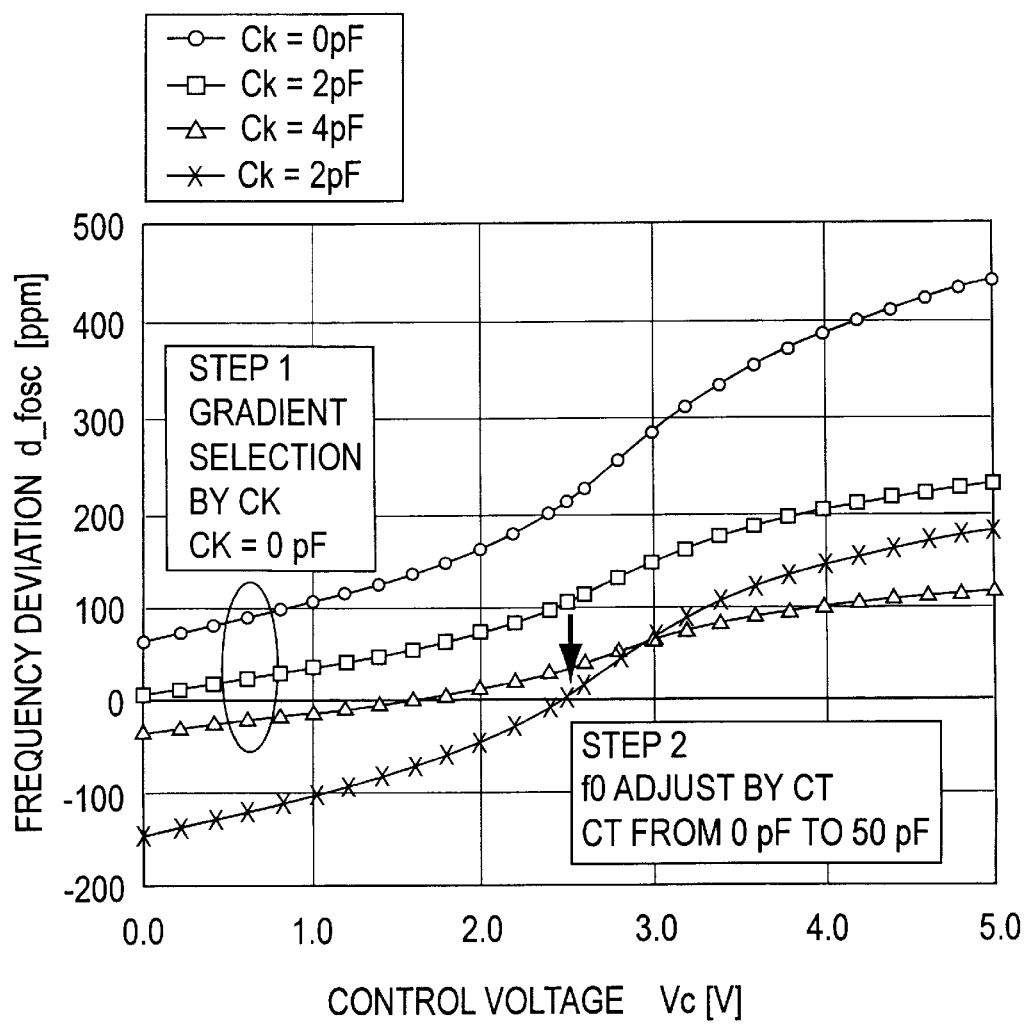
FIG. 28 is an illustration of a practical example of the operation for adjusting the frequency control characteristic and the operation for adjusting the oscillation center frequency.

A more practical explanation will be given as to the adjusting operation, with reference to FIG. 28.

At the beginning of the adjusting operation, the voltage-controlled piezoelectric oscillation circuit exhibits the control voltage VC versus frequency deviation d_fosc characteristic that is obtained when the capacitance CK of the capacitor array CKARY is zero [pF] and the capacitance CT pF the capacitor array CARY is also zero [pF]. Then, adjusting operation is commenced by increasing the capacitance CK of the capacitor array CKARY from 0 [pF] to 2 [pF] and then to 4 [pF] and so on, thus determining the capacitance CK that provides the best control voltage VC versus frequency deviation d_fosc characteristic. It is assumed here that the best control voltage VC versus frequency deviation d_fosc characteristic is obtained when the capacitance CK of the capacitor array CKARY is 2 [pF].

Then, while the capacitance CK of the capacitor array CKARY is held at 2 [pF], the capacitance CT of the capacitor array CARY is adjusted so as to fOSC=fOREF, thus determining the capacitance CT that provides the best control voltage VC versus frequency deviation d-fosc characteristic. It is assumed here that the best control voltage VC versus frequency deviation d_fosc characteristic is obtained when the capacitance CT of the capacitor array CARY is 50 [pF]. The adjusting digital data DADJ corresponding to this optimum state is held over a predetermined period and is then stored in the memory 21'.

In the described operation, the control circuit 22' itself detects the completion of the automatic adjustment and causes the memory 21' to store the connection control data DCTL' that corresponds to the adjusting digital data DADJ obtained when the adjustment is finished. This, however, is only illustrative and the arrangement may be such that information indicating the completion of the adjustment is included in the adjusting data DADJ and such adjusting data DADJ is delivered from the oscillation frequency adjusting unit 32 to the control circuit 22', so that the control circuit 22', upon receipt of the data, operates to cause the memory 21' to store the connection control data DCTL' corresponding to the adjusting digital data DADJ.

Figure 29:
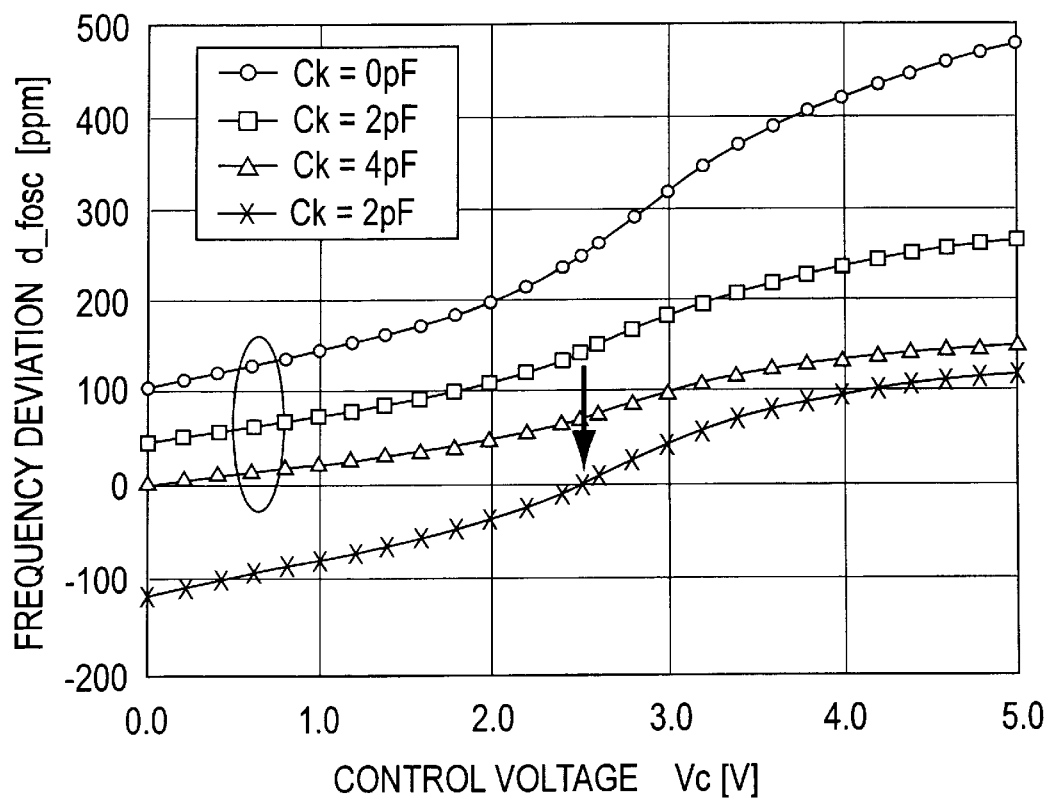
FIG. 29 is an illustration of another practical example of the operation for adjusting the frequency control characteristic and the operation for adjusting the oscillation center frequency.

In the foregoing description, the adjustment of the capacitance CK of the capacitor array CKARY is conducted first, followed by the adjustment of the capacitance CT of the capacitor array CARY. The process, however, may be such that combinations of the capacitance CK of the capacitor array CKARY and the capacitance CT of the capacitor array CARY are sequentially selected to permit simultaneous or concurrent adjustment of both capacitances CK and CT, as will be seen from FIG. 29. More specifically, referring to FIG. 29, the capacitance CT of the capacitor array CARY is changed from 10 [pF] to 50 [pF] and then to 100 [pF] and so on, while the capacitance CK of the capacitor array CKARY is fixed to 0 [pF]. In the next step, while the capacitance CK of the capacitor array CKARY is set to 2 [pF], the capacitance CT of the capacitor array CARY is changed from 10 [pF] to 50 [pF] and then to 100 [pF] and so on. Likewise, in the next step, the capacitance CT of the capacitor array CARY is changed from 10 [pF] to 50 [pF] and then to 100 [pF] and so on, while the capacitance CK of the capacitor array CKARY is fixed at 4 [pF]. If the best result is obtained with the combination of the capacitance CK of the capacitor array CKARY being 4 pF and the capacitance CT of the capacitor array CARY being 10 [pF], such a combination is determined as being the best combination.

[9.3] Operation of the Voltage-controlled Piezoelectric Oscillation Circuit 10F in Normal Oscillation Mode A description will be given of the normal oscillating operation of the voltage-controlled piezoelectric oscillation circuit 10F, with specific reference to FIG. 13.

When the power supply is turned on, the control circuit 22' of the voltage-controlled piezoelectric oscillation circuit 10E operates so as to temporarily turn on (close) all the switches S1 to Sn of the capacitor array CARY and all the switches SK1 to SKn of the capacitor array CKARY.

This operation is intended to allow electrical current to rush from the high-potential power supply VCC to the low-potential power supply GND so as to quickly supply vibration energy to the piezoelectric resonator, thereby quickly settling the oscillation frequency fOSC of the oscillation signal SOSC which is output from the output terminal OUT of the voltage-controlled piezoelectric oscillation circuit 10F.

Therefore, the temporal closing of all the switches S1 to Sn of the capacitor array CARY and all the switches SK1 to SKn of the capacitor array CKARY in response to turning on of the power supply is not needed, if such a quick settling of the oscillation frequency fOSC is not required.

After elapse of a predetermined time, the control circuit 22' reads control data DCTL' from the memory 21' and turns on only the switches SX and SKX corresponding to the connection control data DCTL', while keeping other switches off (open).

Consequently, an oscillation signal SOSC is derived from the output terminal OUT, having the oscillation frequency fOSC corresponding to the control voltage Vc and centered at the adjusted oscillation center frequency f0, with a predetermined gradient with respect to the control voltage.

[9.4] Advantages of the Ninth Embodiment

The ninth embodiment provides an advantage in that the frequency control characteristic can be varied regardless of the capacitance of the capacitor array CARY, in addition to the advantage offered by the first embodiment.

Figure 30A:
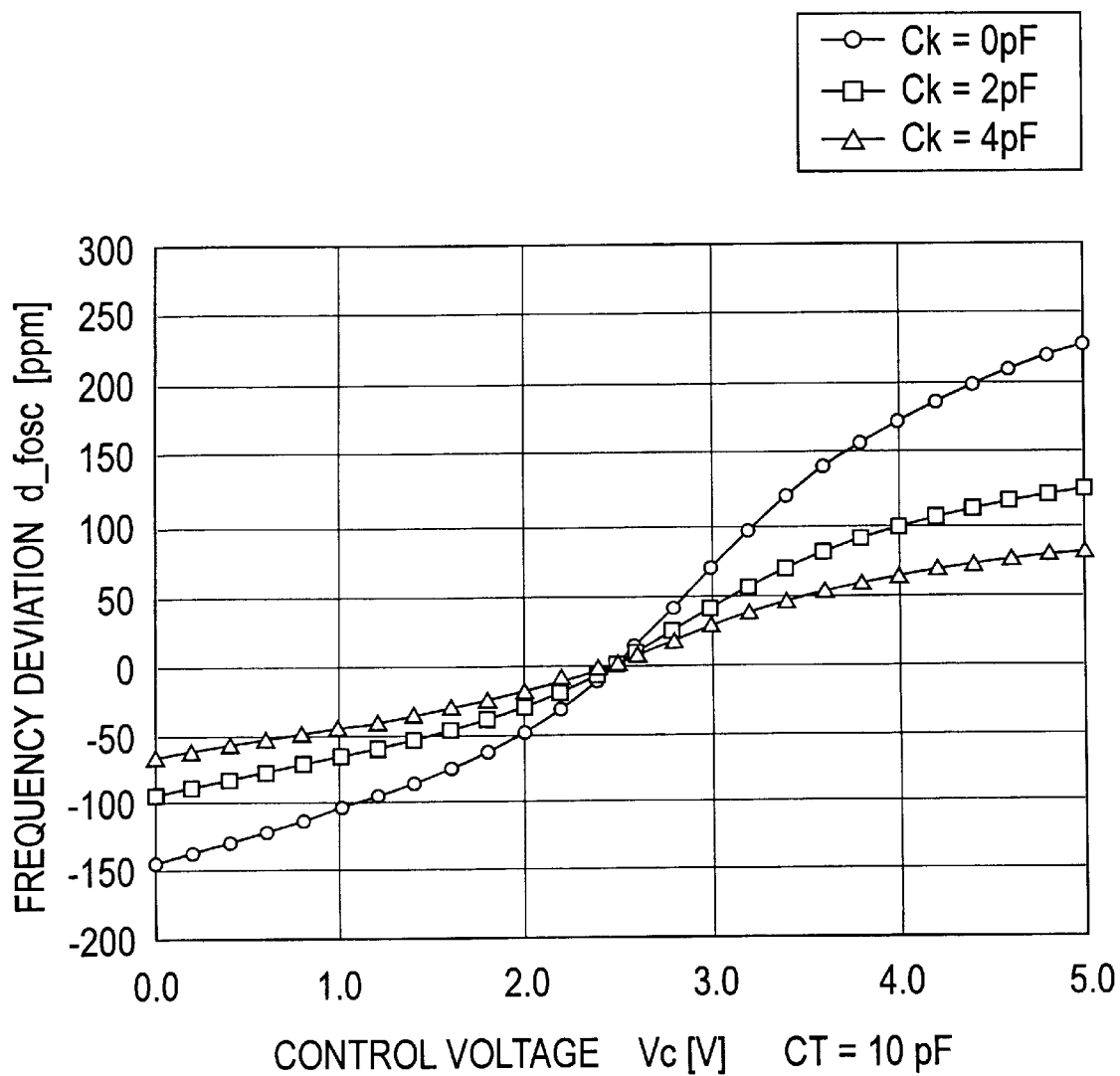
FIGS. 30(a)–30(c) are illustrations explanatory of the advantages of the ninth embodiment.
Figure 30B:
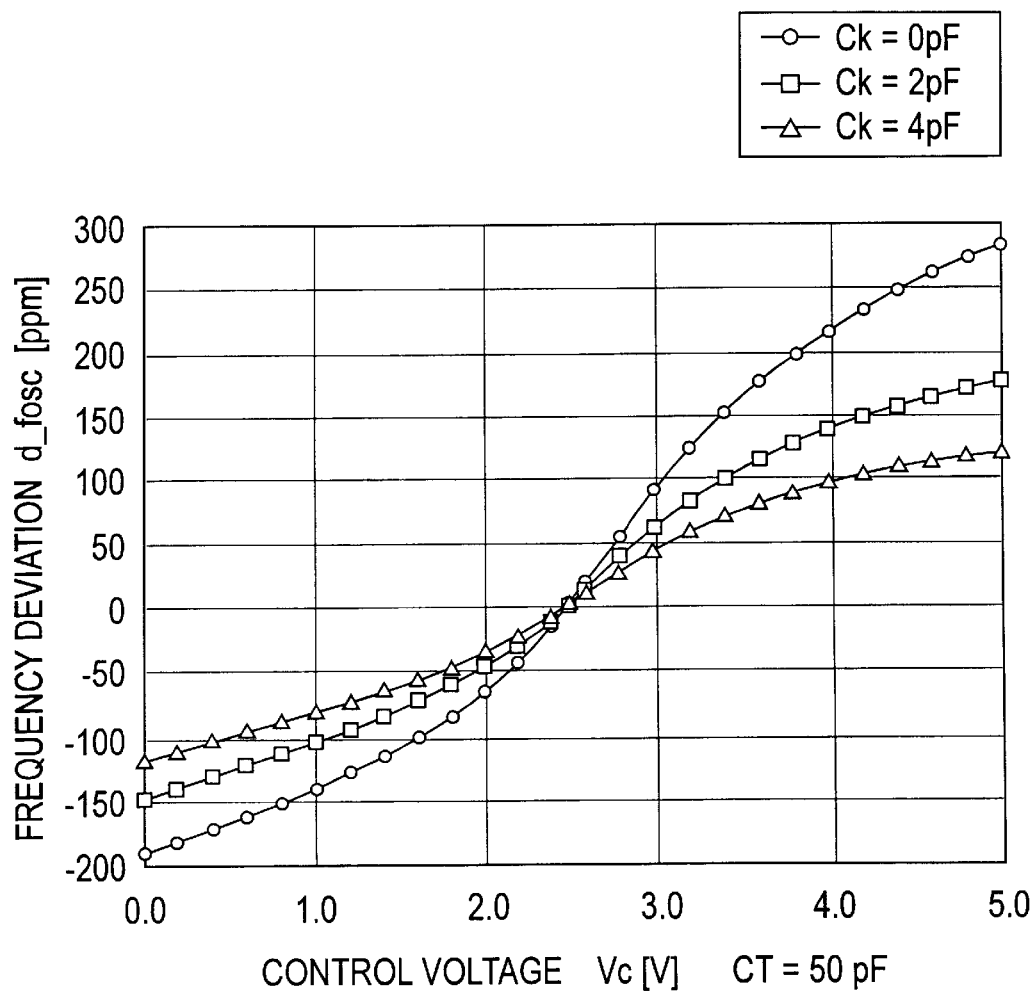
Figure 30C:
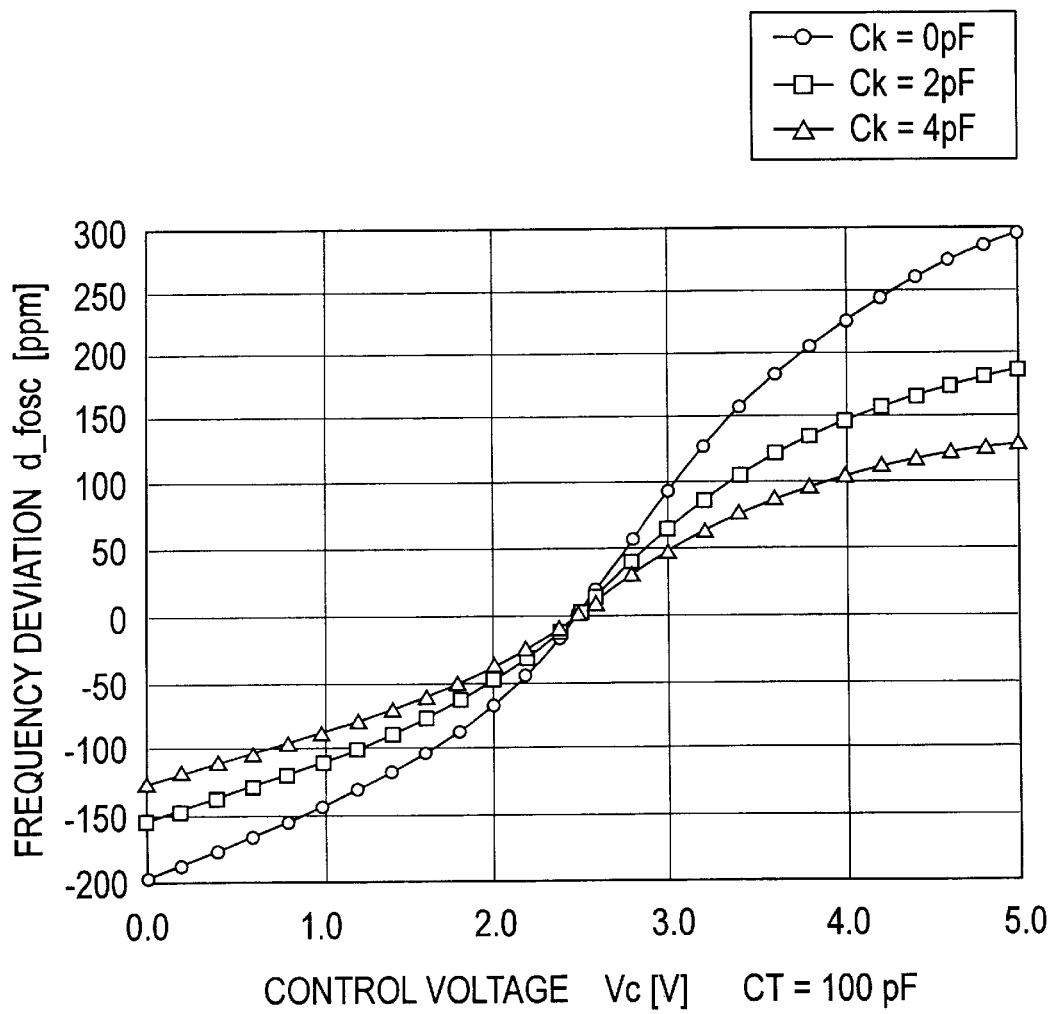
Figure 31:
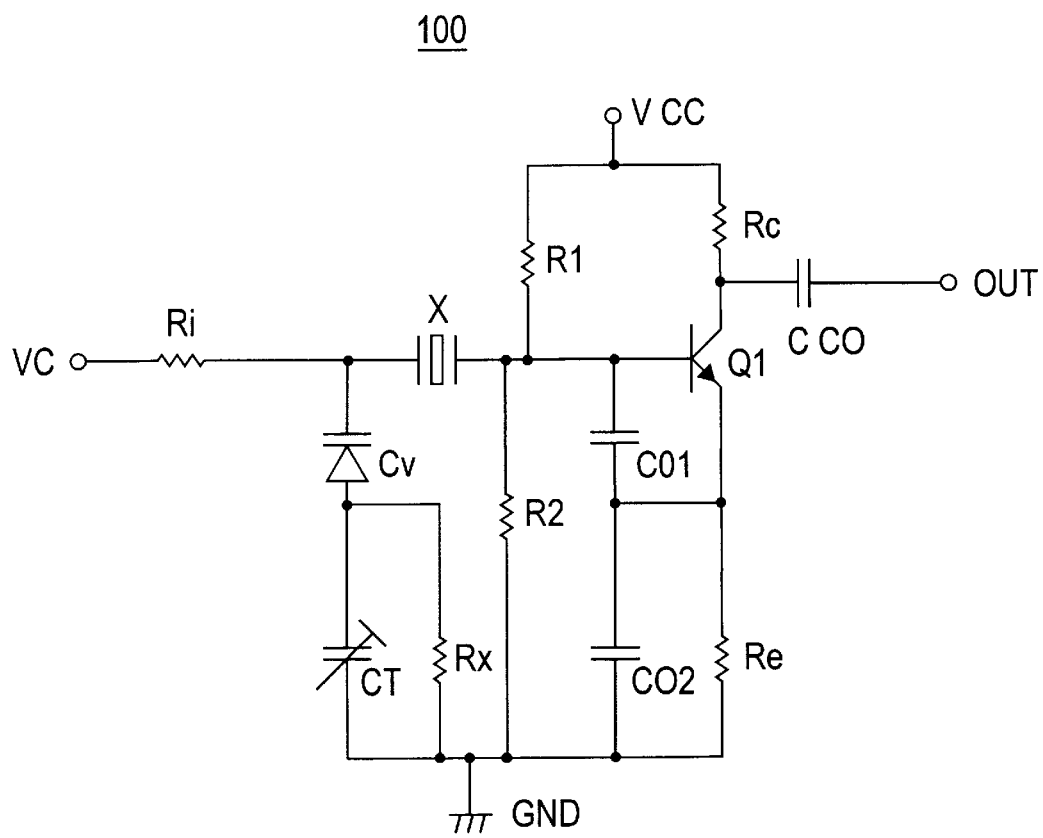
FIG. 31 is a block diagram of a first type of conventional voltage-controlled piezoelectric oscillation circuit.
Figure 32:
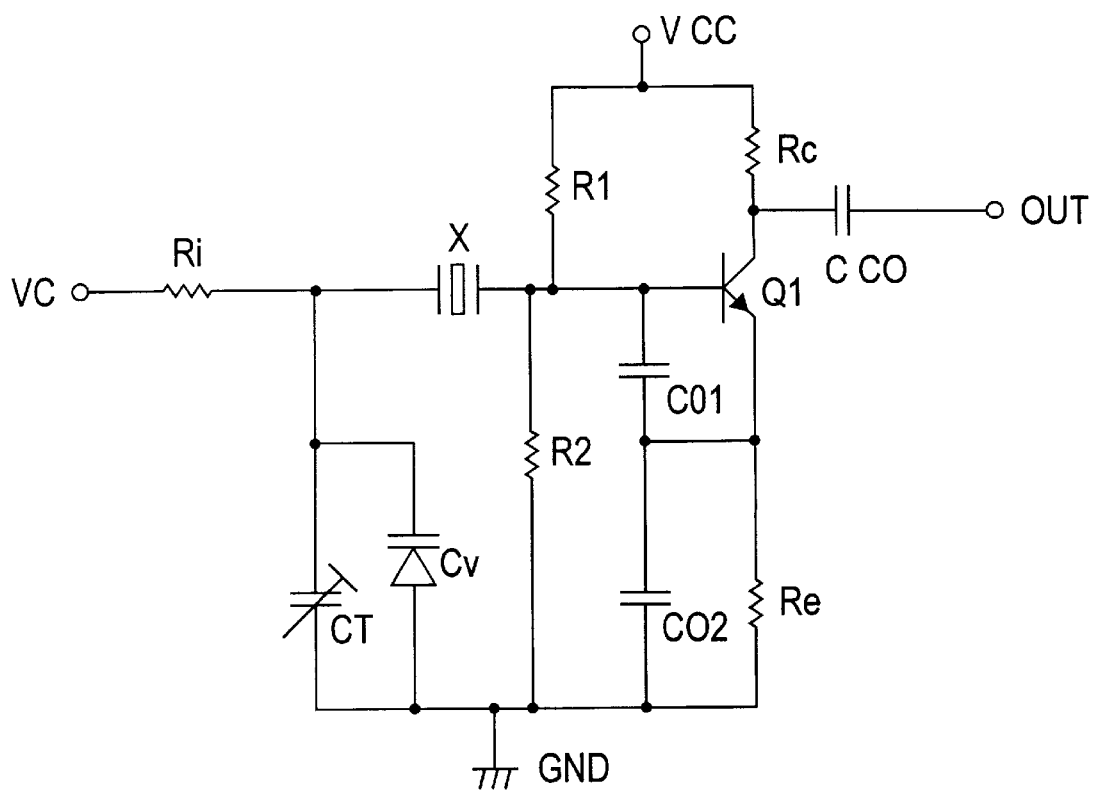
FIG. 32 is a block diagram of a second type of conventional voltage-controlled piezoelectric oscillation circuit.
Figure 33:
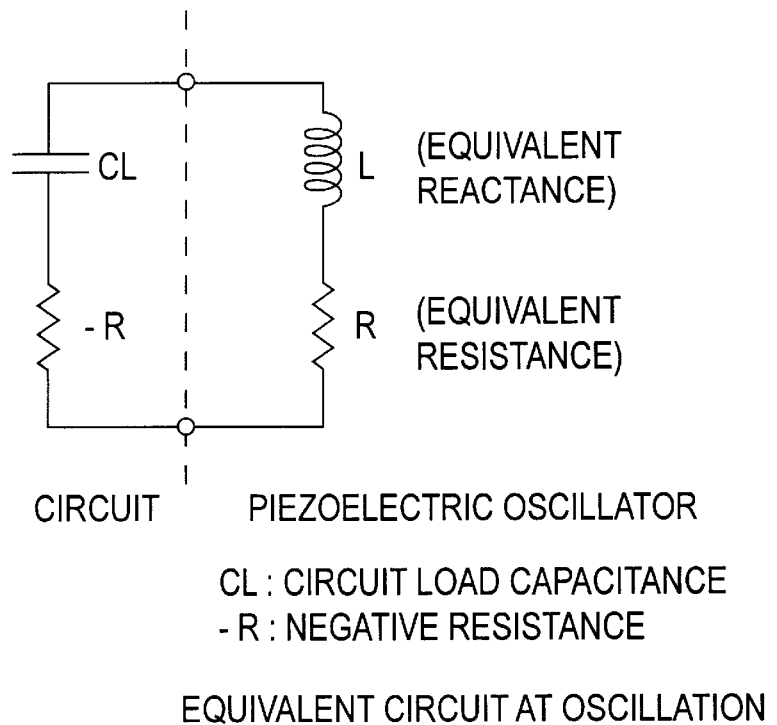
FIG. 33 is a circuit equivalent to the first type of conventional voltage-controlled piezoelectric oscillation circuit in oscillation mode.
Figure 34:
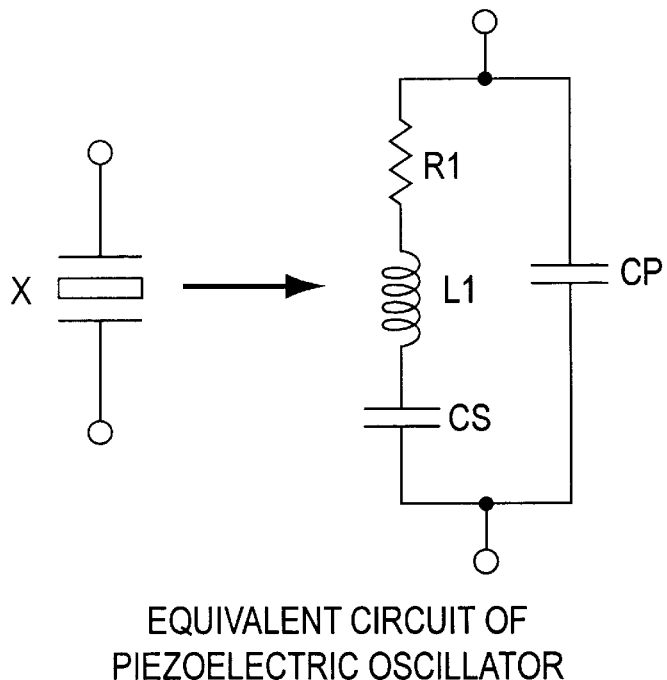
FIG. 34 is an equivalent circuit of a piezoelectric resonator.
Figure 35:
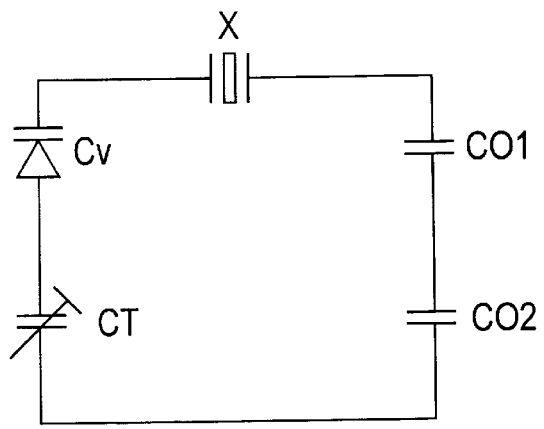
FIG. 35 is an illustration of a manner in which various capacitors are connected in the first type of conventional arrangement.
Figure 36:
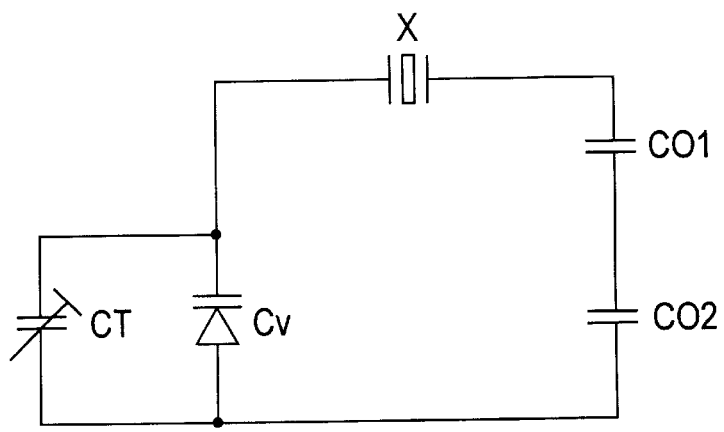
FIG. 36 is an illustration of a manner in which various capacitors are corrected in the first type of conventional arrangement.
Figure 37:
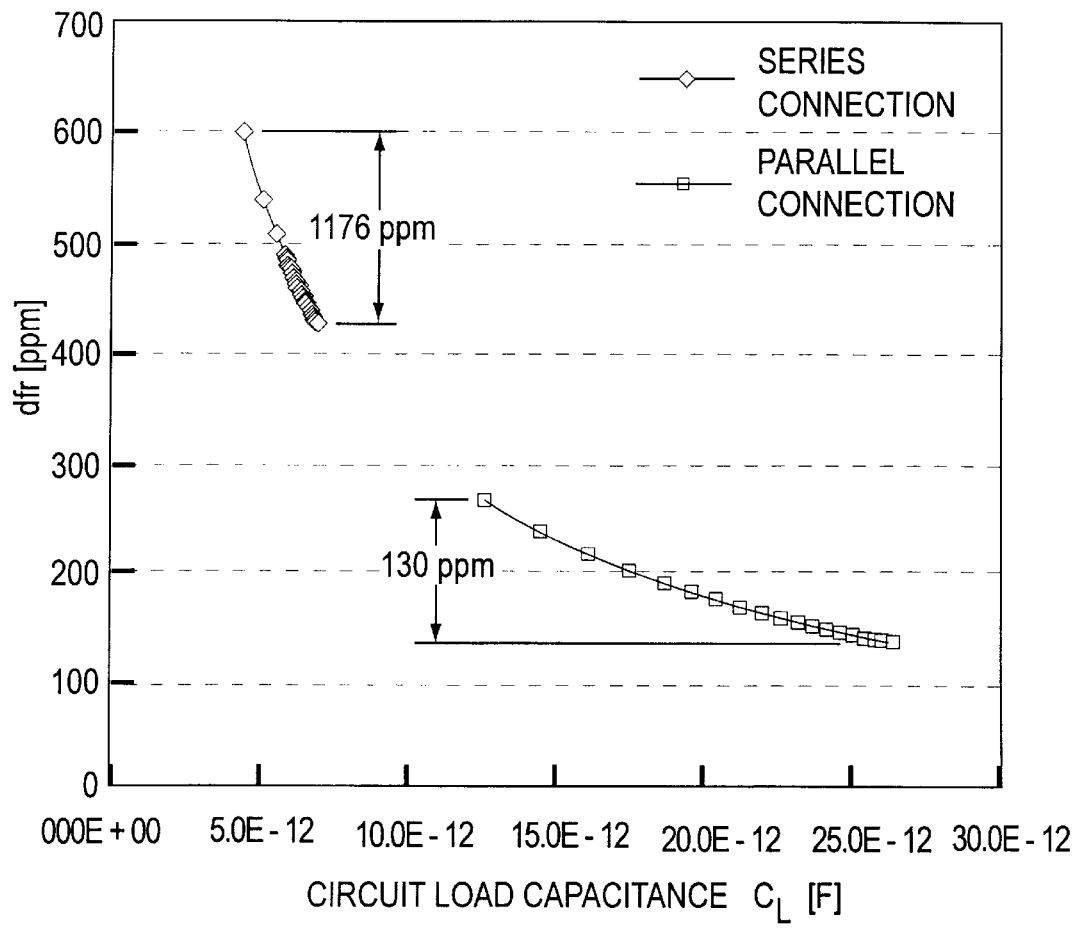
FIG. 37 is a chart showing dfr-CL characteristic in relation to the position of connection of a trimmer capacitor to a varicap.
Figure 38:
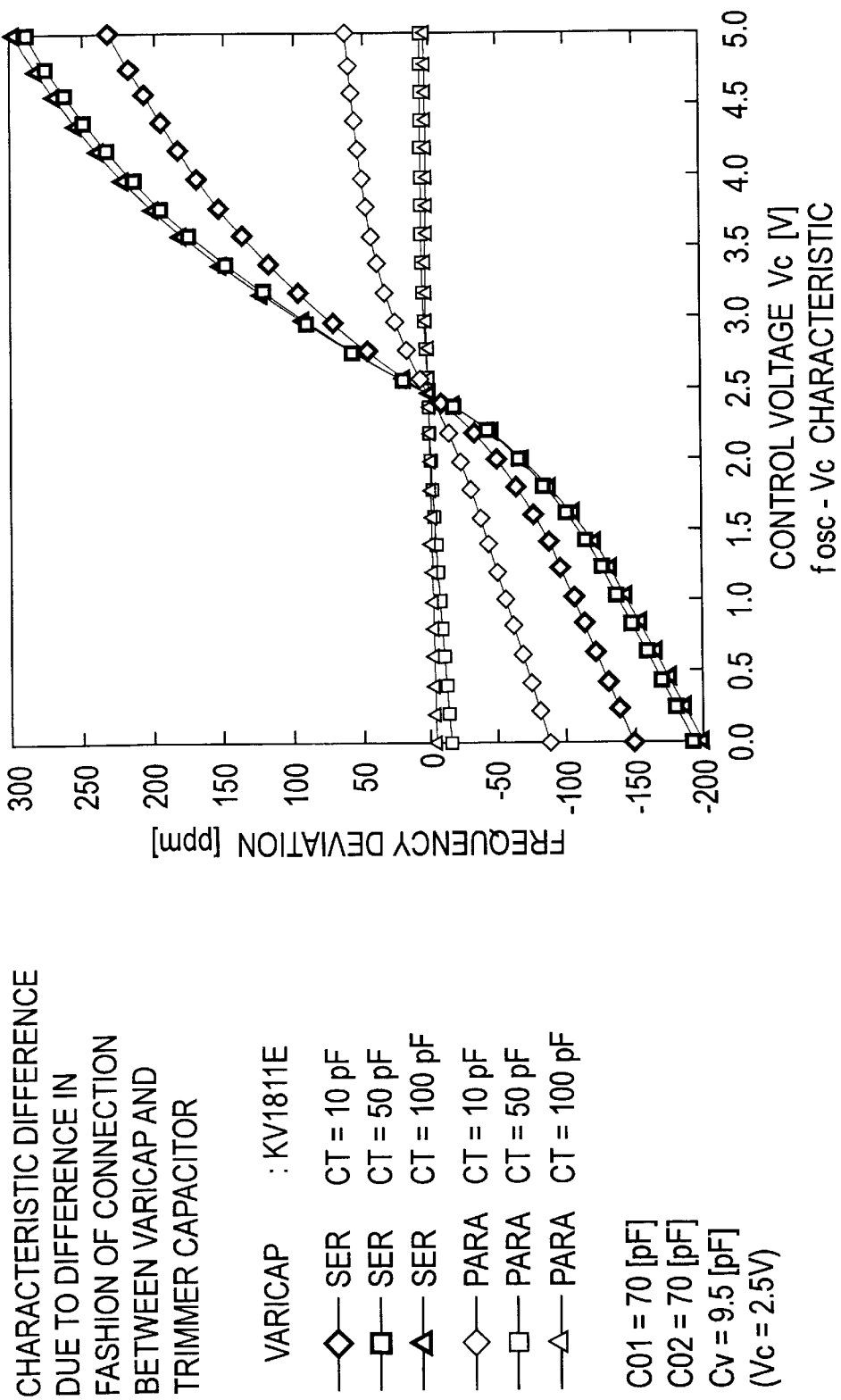
FIG. 38 is an illustration of the fOSC-VC characteristic.
Figure 39:
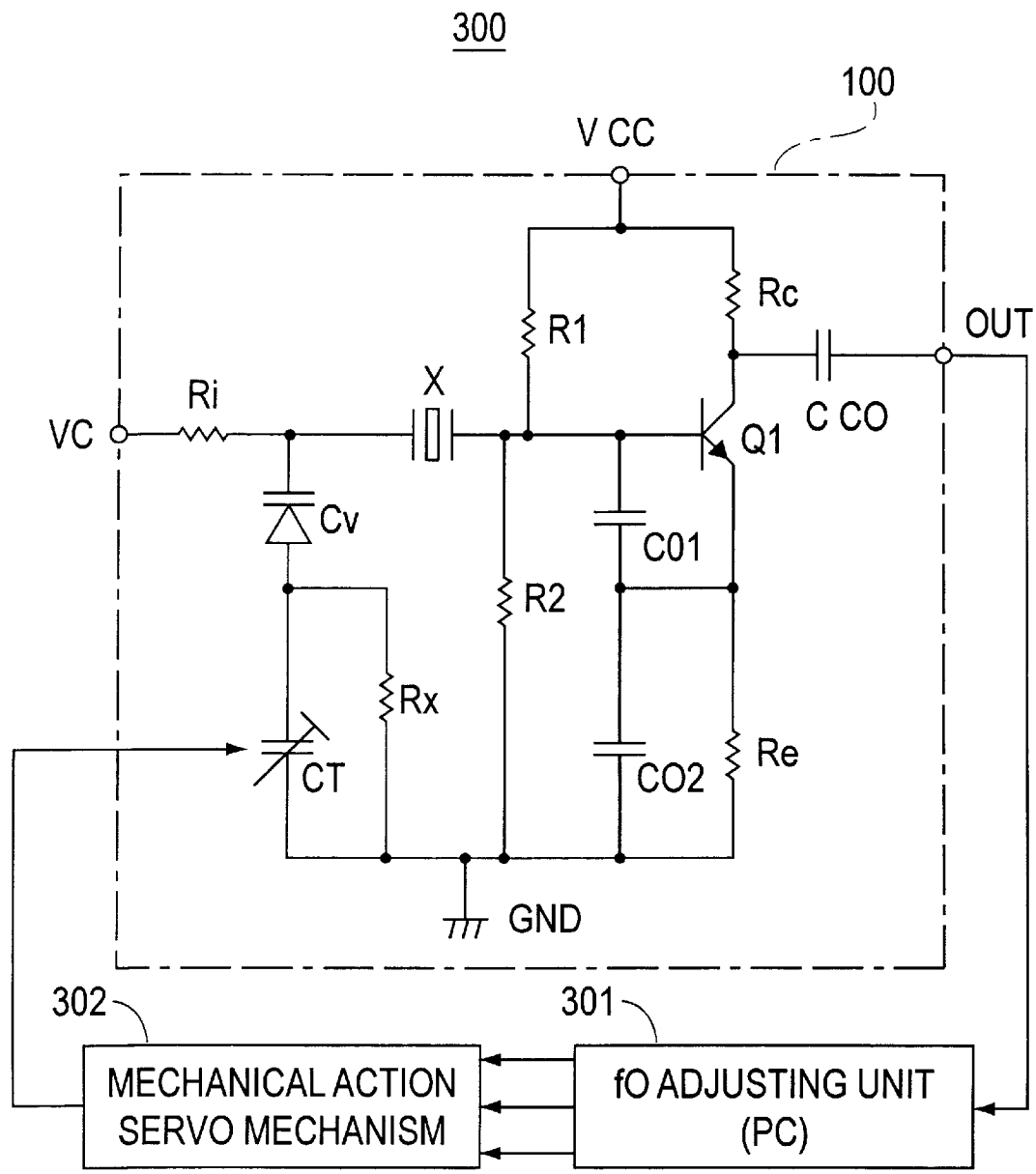
FIG. 39 is a block diagram of a conventional oscillation center frequency adjusting system.

More specifically, a reference be made to FIGS. 30(*a*) to 30(*c*).

FIG. 30(a) shows the frequency control characteristic as obtained when the capacitance CT of the capacitor array CARY is 10 [pF]. Similarly, FIG. 30(b) shows the frequency control characteristic as obtained when the capacitance CT of the capacitor array CARY is 50 [pF]. Likewise, FIG. 30(b) shows the frequency control characteristic as obtained when the capacitance CT of the capacitor array CARY is 100 [pF].

It will be seen that the frequency control characteristic is variable regardless of the capacitance of the capacitor array CARY.

In addition, the frequency control characteristic is significantly variable even with a small change of the capacitance of the capacitor array CKARY, e.g., from 0 to 4 [pF]. Further, the capacitor array CKARY when packaged in an IC occupies only a small area, thus contributing to reduction in the size of the IC package.

[9.5] Modifications of the Ninth Embodiment

In the ninth embodiment as described, the piezoelectric resonator X and the varicap Cv are constructed as discrete parts. This, however, is not exclusive, and the arrangement may be such that the piezoelectric resonator X and the varicap Cv are connected in series and resin-sealed or packaged in a single package, so that the assembly process for assembling the voltage-controlled oscillator can be simplified.

While in the described ninth embodiment the base capacitor C0 is incorporated as a part of the capacitor array CARY, the base capacitor C0 may be excluded from the capacitor array CARY: namely, a capacitor array CARY' may be formed of the capacitors C1 to Cn and the switches S1 to Sn, without including the base capacitor. Such a capacitor array CARY' may be integrated with the memory 21' and the control circuit 22' so as to form an IC which is attached to the oscillation circuit as an external part.

The arrangement also may be such that the capacitor array CARY or CARY' alone is constructed as an IC which forms an external part to be connected to the oscillation circuit. Such an arrangement makes it possible to design and obtain voltage-controlled piezoelectric resonators of a wide variety of fOSC-Vc characteristics, simply by preparing a new capacitor array CARY'.

In the ninth embodiment as described, the switches S1 to Sn of the capacitor array CARY are implemented by transistors. However, these switches may be formed of fuse switches, if the requirement for the precision of oscillation frequency is not so strict. In such a case, the switches are permanently kept opened upon completion of the adjustment.

Also, in this modifications, the capacitor array CKARY is able to be adopted instead of the capacitor array CARY.

[10] Tenth Embodiment

Figure 17:
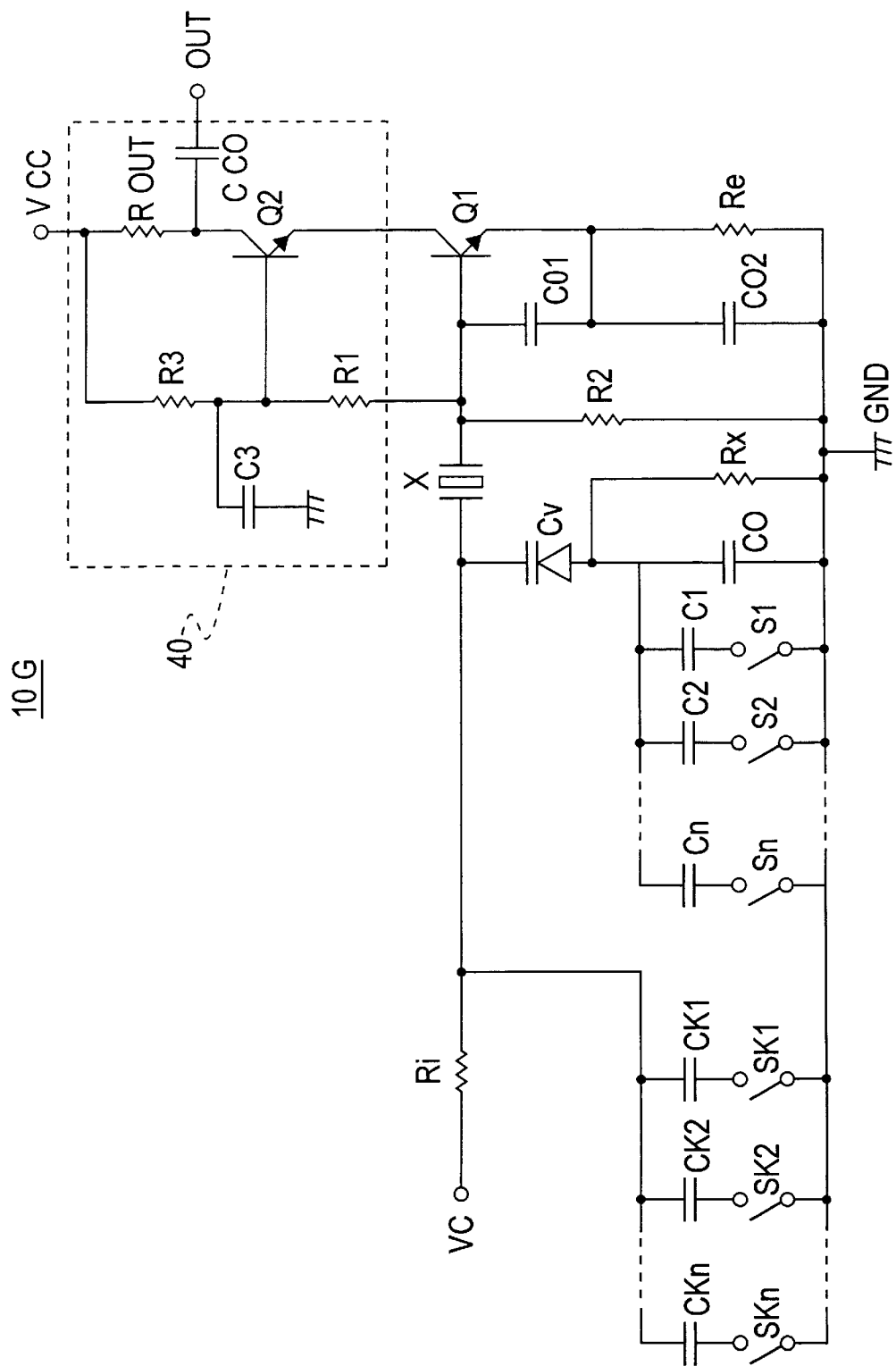
FIG. 17 is a block diagram of a voltage-controlled piezoelectric oscillation circuit in accordance with a tenth embodiment.

FIG. 17 shows the principle and basic construction of a voltage-controlled piezoelectric oscillation circuit in accordance with the tenth embodiment of the present invention.

The voltage-controlled piezoelectric oscillation circuit, denoted by 10G, differs from the voltage-controlled piezoelectric oscillation circuit 10 of the ninth embodiment in that a buffer circuit 40 is provided in the output stage of the oscillation circuit, so as to form a cascade oscillation circuit that is less liable to be affected by the load on a circuit connected to the output terminal OUT of the oscillation circuit. Capacitor arrays CARY and CKARY which may be the same as that used in the ninth embodiment is connected to this cascade oscillation circuit.

This embodiment offers the same advantages as those brought about by the ninth embodiment. In addition, RF frequency characteristic of the oscillation circuit can be improved over the first embodiment.

[11] Eleventh Embodiment

Figure 18:
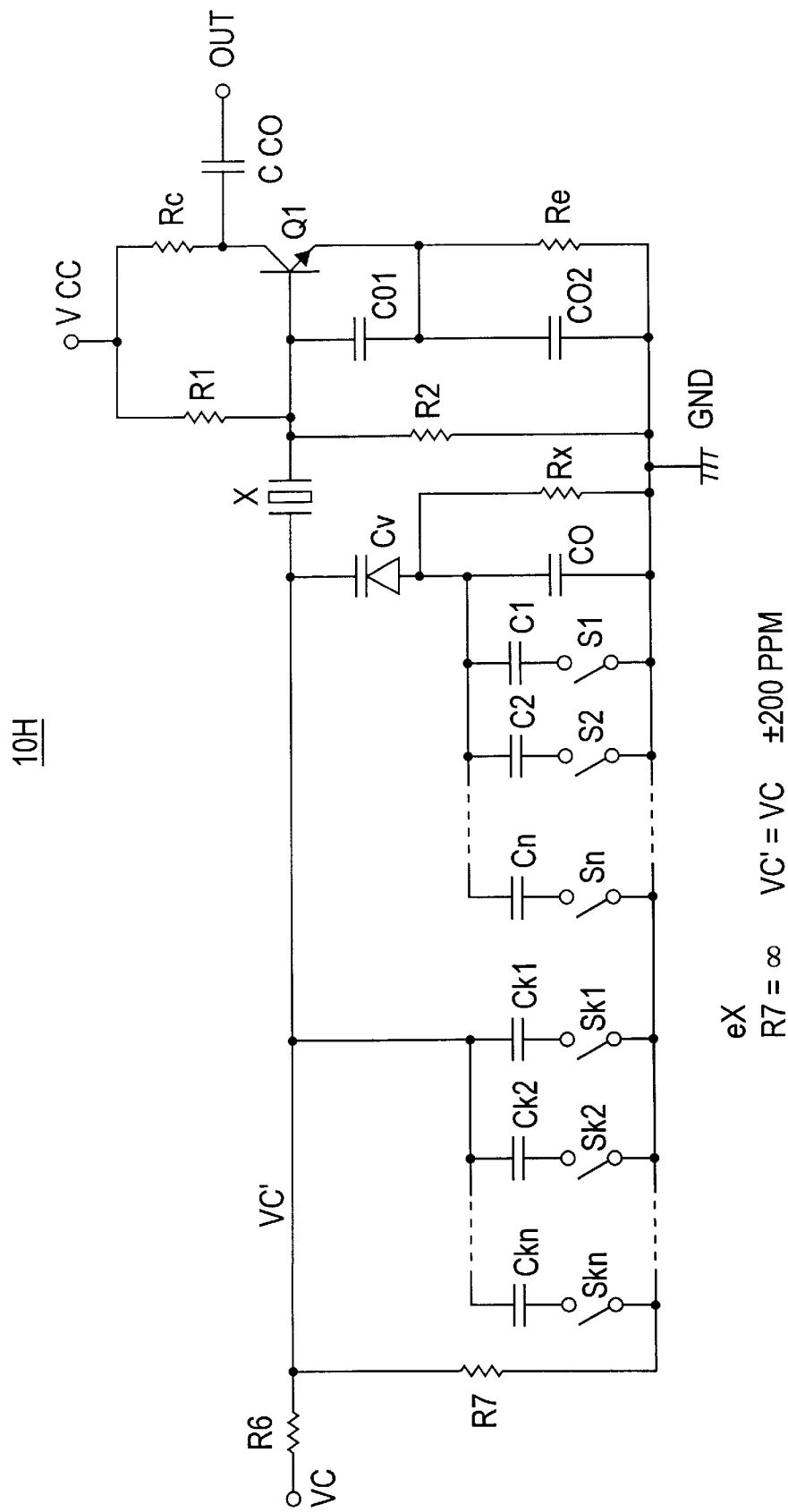
FIG. 18 is a block diagram of a voltage-controlled piezoelectric oscillation circuit in accordance with an eleventh embodiment.

FIG. 18 shows the principle and basic construction of a voltage-controlled piezoelectric oscillation circuit in accordance with the eleventh embodiment of the present invention.

The voltage-controlled piezoelectric oscillation circuit, denoted by 10H, differs from the voltage-controlled piezoelectric oscillation circuit of the ninth embodiment in that a first voltage dividing resistor R6 is connected between the control voltage input terminal VC and the piezoelectric resonator X, and in that a second voltage dividing resistor R7 is employed with its one end connected to a node between the first voltage dividing resistor R6 and the piezoelectric resonator X and the other end connected to the lower-potential power supply. The resistance values of the first and second voltage dividing resistors R6 and R7 are suitably selected so as to enable control of the actual control voltage VC' which is the actual value of the control voltage VC applied to the control voltage terminal VC, thus enabling a change of the range over which the oscillation frequency is adjustable.

For instance, it is assumed here that the resistance value of the second voltage dividing resistor R7 is infinitive (8), i.e., the second voltage dividing resistor R7 is disconnected. In such a case, the actually applied control voltage VC' equals to VC: namely, the following condition is established:

$$VC'=VC$$

It is also assumed that the frequency is variable over the range of ±200 [ppm] in this state.

If the resistance value of the second potential dividing resistor R7 is set to be the same as that of the first voltage dividing resistor R6, i.e., when the condition expressed by $$R7=R6$$

exists, the actually applied control voltage VC' can be expressed as follows with respect to the control voltage VC:

$$VC'=\tfrac{1}{2}VC$$

Consequently, the range over which the frequency is variable is determined to be ±100 [ppm].

Thus, the eleventh embodiment offers an advantage to enable variation of the range of the fOSC-VC characteristic, in addition to the advantages produced by the ninth embodiment.

[12] Twelfth Embodiment

Figure 19:
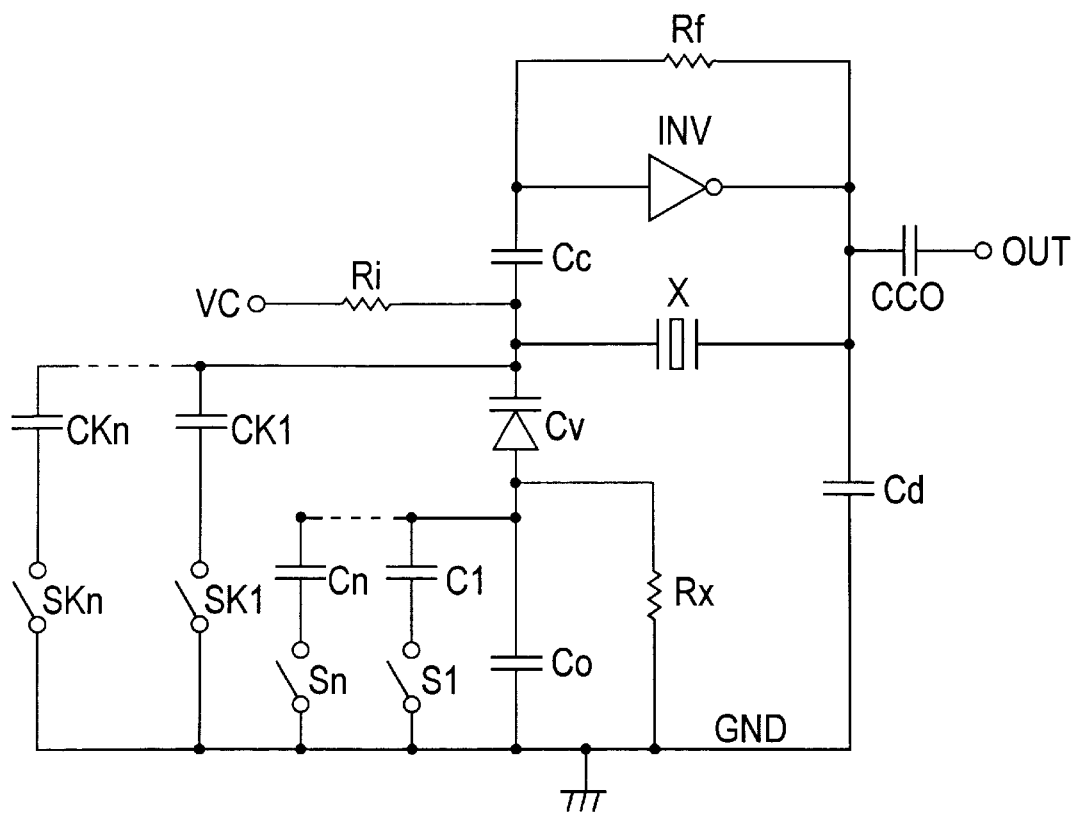
FIG. 19 is a block diagram of a voltage-controlled piezoelectric oscillation circuit in accordance with a twelfth embodiment.

FIG. 19 shows the principle and basic construction of a voltage-controlled piezoelectric oscillation circuit in accordance with the twelfth embodiment of the present invention.

The voltage-controlled piezoelectric oscillation circuit, denoted by 10I, differs from the voltage-controlled piezoelectric oscillation circuit of the ninth embodiment in that the oscillation circuit is implemented as a CMOS oscillation circuit having an oscillation stage constituted by a CMOS inverter INV. Capacitor arrays CARY and CKARY which may be the same as those of the ninth embodiment are connected to this CMOS oscillation circuit.

Thus, advantages equivalent to those of the ninth embodiment are obtainable also with the use of the CMOS oscillation circuit. In addition, a further reduction in the power consumption can be achieved since the switches S1 to Sn also are constituted by CMOSs.

[13] Thirteenth Embodiment

Figure 20:
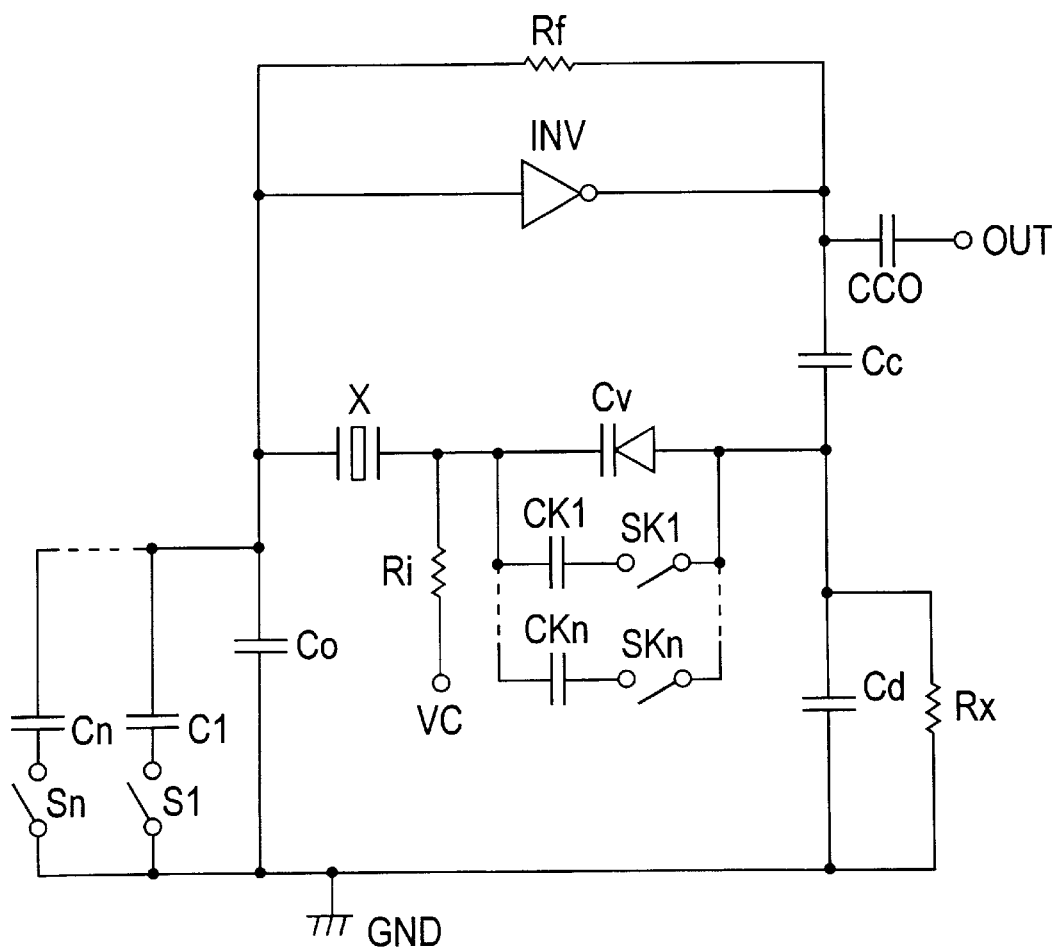
FIG. 20 is a block diagram of a voltage-controlled piezoelectric oscillation circuit in accordance with a thirteenth embodiment.

FIG. 20 shows the principle and basic construction of the thirteenth embodiment of the voltage-controlled piezoelectric oscillation circuit in accordance with the present invention.

The voltage-controlled piezoelectric oscillation circuit of the thirteenth embodiment, denoted by 10J, differs from the voltage-controlled piezoelectric oscillation circuit of the twelfth embodiment in the following respects: the varicap Cv is connected in parallel with the inverter INV and in series to the piezoelectric resonator X; the control voltage input terminal VC is connected to a node between the varicap CV and the piezoelectric resonator X through an input resistor Ri; and the capacitor array CKARY is connected in parallel with the varicap CV.

This arrangement offers advantages equivalent to those of the ninth embodiment, and contributes to further reduction in the power consumption, by virtue of the use of the CMOS-type switches S1 to Sn and SK1 to SKn.

[14] Fourteenth Embodiment

Figure 21:
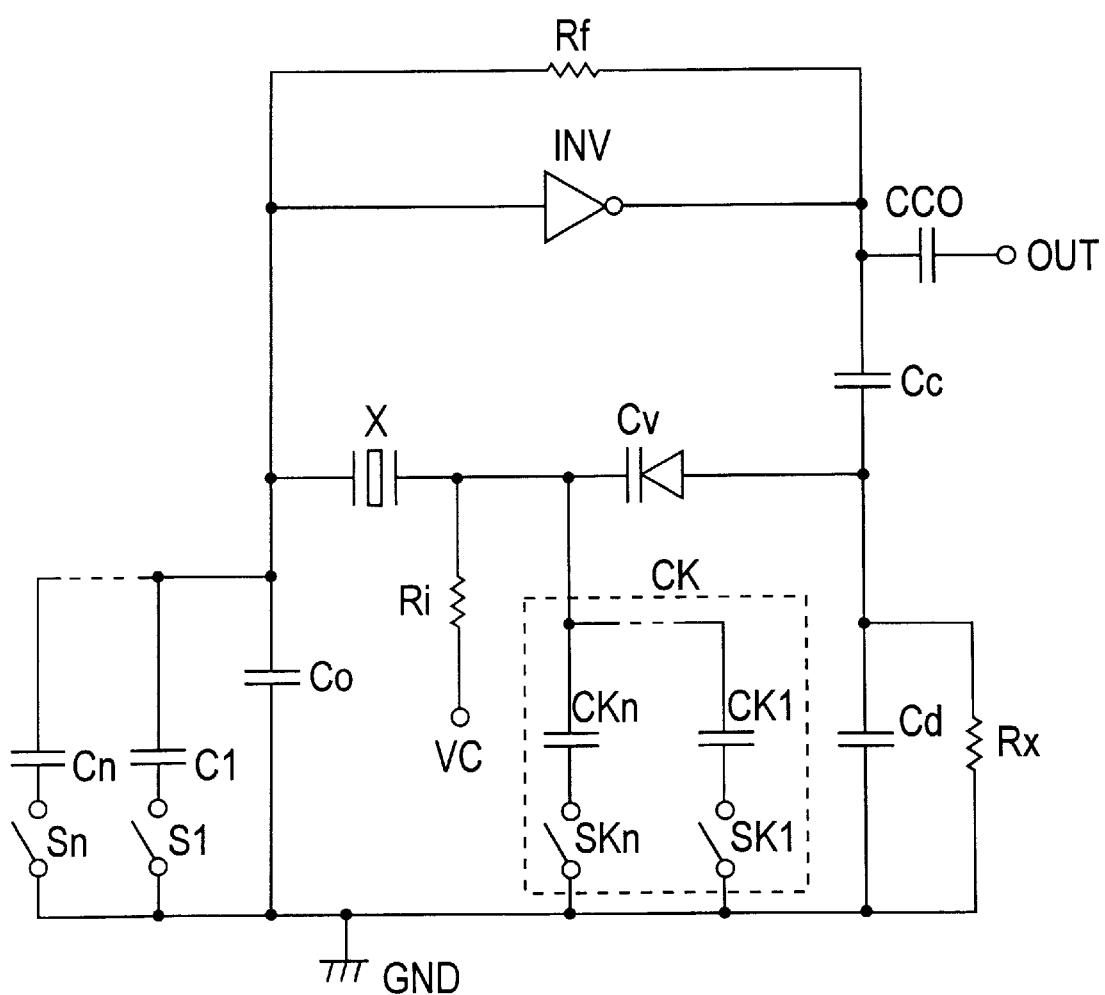
FIG. 21 is a block diagram of a voltage-controlled piezoelectric oscillation circuit in accordance with a fourteenth embodiment.

FIG. 21 shows the principle and basic construction of the fourteenth embodiment of the voltage-controlled piezoelectric oscillation circuit in accordance with the present invention.

The voltage-controlled piezoelectric oscillation circuit 10K of this embodiment differs from the voltage-controlled piezoelectric oscillation circuit of the thirteenth embodiment in that the capacitor array CKARY is connected between the ground GND and a node between the varicap CV and the piezoelectric resonator X.

This embodiment offers advantages equivalent to those of the ninth embodiment. In addition, a further reduction in the power consumption is achieved owing to the use of the CMOS-type structures of the switches S1 to Sn and SK1 to SKn.

[15] Fifteenth Embodiment

Figure 22:
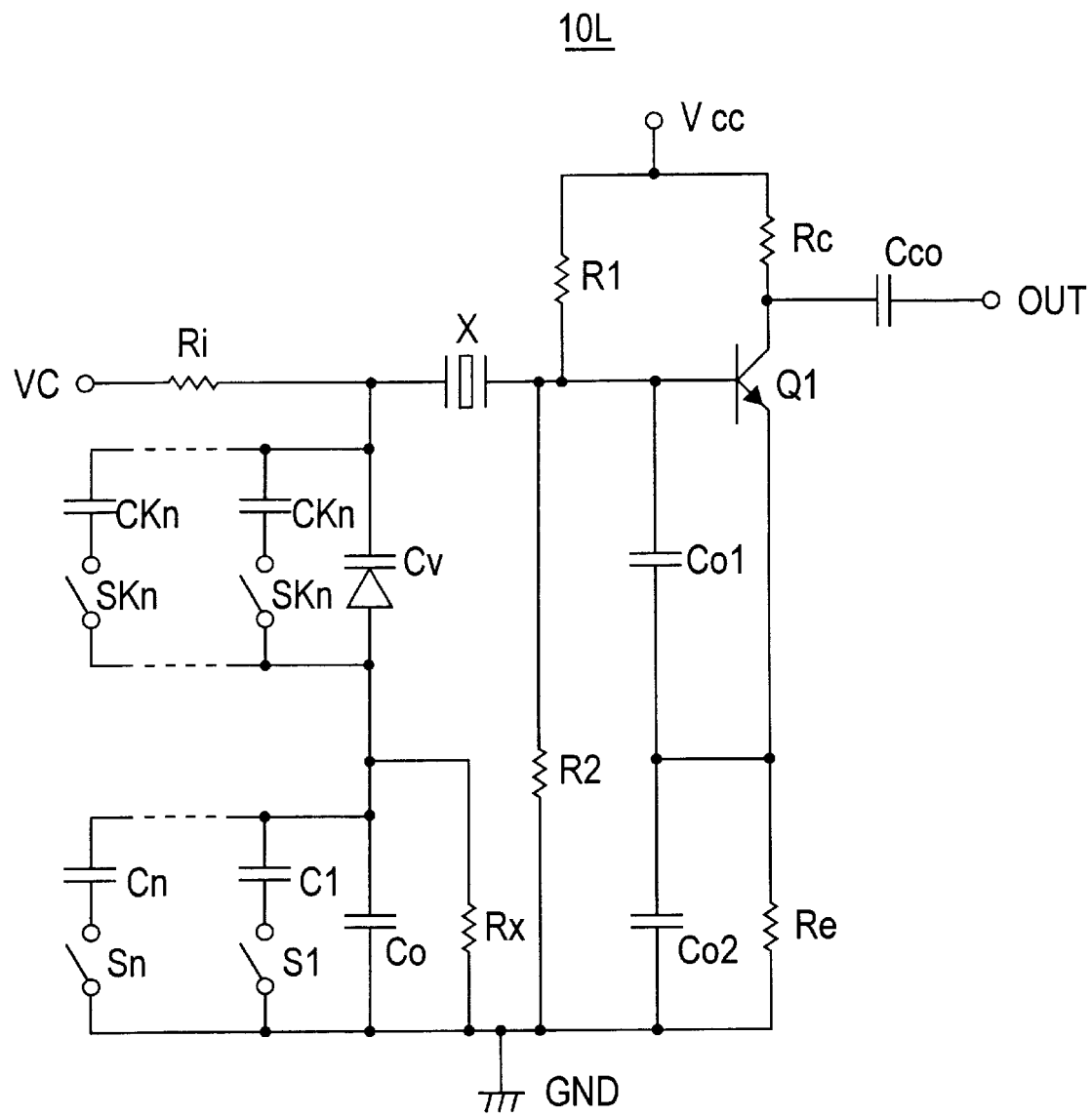
FIG. 22 is a block diagram of a voltage-controlled piezoelectric oscillation circuit in accordance with a fifteenth embodiment.

FIG. 22 shows the principle and basic construction of the fifteenth embodiment of the voltage-controlled piezoelectric oscillation circuit in accordance with the present invention.

The voltage-controlled piezoelectric oscillation circuit 10L of this embodiment differs from the voltage-controlled piezoelectric oscillation circuit of the ninth embodiment in that the capacitor array CKARY is connected in parallel with the varicap CV alone.

This embodiment provides an effect equivalent to that produced by variation of the characteristic of the varicap CV, thus offering advantages equivalent to those of the ninth embodiment. In addition, a further reduction in the power consumption is achieved owing to the use of the CMOS-type structures of the switches SK1 to SKn.

[16] Sixteenth Embodiment

Figure 9:
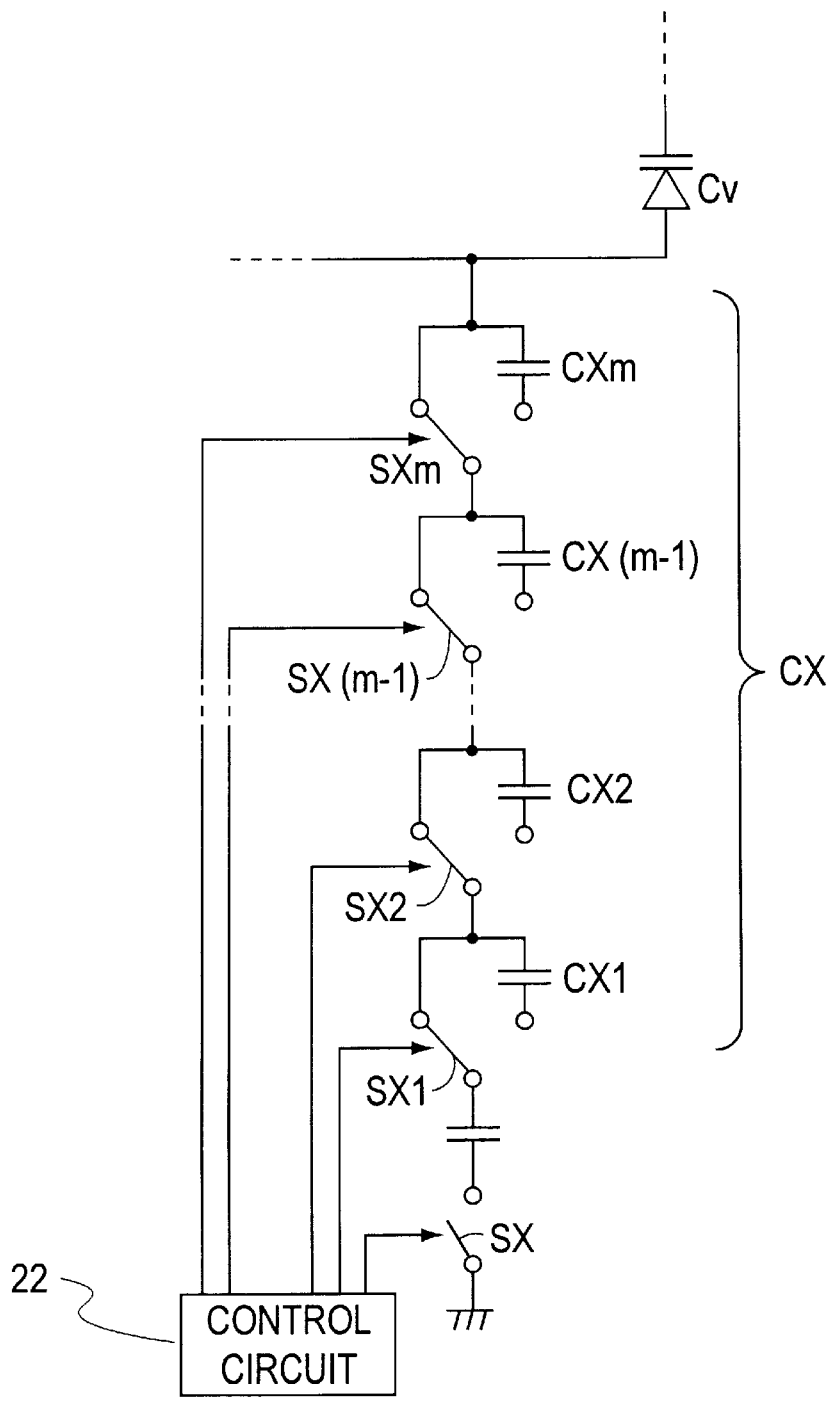
FIG. 9 is a block diagram of a voltage-controlled piezoelectric oscillation circuit in accordance with a fifth embodiment.

In each of the first to fifteenth embodiments described heretofore, the capacitor array CARY is constituted by n pieces of capacitors CX (X=1 to n) that serve as selective-connection capacitors for varying the capacitance of the Capacitor array CARY. The arrangement however may be such that, as shown in FIG. 9, each capacitor CX (selective-connection capacitor) of the array CARY is constituted by a plurality of sub-capacitors including a base sub-capacitor CX0. Thus, each capacitor CX has sub-capacitors CX0 and CX1 to CXm (m being a natural number). The sub-capacitors CX1 to CXm are adapted to be selectively connected to and disconnected from the circuit by way of associated sub-switches SX1 to SXm, whereby the sub-capacitor CX0 and sub-capacitors CX1 to CXm are selectively coupled, thereby permitting adjustment of the capacitance of the capacitor array CARY. It is therefore possible to realize a more fine adjustment of the capacitance.

[17] Seventeenth Embodiment

Figure 23:
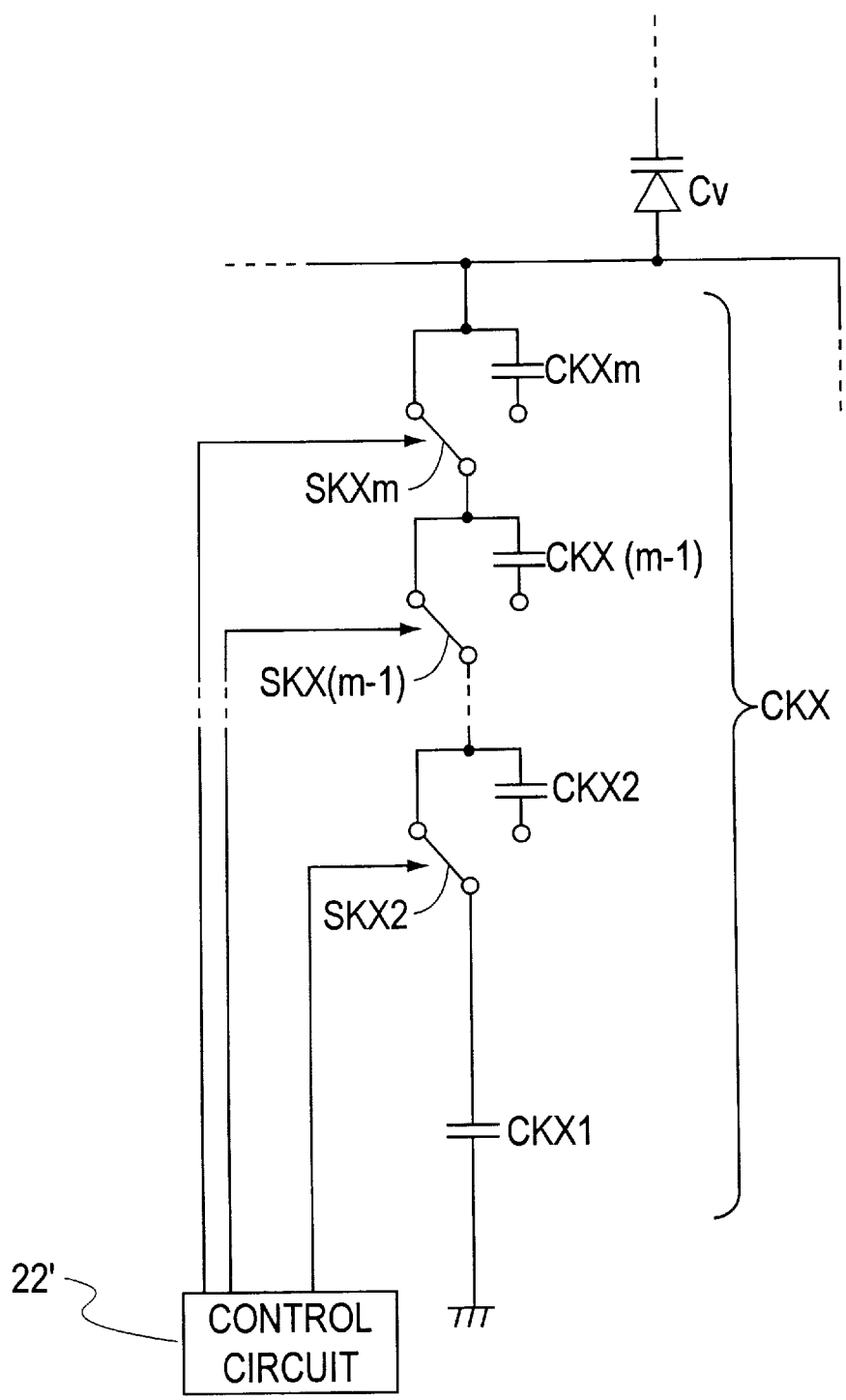
FIG. 23 is a block diagram of a voltage-controlled piezoelectric oscillation circuit in accordance with a sixteenth embodiment.

In each of the ninth to fifteenth embodiments described heretofore, the capacitor array CKARY is constituted by n pieces of capacitors CKX (X=1to n) that serve as selective-connection capacitors for varying the capacitance of the Capacitor array CKARY. The arrangement however may be such that, as shown in FIG. 23, each capacitor CKX (selective-connection capacitor) of the array CKARY is constituted by a plurality of sub-capacitors CKX1 to CKXm (m being a natural number). The sub-capacitors CKX2 to CKXm are adapted to be selectively connected to and disconnected from the circuit by way of associated sub-switches SKX2 to SKXm, whereby the sub-capacitors CKX1 to CKX2 are selectively employed, thereby permitting adjustment of the capacitance of the capacitor array CKARY. It is therefore possible to realize a more fine adjustment of the capacitance.

[18] Eighteenth Embodiment

In each of the foregoing embodiments, the varicap Cv and the capacitor array CARY are connected in series to each other. The invention, however, does not exclude such an arrangement in which the capacitor array CARY is connected to the varicap Cv in parallel therewith, as in the second type of known arrangement described before.

Such an arrangement provides items (2) to (6) of the advantages of the first embodiment described before.

[19] Modifications

In the foregoing embodiments, the base capacitor C0 as the fixed-connection capacitor is connected in series to the piezoelectric resonator X and the varicap) CV. The base capacitor C0, however, may be connected to the varicap Cv in parallel therewith, as in the second type of conventional arrangement described before.

In the foregoing embodiments, each of the capacitors C1 to Cn is constituted by a single capacitor. Each of the capacitors C1 to Cn, however, may be composed of a plurality of series or parallel sub-capacitors. In such a case, it is possible to form a capacitor of a greater capacitance and to obtain a capacitor having desired value of capacitance.

What is claimed is:

1. A capacitor array unit connected to an oscillation circuit having a piezoelectric resonator, and a variable-capacitance diode connected to said piezoelectric resonator in series thereto, said oscillation circuit outputting an oscillation signal of an oscillation frequency corresponding to a control voltage applied to a control voltage terminal thereof, said capacitor array unit comprising:

a fixed-connection capacitor connected to at least one of said piezoelectric resonator and said variable-capacitance diode and having a predetermined electrostatic capacitance value;

a plurality of selective-connection capacitors having predetermined electrostatic capacitance values;

a capacitor-connecting circuit for connecting a selective-connection capacitor selected from among said selective-connection capacitors to said fixed-connection capacitor in parallel therewith; and a capacitor array unit controller for controlling a capacitor array unit, the capacitor array unit controller, comprising:

memory storing connection control data used in the control of selection between connection and non-connection of said selective-connection capacitors to said fixed-connection capacitor; and a connection control circuit for causing said memory to store said connection control data based on externally-given adjusting control data and for controlling said capacitor-connecting circuit in accordance with at least one of said adjusting control data and said connection control data, wherein said connection control circuit comprises a start-up control circuit which, when power supply is turned on, temporarily connects a preselected one of said selective-connection capacitors to said fixed-connection capacitor.

2. The capacitor array unit according to claim 1, wherein said fixed-connection capacitor is connected to said piezoelectric resonator in series thereto.

3. The capacitor array unit according to claim 1, wherein said fixed-connection capacitor is connected to said variable-capacitance diode in parallel therewith.

4. The capacitor array unit according to claim 1, wherein at least one of said selective-connection capacitor comprises a plurality of at least one of selective connection sub-capacitors connected in series and in parallel with one another.

5. The capacitor array unit according to claim 1, wherein said capacitor-connecting circuit comprises a plurality of switches for connecting respective selective-connection capacitors to said fixed-connection capacitor.

6. An oscillation circuit for outputting an oscillation output of an oscillation frequency corresponding to a control voltage supplied to a control voltage terminal thereof, comprising:
   a piezoelectric resonator;
   the capacitor array unit and capacitor array controller of claim 1; and
   a variable-capacitance diode connected to said piezoelectric resonator in series thereto.

7. A capacitor array unit connected to an oscillation circuit having a piezoelectric resonator, and a fixed-connection capacitor connected to said piezoelectric resonator in series thereto and having a predetermined electrostatic capacitance value, said oscillation circuit outputting an oscillation signal of an oscillation frequency corresponding to a control voltage applied to a control voltage terminal thereof, said capacitor array unit comprising:
   a plurality of selective-connection capacitors having predetermined electrostatic capacitance values;
   a capacitor-connecting circuit for connecting a selective-connection capacitor selected from among said selective-connection capacitors to said fixed-connection capacitor in parallel therewith; and
   a capacitor array unit controller for controlling a capacitor array unit, the capacitor array unit controller, comprising:
      memory storing connection control data used in the control of selection between connection and non-connection of said selective-connection capacitors to said fixed-connection capacitor; and
      a connection control circuit for causing said memory to store said connection control data based on externally-given adjusting control data and for controlling said capacitor-connecting circuit in accordance with at least one of said adjusting control data and said connection control data, wherein said connection control circuit comprises a start-up control circuit which, when power supply is turned on, temporarily connects a preselected one of said selective-connection capacitors to said fixed-connection capacitor.

8. A capacitor array unit connected to an oscillation circuit having a piezoelectric resonator, a variable-capacitance diode connected to said piezoelectric resonator in series thereto, and a fixed-connection capacitor having a predetermined electrostatic capacitance value and connected to said variable-capacitance diode in parallel therewith, said oscillation circuit outputting an oscillation signal of a predetermined oscillation frequency, said capacitor array unit comprising:
   a plurality of selective-connection capacitors having predetermined electrostatic capacitance values;
   a capacitor-connecting circuit for connecting a selective-connection capacitor selected from among said selective-connection capacitors to said fixed-connection capacitor in parallel therewith; and
   a capacitor array unit controller for controlling a capacitor array unit, the capacitor array unit controller, comprising:
      memory storing connection control data used in the control of selection between connection and non-connection of said selective-connection capacitors to said fixed-connection capacitor; and
      a connection control circuit for causing said memory to store said connection control data based on externally-given adjusting control data and for controlling said capacitor-connecting circuit in accordance with at least one of said adjusting control data and said connection control data, wherein said connection control circuit comprises a start-up control circuit which, when power supply is turned on, temporarily connects a preselected one of said selective-connection capacitors to said fixed-connection capacitor.

9. An oscillation circuit for outputting an oscillation output of an oscillation frequency corresponding to a control voltage supplied to a control voltage terminal thereof, comprising:
   a piezoelectric resonator; and
   a capacitor array unit connected to an oscillation circuit having a piezoelectric resonator, and a variable-capacitance diode connected to said piezoelectric resonator in series thereto, said oscillation circuit outputting an oscillation signal of an oscillation frequency corresponding to a control voltage applied to a control voltage terminal thereof, said capacitor array unit comprising:
      a fixed-connection capacitor connected to at least one of said piezoelectric resonator and said variable-capacitance diode and having a predetermined electrostatic capacitance value;
      a plurality of selective-connection capacitors having predetermined electrostatic capacitance values;
      a capacitor-connecting circuit comprises a plurality of switches for connecting a selective-connection capacitor selected from among said selective-connection capacitors to said fixed-connection capacitor in parallel therewith and
      a capacitor unit array controller for controlling the capacitor array unit controller, further comprising:
         a memory storing connection control data used in the control of selection between connection and non-connection of said selective-connection capacitors to said fixed-connection capacitor; and
         a switch control circuit for causing said memory to store said connection control data based on externally-given adjusting control data and for effecting on-off control of said plurality of switches in accordance with at least one of said adjusting control data and said connection control data, wherein said switch control circuit comprises a start-up control circuit which, when power supply is turned on, temporarily turns on a preselected one of said switches; and a variable-capacitance diode connected to said piezoelectric resonator in series thereto.

10. A capacitor array unit connected to an oscillation circuit having a piezoelectric resonator and a variable-capacitance diode connected to said piezoelectric resonator in series thereto, said oscillation circuit outputting an oscillation signal of a frequency corresponding to a control voltage supplied to a control voltage terminal thereof, said capacitor array unit comprising:

a center-frequency-adjusting capacitor array section connected to at least one of said piezoelectric resonator and said variable-capacitance diode, the capacitance of said center-frequency-adjusting capacitor array being variable to permit adjustment of the center frequency of said oscillation frequency;

a frequency-control-characteristic-adjusting capacitor array section including a plurality of control-characteristic-adjusting selective-connection capacitors having predetermined electrostatic capacitance values, and a control-characteristic-adjusting capacitor-connecting circuit for connecting desired one of said characteristic-control-adjusting selective-connection capacitors to at least one of said center frequency adjusting capacitor array section and to said variable-capacitance diode in parallel therewith;

a capacitor array unit controller for controlling a capacitor array unit, the capacitor array unit controller comprising:

a memory storing connection control data used in the control of selection between connection and non-connection of said control-characteristic-adjusting selective-connection capacitor to at least one of said center-frequency-adjusting capacitor array and to said variable-capacitance diode; and a connection control circuit for causing said memory to store said connection data based on externally-given adjusting control data and for controlling said control-characteristic-adjusting capacitor connecting circuit in accordance with at least one of said adjusting control data and said connection control data, wherein said connection control circuit comprises a start-up control circuit which, when power supply is turned on, temporarily connects a preselected one of said frequency-control-characteristic-adjusting selective-connection capacitors to at least one of said variable-capacitance diode and to said center-frequency-adjusting capacitor array.

11. The capacitor array unit according to claim 10, wherein at least one of said plurality of frequency-control-characteristic-adjusting selective-connection capacitors comprises at least one of a plurality of frequency-control-characteristic-adjusting connection sub-capacitors connected in series and in parallel with one another.

12. The capacitor array unit according to claim 10, wherein said control-characteristic-adjusting capacitor-connecting circuit comprises a plurality of switches for connecting respective control-characteristic-adjusting selective-connection capacitors to at least one of said center-frequency-adjusting capacitor array section and to said variable-capacitance diode in parallel therewith.

13. A capacitor array unit connected to an oscillation circuit having a piezoelectric resonator, and a fixed-connection capacitor connected to said piezoelectric resonator in series thereto and having a predetermined electrostatic capacitance value, said capacitor array unit comprising:

a plurality of center-frequency-adjusting selective-connection capacitors having predetermined electrostatic capacitance values;

a center-frequency-adjusting capacitor connecting circuit for connecting desired one of said center-frequency-adjusting selective capacitors to said fixed-connection capacitor in parallel therewith;

a plurality of frequency control-characteristic-adjusting selective-connection capacitors having predetermined electrostatic capacitance values;

a frequency-control-characteristic-adjusting capacitor connecting circuit for connecting a desired one of the plurality of frequency-control-characteristic-adjusting selective-connection capacitors to said center-frequency-adjusting connecting capacitor; and a capacitor array unit controller for controlling a capacitor array unit, the capacitor array unit controller comprising:

a memory storing connection control data used in the control of selection between connection and non-connection of said control-characteristic-adjusting selective-connection capacitor to at least one of said center-frequency-adjusting capacitor array and to said variable-capacitance diode; and a connection control circuit for causing said memory to store said connection data based on externally-given adjusting control data and for controlling said control-characteristic-adjusting capacitor connecting circuit in accordance with at least one of said adjusting control data and said connection control data, wherein said connection control circuit comprises a start-up control circuit which, when power supply is turned on, temporarily connects a preselected one of said frequency-control-characteristic-adjusting selective-connection capacitors to at least one of said variable-capacitance diode and to said center-frequency-adjusting capacitor array.

14. A capacitor array unit connected to an oscillation circuit having a piezoelectric resonator, a variable-capacitance diode connected to said piezoelectric resonator in series thereto, and a fixed-connection capacitor connected to said variable-capacitance, diode in parallel therewith, said capacitor array unit comprising:

a plurality of center-frequency-adjusting selective-connection capacitors having predetermined electrostatic capacitance values;

a center-frequency-adjusting-capacitor connecting circuit for connecting desired one of center-frequency-adjusting selective-connection capacitor to said fixed-connection capacitor in parallel therewith;

a plurality of frequency-control-characteristic-adjusting selective-connection capacitors having predetermined electrostatic capacitance values;

a frequency-control-characteristic-adjusting capacitor connecting circuit for connecting desired at least one of said frequency-control-characteristic-adjusting selective-connection capacitors to said variable-capacitance diode and said center-frequency-adjusting connection capacitor in parallel therewith; and a capacitor array unit controller for controlling a capacitor array unit, the capacitor array unit controller comprising:

a memory storing connection control data used in the control of selection between connection and non-connection of said control-characteristic-adjusting selective-connection capacitor to at least one of said center-frequency-adjusting capacitor array and to said variable-capacitance diode; and a connection control circuit for causing said memory to store said connection data based on externally-given adjusting control data and for controlling said control-characteristic-adjusting capacitor connecting circuit in accordance with at least one of said adjusting control data and said connection control data, wherein said connection control circuit comprises a start-up control circuit which, when power supply is turned on, temporarily connects a preselected one of said frequency-control-characteristic-adjusting selective-connection capacitors to at least one of said variable-capacitance diode and to said center-frequency-adjusting capacitor array.

15. A capacitor array unit connected to an oscillation circuit having a piezoelectric resonator and a variable-capacitance diode connected to said piezoelectric resonator in series thereto, said oscillation circuit outputting an oscillation signal of a frequency corresponding to a control voltage supplied to a control voltage terminal thereof, said capacitor array unit comprising:

a center-frequency-adjusting capacitor array section connected to at least one of said piezoelectric resonator and said variable-capacitance diode, the capacitance of said center-frequency-adjusting capacitor array being variable to permit adjustment of the center frequency of said oscillation frequency;

a frequency-control-characteristic-adjusting capacitor array section including a plurality of control-characteristic-adjusting selective-connection capacitors having predetermined electrostatic capacitance values, and a control-characteristic-adjusting capacitor-connecting circuit for connecting desired one of said characteristic-control-adjusting selective-connection capacitors to at least one of said center frequency adjusting capacitor array section and to said variable-capacitance diode in parallel therewith;

a capacitor array unit controller for controlling the capacitor array unit, the capacitor array unit controller comprising:

a memory storing connection control data used in the control of selection between connection and non-connection of said control characteristic adjusting selective-connection capacitor to at least one of said center-frequency-adjusting capacitor array section and to said variable-capacitance diode; and a switch control circuit for causing said memory to store said connection control data based on externally-given adjusting control data and for effecting on-off control of said plurality of switches in accordance with at least one of said adjusting control data and said connection control data, wherein said switch control circuit comprises a start-up control circuit which, when power supply is turned on, temporarily turns on a preselected one of said switches.

16. An oscillation circuit for outputting an oscillation signal of an oscillation frequency corresponding to a control voltage supplied to a control voltage terminal thereof, comprising:

a piezoelectric resonator;

a capacitor array unit connected to an oscillation circuit having a piezoelectric resonator and a variable-capacitance diode connected to said piezoelectric resonator in series thereto, said oscillation circuit outputting an oscillation signal of a frequency corresponding to a control voltage supplied to a control voltage terminal thereof, said capacitor array unit comprising:

a center-frequency-adjusting capacitor array section connected to at least one of said piezoelectric resonator and said variable-capacitance diode, the capacitance of said center-frequency-adjusting capacitor array being variable to permit adjustment of the center frequency of said oscillation frequency;

a frequency-control-characteristic-adjusting capacitor array section including a plurality of control-characteristic-adjusting selective-connection capacitors having predetermined electrostatic capacitance values, and a control-characteristic-adjusting capacitor-connecting circuit for connecting desired one of said characteristic-control-adjusting selective-connection capacitors to at least one of said center frequency adjusting capacitor array section and to said variable-capacitance diode in parallel therewith; and a capacitor array unit controller for controlling a capacitor array unit, the capacitor array unit controller comprising:

a memory storing connection control data used in the control of selection between connection and non-connection of said control-characteristic-adjusting selective-connection capacitor to at least one of said center-frequency-adjusting capacitor array and to said variable-capacitance diode;

a connection control circuit for causing said memory to store said connection data based on externally-given adjusting control data and for controlling said control-characteristic-adjusting capacitor connecting circuit in accordance with at least one of said adjusting control data and said connection control data, wherein said connection control circuit comprises a start-up control circuit which, when power supply is turned on, temporarily connects a preselected one of said frequency-control-characteristic-adjusting selective-connection capacitors to at least one of said variable-capacitance diode and to said center-frequency-adjusting capacitor array; and a variable-capacitance diode connected to said piezoelectric resonator in series thereto.

17. An oscillation circuit for outputting an oscillation signal of an oscillation frequency corresponding to a control voltage supplied to a control voltage terminal thereof, comprising:

a piezoelectric resonator;

a capacitor array unit connected to an oscillation circuit having a piezoelectric resonator and a variable-capacitance diode connected to said piezoelectric resonator in series thereto, said oscillation circuit outputting an oscillation signal of a frequency corresponding to a control voltage supplied to a control voltage terminal thereof, said capacitor array unit comprising:

a center-frequency-adjusting capacitor array section connected to at least one of said piezoelectric resonator and said variable-capacitance diode, the capacitance of said center-frequency-adjusting capacitor array being variable to permit adjustment of the center frequency of said oscillation frequency; and a frequency-control-characteristic-adjusting capacitor array section including a plurality of controlcharacteristic-adjusting selective-connection capacitors having predetermined electrostatic capacitance values, and a control-characteristic-adjusting capacitor-connecting circuit for connecting desired one of said characteristic-control-adjusting selective-connection capacitors to at least one of said center frequency adjusting capacitor array section and to said variable-capacitance diode in parallel therewith, wherein said control-characteristic-adjusting capacitor-connecting circuit comprises a plurality of switches for connecting respective control-characteristic-adjusting selective-connection capacitors to at least one of said center-frequency-adjusting capacitor array section and to said variable-capacitance diode in parallel therewith;

a capacitor array unit controller for controlling the capacitor array unit, the capacitor array unit controller comprising:
a memory storing connection control data used in the control of selection between connection and non-connection of said control characteristic adjusting selective-connection capacitor to at least one of said center-frequency-adjusting capacitor array section and to said variable-capacitance diode;
a switch control circuit for causing said memory to store said connection control data based on externally-given adjusting control data and for effecting on-off control of said plurality of switches in accordance with at least one of said adjusting control data and said connection control data, wherein said switch control circuit comprises a start-up control circuit which, when power supply is turned on, temporarily turns on a preselected one of said switches; and
a variable-capacitance diode connected to said piezoelectric resonator in series thereto.

18. An oscillation frequency adjusting system for effecting an adjustment on an oscillation circuit for outputting an oscillation output of an oscillation frequency corresponding to a control voltage supplied to a control voltage terminal thereof, comprising:

a piezoelectric resonator;
a capacitor array unit connected to an oscillation circuit having a piezoelectric resonator, and a variable-capacitance diode connected to said piezoelectric resonator in series thereto, said oscillation circuit outputting an oscillation signal of an oscillation frequency corresponding to a control voltage applied to a control voltage terminal thereof, said capacitor array unit comprising:
a fixed-connection capacitor connected to at least one of said piezoelectric resonator and said variable-capacitance diode and having a predeterminers electrostatic capacitance value;
a plurality of selective-connection capacitors having predetermined electrostatic capacitance values; and
a capacitor-connecting circuit for connecting a selective-connection capacitor selected from among said selective-connection capacitors to said fixed-connection capacitor in parallel therewith;
a variable-capacitance diode connected to said piezoelectric resonator in series thereto so as to enable said oscillation circuit to output an oscillation signal of a predetermined reference oscillation frequency corresponding to a predetermined reference control voltage applied to said control voltage terminal, comprising:
an oscillation frequency detecting unit for detecting the frequency of the oscillation signal while said predetermined reference control voltage is applied to said control voltage terminal; and
an adjusting data output unit for comparing the detected frequency of said oscillation signal with said reference oscillation frequency and for outputting, based on the result of the comparison, said adjusting control data for use in the control of selection between connection and non-connection of said selective-connection capacitor to said fixed-connection capacitor; and
a capacitor array unit controller for controlling a capacitor array unit, the capacitor array unit controller, comprising:
memory storing connection control data used in the control of selection between connection and non-connection of said selective-connection capacitors to said fixed-connection capacitor; and
a connection control circuit for causing said memory to store said connection control data based on externally-given adjusting control data and for controlling said capacitor-connecting circuit in accordance with at least one of said adjusting control data and said connection control data, wherein said connection control circuit comprises a start-up control circuit which, when power supply is turned on, temporarily connects a preselected one of said selective-connection capacitors to said fixed-connection capacitor.

19. An oscillation frequency adjusting method for effecting an adjustment on an oscillation circuit for outputting an oscillation output of an oscillation frequency corresponding to a control voltage supplied to a control voltage terminal thereof, comprising:

a piezoelectric resonator; and
a capacitor array unit connected to an oscillation circuit having a piezoelectric resonator, and a variable-capacitance diode connected to said piezoelectric resonator in series thereto, said oscillation circuit outputting an oscillation signal of an oscillation frequency corresponding to a control voltage applied to a control voltage terminal thereof, said capacitor array unit comprising:
a fixed-connection capacitor connected to at least one of said piezoelectric resonator and said variable-capacitance diode and having a predetermined electrostatic capacitance value;
a plurality of selective-connection capacitors having predetermined electrostatic capacitance values; and
a capacitor-connecting circuit for connecting a selective-connection capacitor selected from among said selective-connection capacitors to said fixed-connection capacitor in parallel therewith;
a capacitor array unit controller for controlling a capacitor array unit, the capacitor array unit controller, comprising:
memory storing connection control data used in the control of selection between connection and non-connection of said selective-connection capacitors to said fixed-connection capacitor; and
a connection control circuit for causing said memory to store said connection control data based on externally-given adjusting control data and for controlling said capacitor-connecting circuit in accordance with at least one of said adjusting control data and said connection control data, wherein said connection control circuit comprises a start-up control circuit which, when power supply is turned on, temporarily connects a preselected one of said selective-connection capacitors to said fixed-connection capacitor; and a variable-capacitance diode connected to said piezoelectric resonator in series thereto so as to enable said oscillation circuit to output an oscillation signal of a predetermined reference oscillation frequency corresponding to a predetermined reference control voltage applied to said control voltage terminal, comprising the steps of:

applying said predetermined reference voltage to said control voltage terminal;

detecting the frequency of the oscillation signal while said predetermined reference control voltage is applied to said control voltage terminal;

comparing the detected frequency of said oscillation signal with said reference oscillation frequency; and outputting, based on the result of the comparing step, adjusting control data for use in the control of selection between connection and non-connection of said selective-connection capacitor to said fixed-connection capacitor.

20. An oscillation frequency adjusting system for effecting an adjustment on the oscillation circuit for outputting an oscillation signal of an oscillation frequency corresponding to a control voltage supplied to a control voltage terminal thereof, comprising:

a piezoelectric resonator;

a center-frequency-adjusting capacitor array section connected to at least one of said piezoelectric resonator and said variable-capacitance diode, the capacitance of said center-frequency-adjusting capacitor array being variable to permit adjustment of the center frequency of said oscillation frequency;

a frequency-control-characteristic-adjusting capacitor array section including a plurality of control-characteristic-adjusting selective-connection capacitors having predetermined electrostatic capacitance values, and a control-characteristic-adjusting capacitor-connecting circuit for connecting desired one of said characteristic-control-adjusting selective-connection capacitors to at least one of said center frequency adjusting capacitor array section and to said variable-capacitance diode in parallel therewith; and a variable-capacitance diode connected to said piezoelectric resonator in series thereto, so as to enable said oscillation circuit to output the oscillation signal of a predetermined frequency control characteristic corresponding to a predetermined reference control voltage applied to said control voltage terminal, comprising:

a frequency control characteristic detecting unit for detecting the frequency control characteristic of the oscillation signal while said predetermined reference control voltage is applied to said control voltage terminal; and an adjusting data output unit for comparing the detected frequency control characteristic of said oscillation signal with said reference frequency control characteristic and for outputting, based on the result of the comparison, said adjusting control data for use in the control of selection between connection and non-connection of said control characteristic selective-connection capacitor to said variable-capacitance diode or to said center-frequency-adjusting capacitor array section; and a capacitor array unit controller for controlling a capacitor array unit, the capacitor array unit controller comprising:

a memory storing connection control data used in the control of selection between connection and non-connection of said control-characteristic-adjusting selective-connection capacitor to at least one of said center-frequency-adjusting capacitor array and to said variable-capacitance diode; and a connection control circuit for causing said memory to store said connection data based on externally-given adjusting control data and for controlling said control-characteristic-adjusting capacitor connecting circuit in accordance with at least one of said adjusting control data and said connection control data, wherein said connection control circuit comprises a start-us control circuit which, when power supply is turned on, temporarily connects a preselected one of said frequency-control-characteristic-adjusting selective-connection capacitors to at least one of said variable-capacitance diode and to said center-frequency-adjusting capacitor array.

21. An oscillation frequency adjusting method for effecting an adjustment on the oscillation circuit for outputting an oscillation signal of an oscillation frequency corresponding to a control voltage supplied to a control voltage terminal thereof, comprising:

a piezoelectric resonator;

a center-frequency-adjusting capacitor array section connected to at least one of said piezoelectric resonator and said variable-capacitance diode, the capacitance of said center-frequency-adjusting capacitor array being variable to permit adjustment of the center frequency of said oscillation frequency;

a frequency-control-characteristic-adjusting capacitor array section including a plurality of control-characteristic-adjusting selective-connection capacitors having predetermined electrostatic capacitance values, and a control-characteristic-adjusting capacitor-connecting circuit for connecting desired one of said characteristic-control-adjusting selective-connection capacitors to at least one of said center frequency adjusting capacitor array section and to said variable-capacitance diode in parallel therewith;

a capacitor array unit controller for controlling a capacitor array unit, the capacitor array unit controller comprising:

a memory storing connection control data used in the control of selection between connection and non-connection of said control-characteristic-adjusting selective-connection capacitor to at least one of said center-frequency-adjusting capacitor array and to said variable-capacitance diode; and a connection control circuit for causing said memory to store said connection data based on externally-given adjusting control data and for controlling said control-characteristic-adjusting capacitor connecting circuit in accordance with at least one of said adjusting control data and said connection control data, wherein said connection control circuit comprises a start-up control circuit which, when power supply is turned on, temporarily connects a preselected one of said frequency-control-characteristic-adjusting selective-connection capacitors to at least one of said variable-capacitance diode and to said center-frequency-adjusting capacitor array; and a variable-capacitance diode connected to said piezoelectric resonator in series thereto, so as to enable said oscillation circuit to output the oscillation signal of a predetermined frequency control characteristic corresponding to a predetermined reference control voltage applied to said control voltage terminal, comprising:

applying said reference voltage to said control voltage terminal;

detecting the frequency control characteristic of the oscillation signal while said predetermined reference control voltage is applied to said control voltage terminal;

comparing the detected frequency control characteristic of said oscillation signal with said reference frequency control characteristic; and outputting, based on results of the comparing step, adjusting control data for use in the control of selection between connection and non-connection of said control characteristic selective-connection capacitor to said variable-capacitance diode or to said center-frequency-adjusting capacitor array section.

* * * * *